US011054752B2

(12) United States Patent
Amit et al.

(10) Patent No.: US 11,054,752 B2
(45) Date of Patent: Jul. 6, 2021

(54) DEVICE METROLOGY TARGETS AND METHODS

(71) Applicant: KLA-Tencor Corporation, Milpitas, CA (US)

(72) Inventors: Eran Amit, Haifa (IL); Daniel Kandel, Aseret (IL); Dror Alumot, Rehovot (IL); Amit Shaked, Karkur (IL); Liran Yerushalmi, Zicron Yaacob (IL)

(73) Assignee: KLA Corporation, Milpitas, CA (US)

( * ) Notice: Subject to any disclaimer, the term of this patent is extended or adjusted under 35 U.S.C. 154(b) by 352 days.

(21) Appl. No.: 16/102,424

(22) Filed: Aug. 13, 2018

(65) Prior Publication Data

US 2019/0004438 A1  Jan. 3, 2019

Related U.S. Application Data

(63) Continuation of application No. 15/159,009, filed on May 19, 2016, now Pat. No. 10,571,811, which is a
(Continued)

(51) Int. Cl.
*G03F 7/20* (2006.01)
*H01L 21/66* (2006.01)
(Continued)

(52) U.S. Cl.
CPC .......... *G03F 7/70633* (2013.01); *H01L 22/12* (2013.01); *H01L 27/0207* (2013.01); *H01L 27/092* (2013.01)

(58) Field of Classification Search
CPC . G03F 7/70633; H01L 22/12; H01L 27/0207; H01L 27/092
See application file for complete search history.

(56) References Cited

U.S. PATENT DOCUMENTS

2009/0244538 A1   10/2009   Den Boef et al.
2011/0255066 A1   10/2011   Fuchs et al.
(Continued)

OTHER PUBLICATIONS

Young-Nam Kim et al., "Device based in-chip critical dimension and overlay metrology", Optics Express, 17:23, 2009, pp. 21336-21343.
(Continued)

*Primary Examiner* — Manuel A Rivera Vargas
(74) *Attorney, Agent, or Firm* — Suiter Swantz pc llo

(57) ABSTRACT

An overlay metrology system includes one or more processors coupled to an illumination source to direct illumination to a sample and a detector to capture diffracted orders of radiation from the sample. The system may generate overlay sensitivity calibration parameters based on differential measurements of a calibration target including two overlay target cells on the sample, where first-layer target elements and second-layer target elements of the overlay target cells are distributed with a common pitch along a measurement direction and are misregistered with a selected offset value in opposite directions. The system may further determine overlay measurements based on differential measurements of additional overlay target cells with two wavelengths, where first-layer target elements and second-layer target elements of the additional overlay target cells are distributed with the common pitch and are formed to overlap symmetrically. The system may further adjust the overlay measurements with the overlay sensitivity calibration parameters.

23 Claims, 29 Drawing Sheets

Related U.S. Application Data continuation of application No. PCT/US2016/015782, filed on Jan. 29, 2016.

(60) Provisional application No. 62/110,431, filed on Jan. 30, 2015, provisional application No. 62/166,684, filed on May 27, 2015.

(51) Int. Cl.
*H01L 27/02* (2006.01)
*H01L 27/092* (2006.01)

(56) References Cited

U.S. PATENT DOCUMENTS

| | | |
|---|---|---|
| 2013/0200535 A1 | 8/2013 | Chen et al. |
| 2014/0002822 A1 | 1/2014 | Chen et al. |
| 2014/0065736 A1* | 3/2014 | Amir .................. G03F 7/70683 438/14 |
| 2014/0316730 A1 | 10/2014 | Shchegrov et al. |

OTHER PUBLICATIONS

International Search Report and Written Opinion dated Jun. 13, 2016 for PCT/US2016/015782.
International Preliminary Report on Patentability dated Aug. 1, 2017 for PCT/US2016/015782.

* cited by examiner

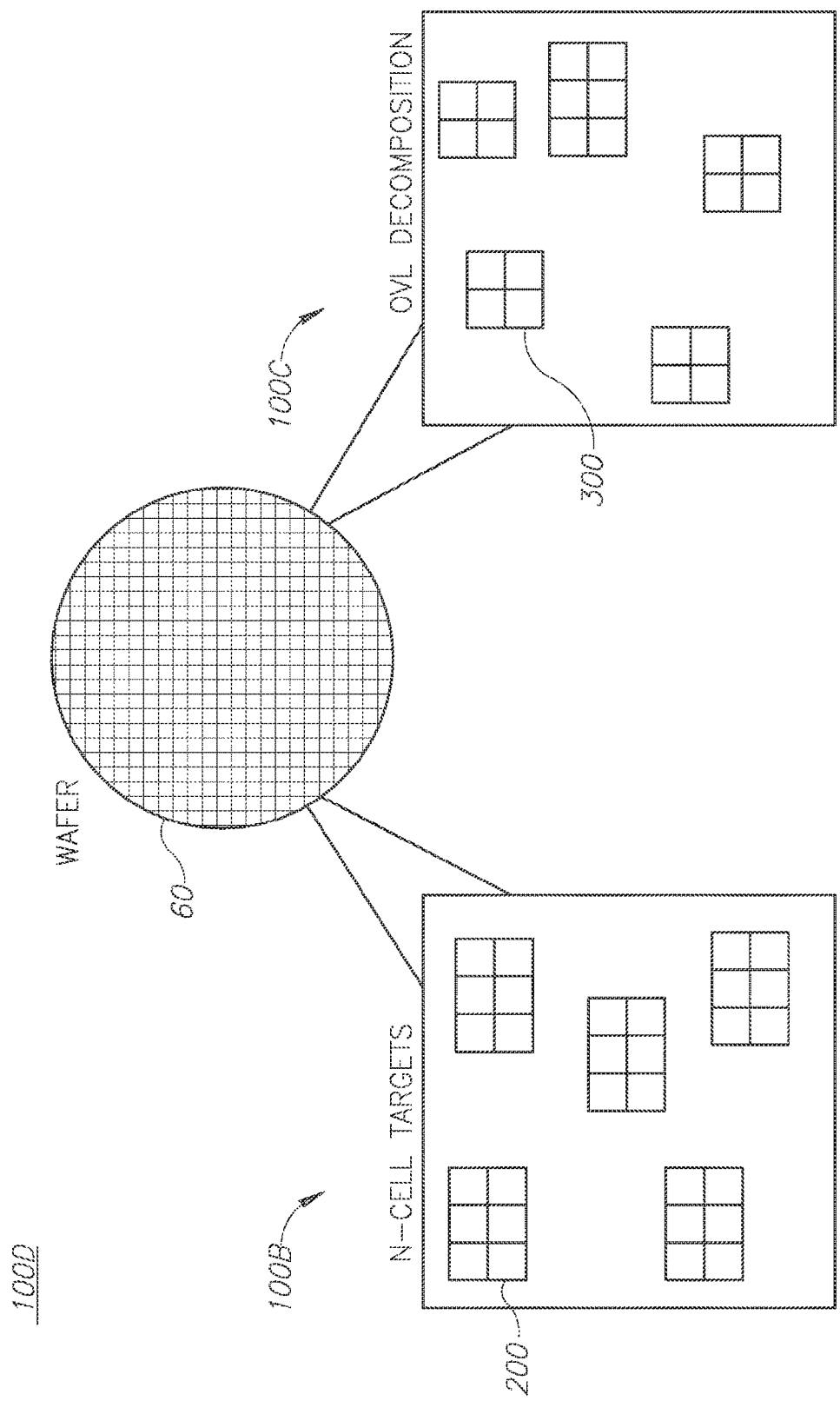

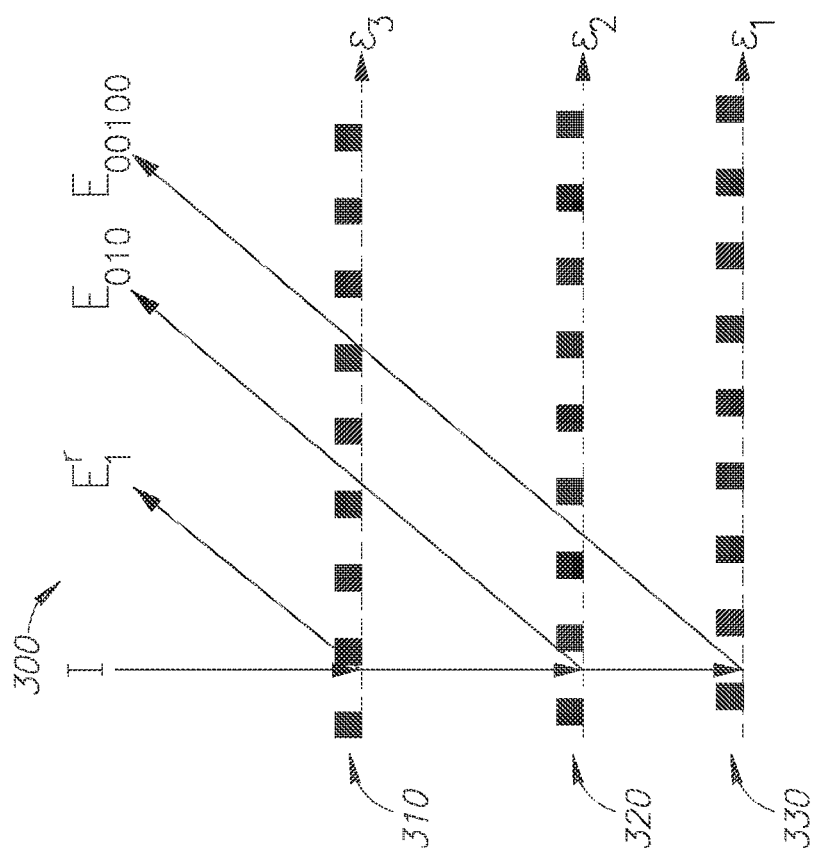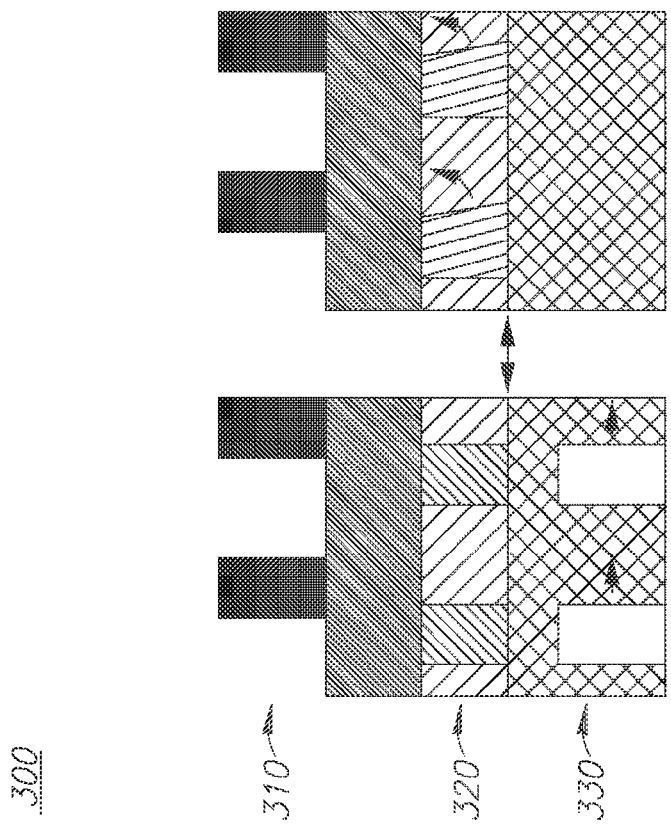
Figure 3A
Figure 3B

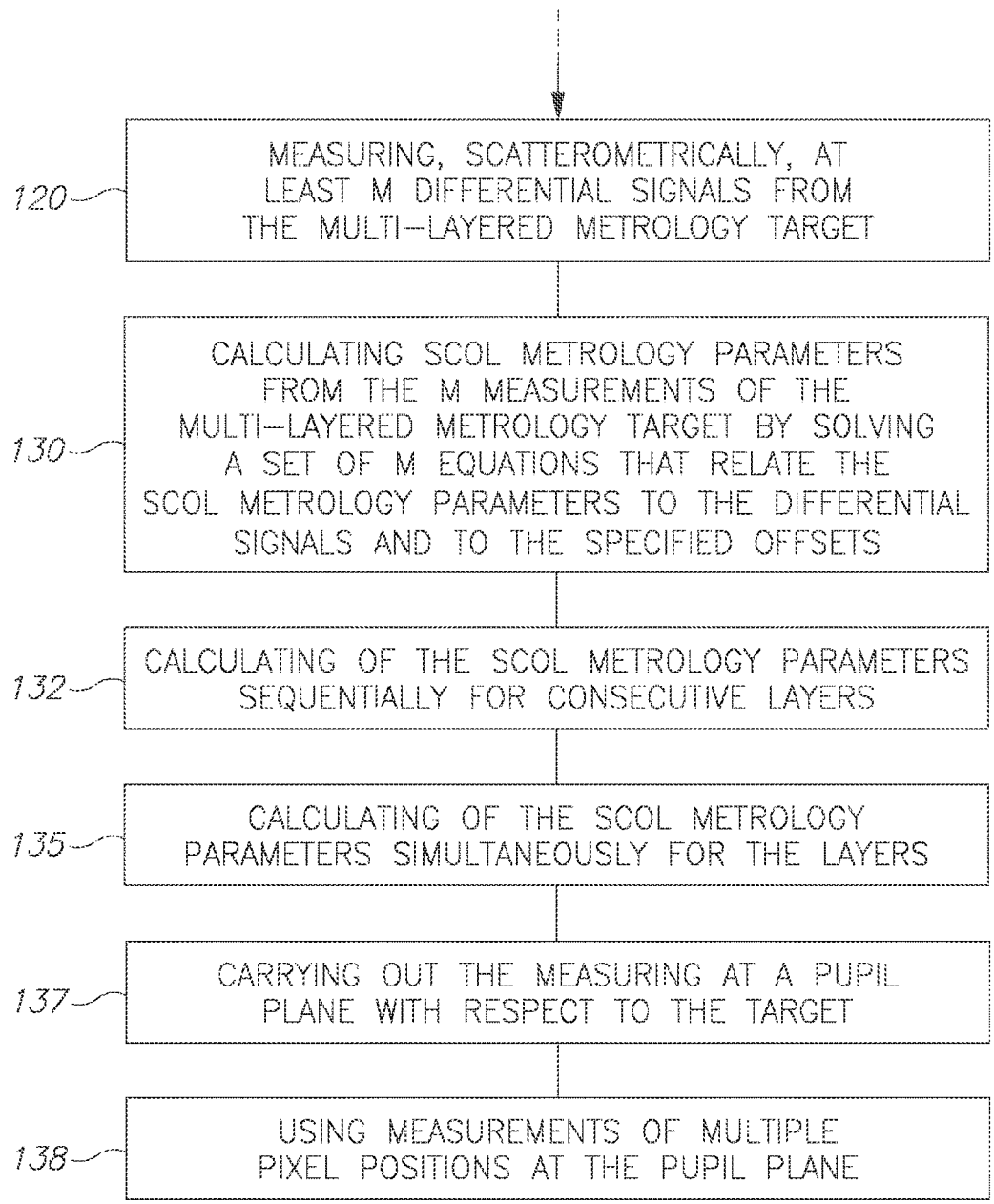
Figure 4 (cont. 1)

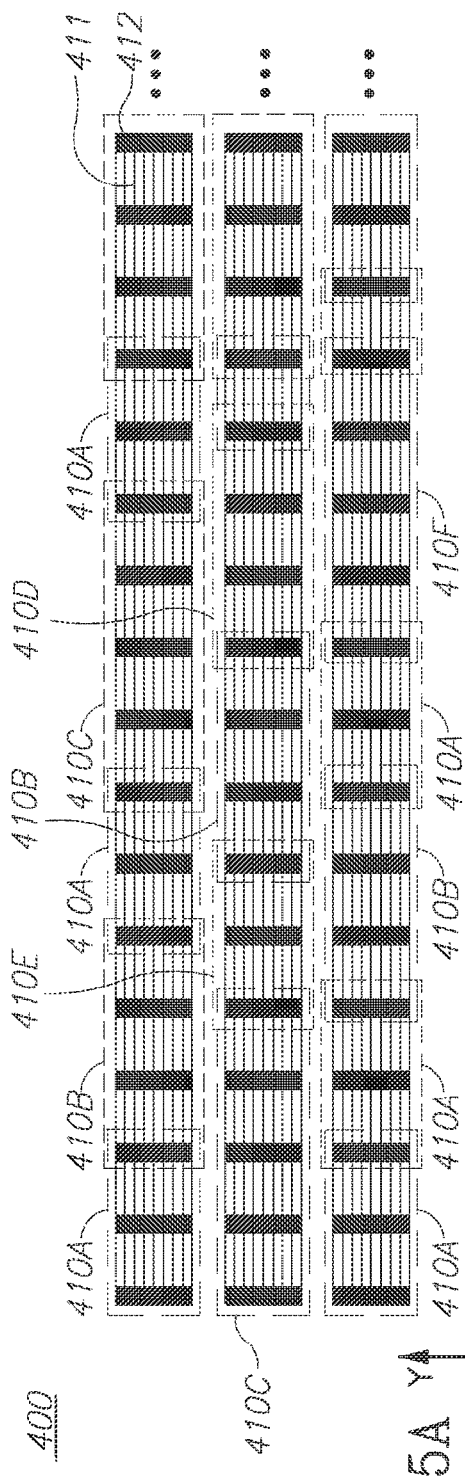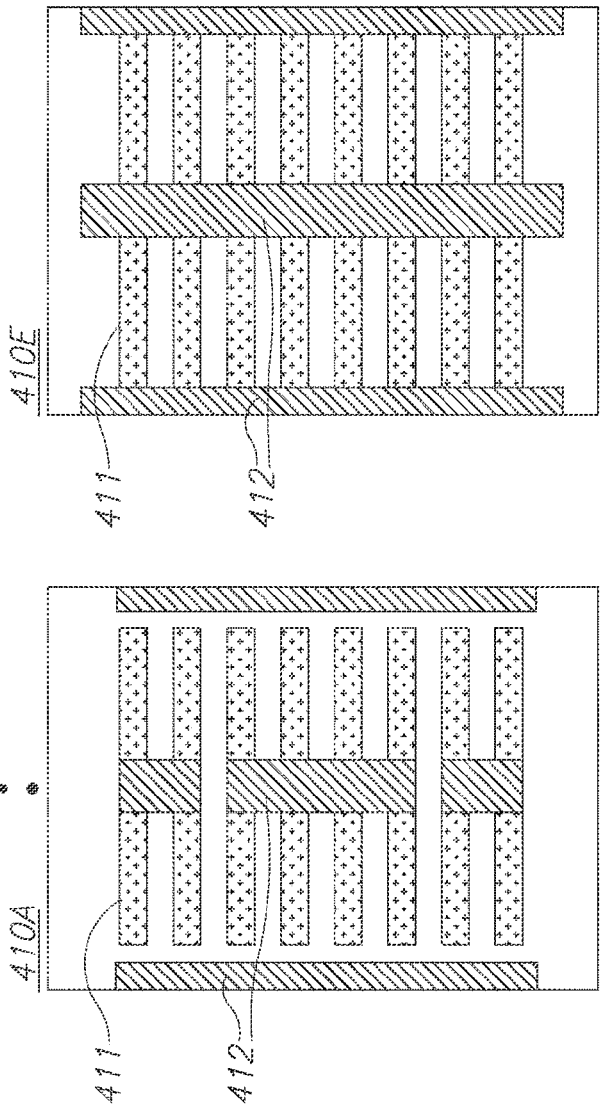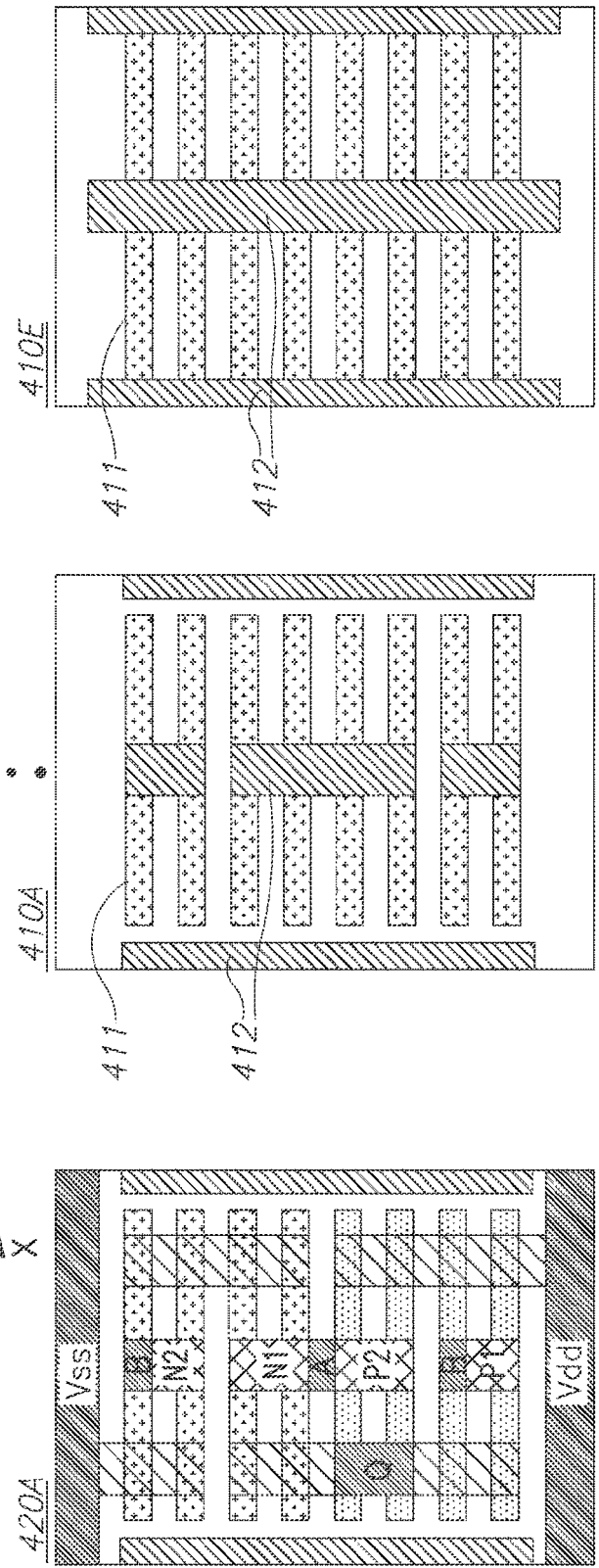

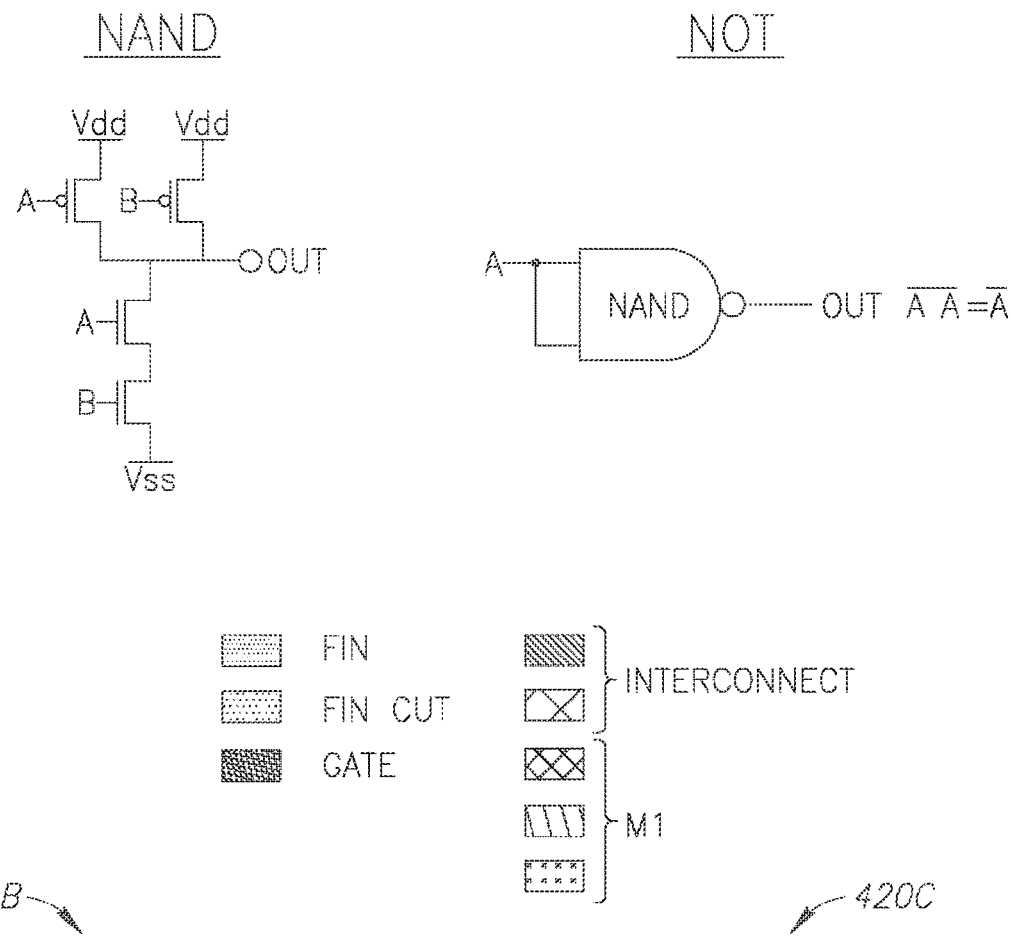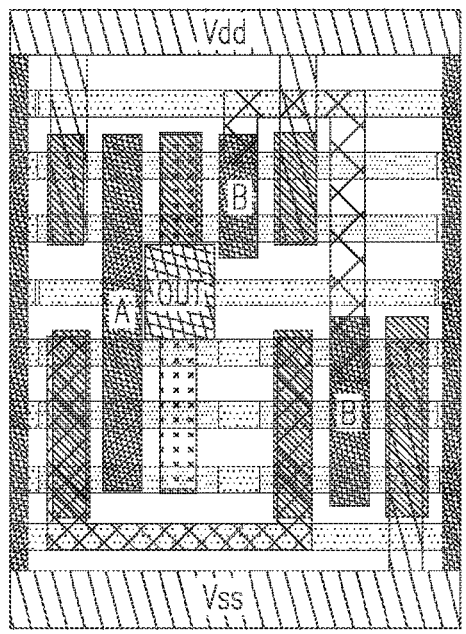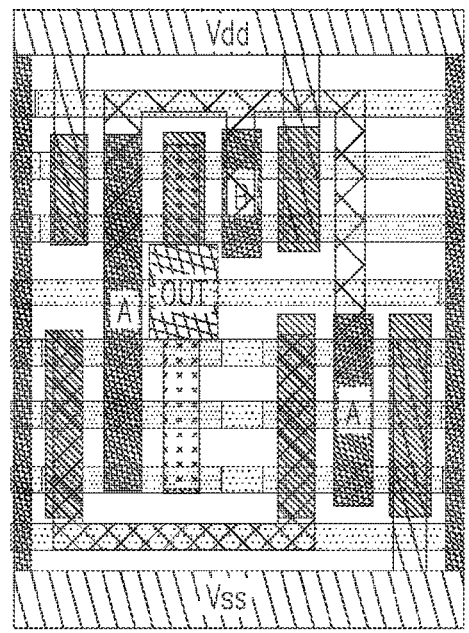
Figure 6B

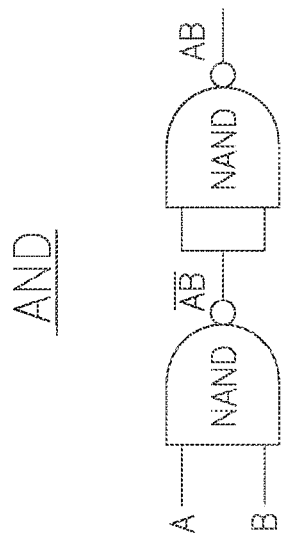
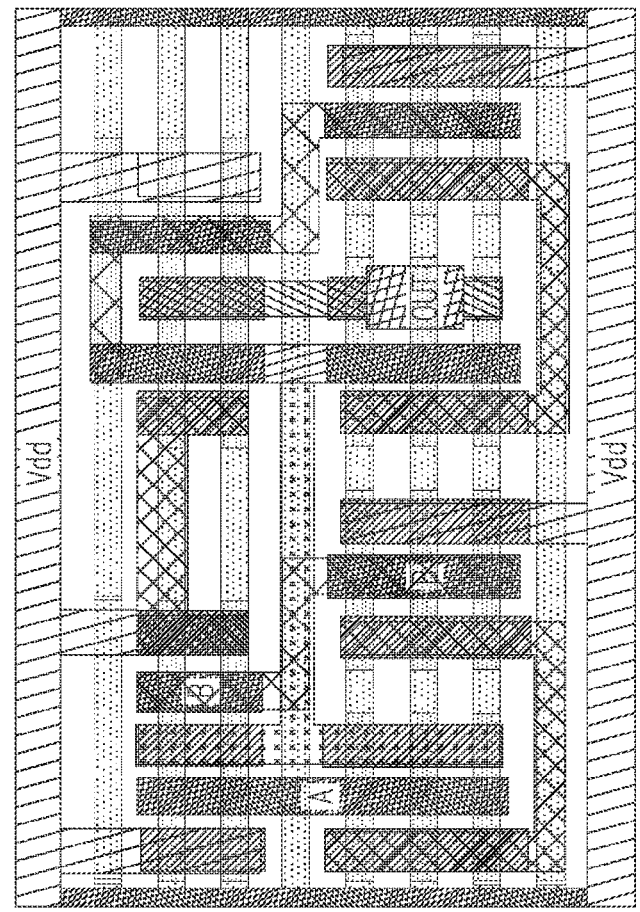
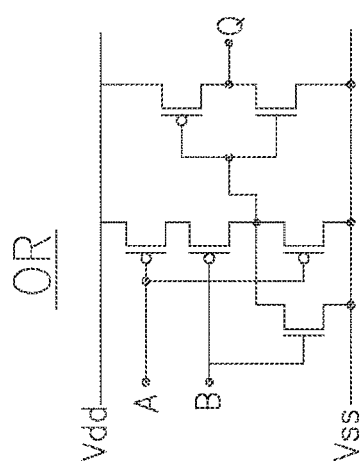
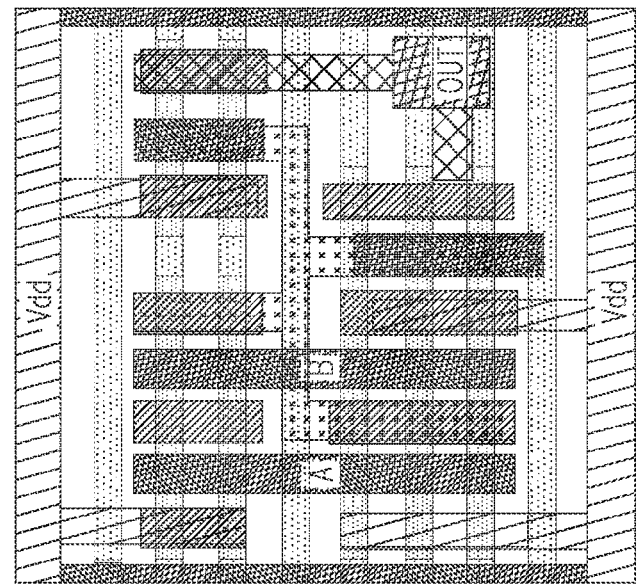
Figure 6D

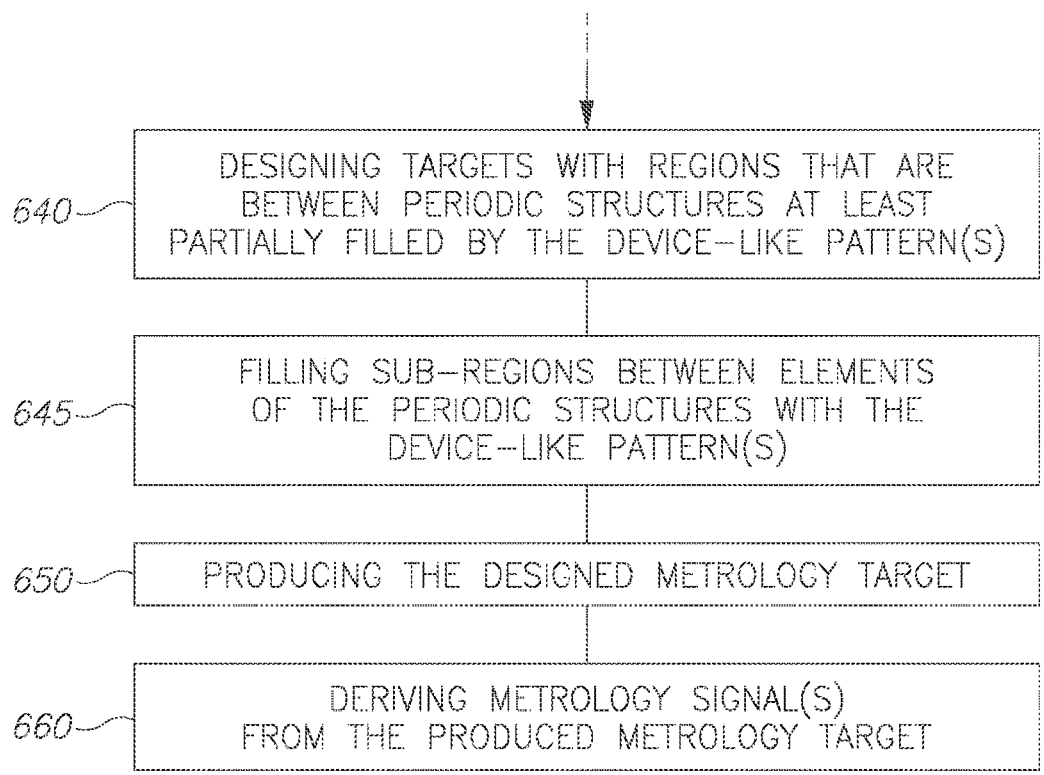
Figure 9 (cont. 1)

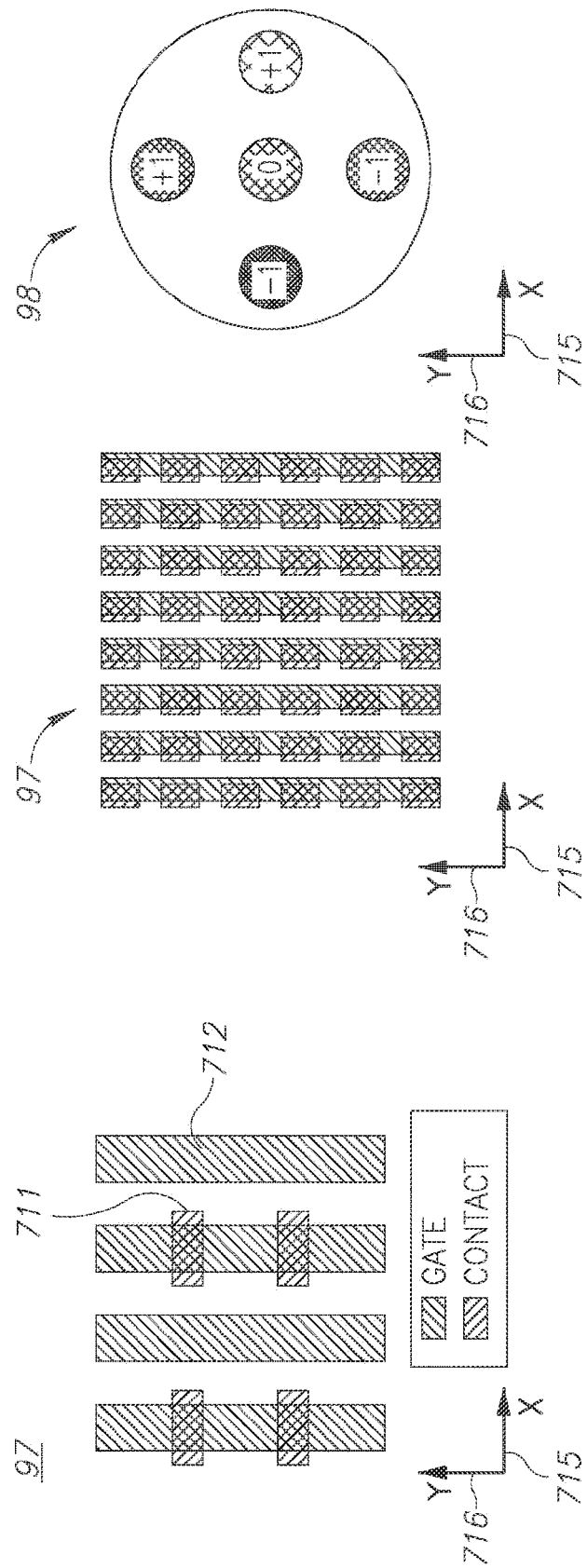
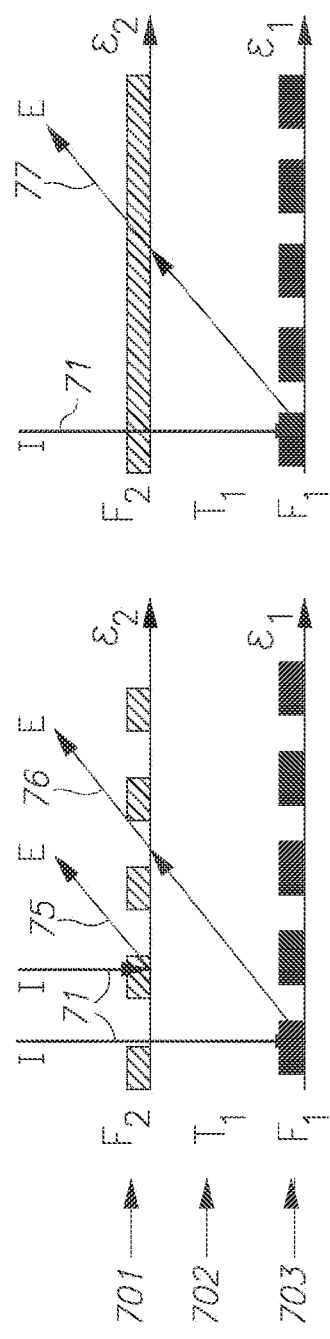
Figure 10
Figure 11
Figure 12

| INACCURACY (mm) | | CALIBRATION TARGETS (SECOND CELL 720) | | | | | | | | | | | | | | WITHOUT CALIBRATION |
|---|---|---|---|---|---|---|---|---|---|---|---|---|---|---|---|---|
| | | 50 | | | 100 | | | 200 | | | 300 | | | 400 | | |
| CD1 | CD2 | 200 | 300 | 400 | 200 | 300 | 400 | 200 | 300 | 400 | 200 | 300 | 400 | 200 | 300 | 400 | |
| 50 | 200 | 0.0 | 0.6 | 0.3 | 0.9 | 1.3 | 1.4 | 1.2 | 1.2 | 0.9 | 1.3 | 1.3 | 1.2 | 1.4 | 1.4 | 1.4 | 5.0 |
| | 300 | 0.7 | 0.0 | 0.5 | 1.4 | 1.7 | 1.8 | 1.8 | 1.6 | 0.9 | 1.8 | 1.8 | 1.8 | 1.8 | 1.8 | 1.8 | 4.3 |
| | 400 | 0.6 | 0.9 | 0.0 | 1.7 | 2.7 | 2.7 | 2.5 | 2.3 | 1.6 | 2.6 | 2.6 | 2.5 | 2.8 | 2.7 | 2.7 | 9.8 |
| 100 | 200 | 0.5 | 0.6 | 0.4 | 0.0 | 0.6 | 0.5 | 0.3 | 0.2 | 0.6 | 0.5 | 0.4 | 0.4 | 0.5 | 0.5 | 0.5 | 0.8 |
| | 300 | 0.3 | 0.3 | 0.3 | 0.3 | 0.0 | 0.3 | 0.3 | 0.3 | 0.3 | 0.3 | 0.2 | 0.2 | 0.3 | 0.3 | 0.2 | 0.5 |
| | 400 | 0.7 | 0.8 | 0.7 | 0.6 | 0.5 | 0.0 | 0.2 | 0.4 | 0.8 | 0.1 | 0.1 | 0.2 | 0.1 | 0.1 | 0.1 | 1.7 |
| 200 | 200 | 41.6 | 28.9 | 41.6 | 22.7 | 25.2 | 5.8 | 0.6 | 16.6 | 79.8 | 3.5 | 1.7 | 3.1 | 6.8 | 5.6 | 4.2 | 19.9 |
| | 300 | 1.1 | 1.4 | 1.1 | 0.7 | 0.8 | 1.2 | 0.7 | 0.0 | 1.3 | 0.7 | 0.5 | 0.4 | 0.8 | 0.7 | 0.5 | 1.5 |
| | 400 | 0.4 | 0.4 | 0.4 | 0.6 | 0.8 | 0.8 | 0.8 | 0.7 | 0.0 | 0.8 | 0.8 | 0.8 | 0.8 | 0.8 | 0.8 | 0.9 |
| 300 | 200 | 4.3 | 5.0 | 4.6 | 3.5 | 3.0 | 0.6 | 0.8 | 2.9 | 4.9 | 0.0 | 0.6 | 0.9 | 0.5 | 0.3 | 0.8 | 24.0 |
| | 300 | 10.8 | 14.5 | 14.0 | 16.4 | 6.3 | 6.3 | 2.1 | 14.1 | 10.1 | 2.3 | 0.0 | 3.1 | 2.6 | 7.6 | 10.8 | 336.3 |
| | 400 | 24.4 | 67.2 | 41.9 | 53.9 | 272.8 | 9.6 | 12.2 | 14.1 | 34.6 | 7.6 | 1.8 | 0.0 | 6.4 | 7.7 | 2.5 | 9.7 |
| 400 | 200 | 3.1 | 3.7 | 3.4 | 2.7 | 2.3 | 0.5 | 0.8 | 2.2 | 3.6 | 0.3 | 0.7 | 0.9 | 0.0 | 0.2 | 0.8 | 12.5 |
| | 300 | 3.1 | 3.6 | 3.2 | 2.5 | 2.2 | 0.3 | 0.7 | 2.0 | 3.5 | 0.2 | 0.5 | 0.7 | 0.2 | 0.0 | 0.5 | 11.3 |
| | 400 | 7.7 | 8.3 | 8.1 | 18.9 | 6.6 | 3.5 | 1.9 | 9.2 | 8.1 | 2.9 | 4.2 | 2.9 | 11.3 | 288.2 | 0.1 | 16.6 |

OVERLAY TARGETS (FIRST CELL 710)

Figure 14

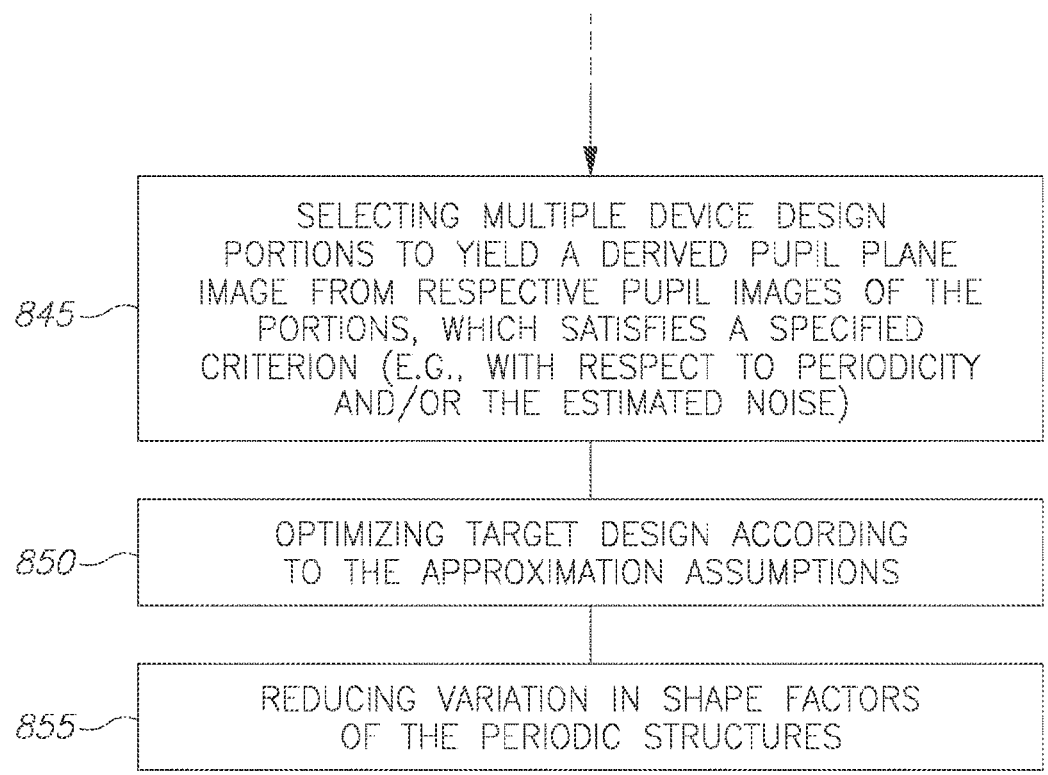
Figure 15 (cont. 1)

_900_

- 910 — USING REFERENCE CALIBRATION TARGETS AND/OR DEVICE-ADJACENT CELLS WITH INTENDED OFFSETS TO ENABLE DIRECT MEASUREMENT OF DEVICE PARTS WITHOUT INTRODUCING OFFSETS INTO THE DEVICE DESIGN
- 915 — CALIBRATING SENSITIVITY USING ANY OF: INTRODUCED OFFSETS ALONG NON-CRITICAL DIRECTION(S), ADJACENT TARGET CELLS WITH INTRODUCED OFFSETS, AND SENSITIVITY CALIBRATION TARGETS (E.G., ON SCRIBE LINES)
- 920 — EXTENDING THE CELL DESIGNS TO MULTI-LAYERED MEASUREMENTS
- 925 — CONFIGURING ADDITIONAL TARGETS TO PROVIDE LAYER-SPECIFIC METROLOGY PARAMETERS USING MULTI-LAYERED TARGET CELLS
- 930 — DIRECTLY MEASURING QUASI-PERIODIC DESIGN PATTERNS WHILE MANAGING AND BOUNDING THE RESULTING INACCURACIES
- 935 — MEASURING METROLOGY PARAMETERS FROM DEVICE PORTION(S) SELECTED TO HAVE IRREGULARLY REPEATING UNITS WITH DIFFERENT SETS OF LINES AND CUTS

Figure 17

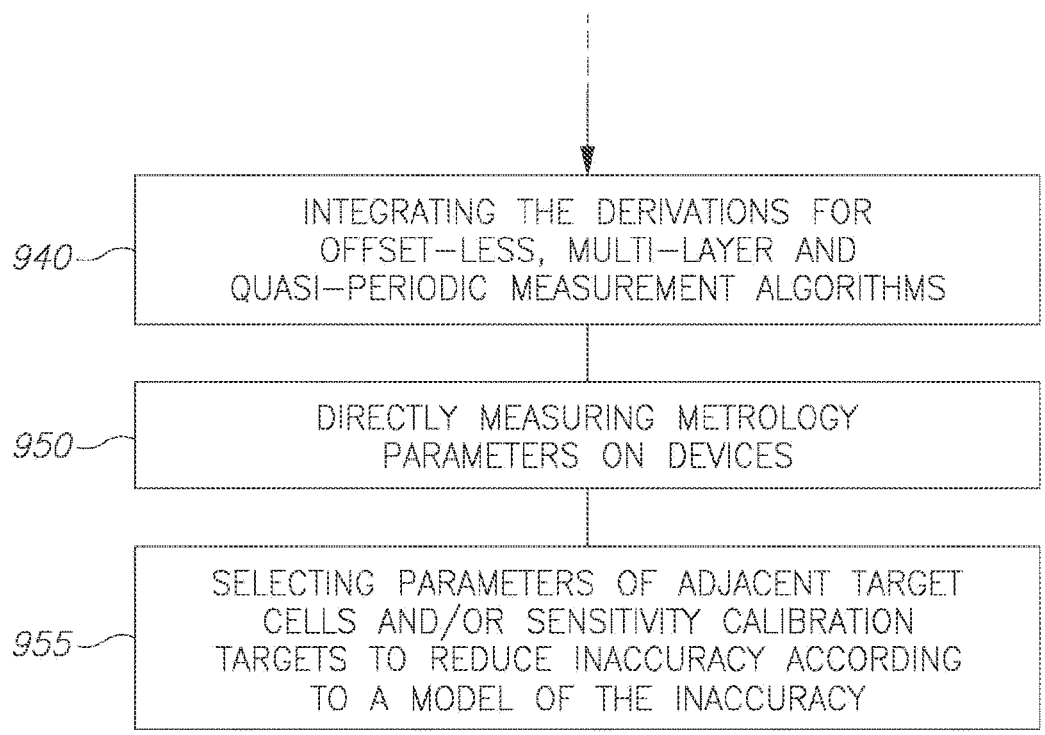
Figure 17 (cont. 1)

DEVICE METROLOGY TARGETS AND METHODS

CROSS REFERENCE TO RELATED APPLICATIONS

This application is a continuation of U.S. patent application Ser. No. 15/159,009, filed on May 19, 2016, which is a continuation of International Patent Application Serial No. PCT/US16/15782, filed Jan. 29, 2016, which claims the benefit of U.S. Provisional Patent Application No. 62/110,431 filed on Jan. 30, 2015 and the benefit of U.S. Provisional Patent Application No. 62/166,684 filed on May 27, 2015. Application Ser. No. 15/159,009, PCT/US16/15782, 62/110,431, and 62/166,684 are all incorporated herein by reference in their entirety.

FIELD OF THE INVENTION

The present invention relates to the field of metrology, and more particularly, to target designs and methods of deriving measurements therefrom.

BACKGROUND OF THE INVENTION

Metrology targets and methods aim at deriving measurements which represent the production accuracy of designed devices. Metrology faces the challenges of yielding measurable signals which accurately reflect properties of the devices, at a rate that is high enough and a real estate that is low enough, to minimize the hindrances to the production. Current metrology overlay (OVL) algorithms use special targets that have periodic structures in two layers, which are offset differently in different target cells.

U.S. Patent Application Publication No. 2014/0316730, which is incorporated herein by reference in its entirety, discloses methods and systems for performing semiconductor metrology directly on device structures using an on-the-fly model-based algorithm.

U.S. Patent Application Publication No. 2009/0244538, which is incorporated herein by reference in its entirety, discloses a lithographic apparatus arranged to transfer a pattern from a patterning device onto a substrate with a reference set of gratings provided in the substrate, the reference set including two reference gratings having line elements in a first direction and one reference grating having line elements in a second, perpendicular, direction. US 2009/0244538 requires identical (or very similar) designs for x and y in order to calculate the sensitivity of one direction and apply it to the second direction. However, this x-y design symmetry breaks in the device due to electrical functionality needs (and also the lithography process in critical layers is not symmetric).

U.S. Patent Application Publication No. 2011/0255066, which is incorporated herein by reference in its entirety, discloses measuring overlays using multiple targets in multiple fields, assuming that the overlay sensitivity of targets across the fields of the wafer is constant, ignoring intra-field process variations.

Young-Nam Kim et al. 2009 (Device based in-chip critical dimension and overlay metrology, Optics Express 17:23, 21336-21343), which is incorporated herein by reference in its entirety, discloses a model-based in-chip optical metrology technique that allows direct measurement of both critical dimensions and overlay displacement errors in the DRAM manufacturing process, performed on the actual semiconductor devices without requiring special target structures.

SUMMARY OF THE INVENTION

The following is a simplified summary providing an initial understanding of the invention. The summary does not necessarily identify key elements nor limits the scope of the invention, but merely serves as an introduction to the following description.

An overlay metrology system is disclosed in accordance with one or more illustrative embodiments of the present disclosure. In one illustrative embodiment, the system includes one or more processors coupled to an illumination source to direct illumination to a sample and a detector to capture diffracted orders of radiation from the sample. In another illustrative embodiment, the one or more processors generate overlay sensitivity calibration parameters based on differential measurements of diffracted orders from a calibration target including two overlay target cells on the sample, where first-layer target elements and second-layer target elements of the two overlay target cells are distributed with a common pitch along a measurement direction and are further misregistered with a selected offset value in opposite directions along the measurement direction. In another illustrative embodiment, the one or more processors determine overlay measurements based on measurements of diffracted orders on one or more additional overlay target cells with two selected wavelengths, where first-layer target elements and second-layer target elements of the additional overlay target cell are distributed with the common pitch along the measurement direction and are further formed to overlap symmetrically along the measurement direction. In another illustrative embodiment, the one or more processors adjust the overlay measurements with the overlay sensitivity calibration parameters.

An overlay metrology system is disclosed in accordance with one or more illustrative embodiments of the present disclosure. In one illustrative embodiment, the system includes an illumination source to direct illumination to a sample. In another illustrative embodiment, the system includes a detector to capture diffracted orders of radiation from the sample in response to the illumination from the illumination source. In another illustrative embodiment, the system includes one or more processors. In another illustrative embodiment, the one or more processors generate overlay sensitivity calibration parameters based on differential measurements of diffracted orders received by the detector from two overlay target cells on the sample, where first-layer target elements and second-layer target elements of the two overlay target cells are distributed with a common pitch along a measurement direction and are further misregistered with a selected offset value in opposite directions along the measurement direction. In another illustrative embodiment, the one or more processors determine an overlay measurement based on measurements of diffracted orders on an additional overlay target cell with two selected wavelengths, where first-layer target elements and second-layer target elements of the additional overlay target cell are distributed with the common pitch along the measurement direction and are further formed to overlap symmetrically along the measurement direction. In another illustrative embodiment, the one or more processors adjust the overlay measurement with the overlay sensitivity calibration parameters.

An overlay metrology method is disclosed in accordance with one or more illustrative embodiments of the present disclosure. In one illustrative embodiment, the method includes generating overlay sensitivity calibration parameters based on differential measurements of diffracted orders from a calibration target including two overlay target cells on the sample, where first-layer target elements and second-layer target elements of the two overlay target cells are distributed with a common pitch along a measurement direction and are further misregistered with a selected offset value in opposite directions along the measurement direction. In another illustrative embodiment, the method includes determining overlay measurements based on measurements of diffracted orders on one or more additional overlay target cells with two selected wavelengths, where first-layer target elements and second-layer target elements of the additional overlay target cell are distributed with the common pitch along the measurement direction and are further formed to overlap symmetrically along the measurement direction. In another illustrative embodiment, the method includes adjusting the overlay measurements with the overlay sensitivity calibration parameters.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 1B is a high level schematic illustration of two types of multilayer targets and measurement methods thereof, according to some embodiments of the invention.

FIGS. 3A and 3B are high level schematic illustrations of multilayer targets, according to some embodiments of the invention.

FIGS. 5A-5D and 6A-6F are high level schematic illustrations of quasiperiodic SCOL targets, according to some embodiments of the invention.

FIGS. 10 and 11 are high level schematic illustrations of device alignments, according to some embodiments of the invention.

FIG. 12 is a high level schematic illustration of leading diffraction orders along the non-critical and critical measurement directions, according to some embodiments of the invention.

FIG. 14 presents a table with exemplary simulation results of the resulting sensitivity values for different combinations of the first and second cells designs, according to some embodiments of the invention.

FIG. 17 is a high level flowchart illustrating an integrative method of measuring device overlays directly on the device, according to some embodiments of the invention.

DETAILED DESCRIPTION OF THE INVENTION

Figure 1A:
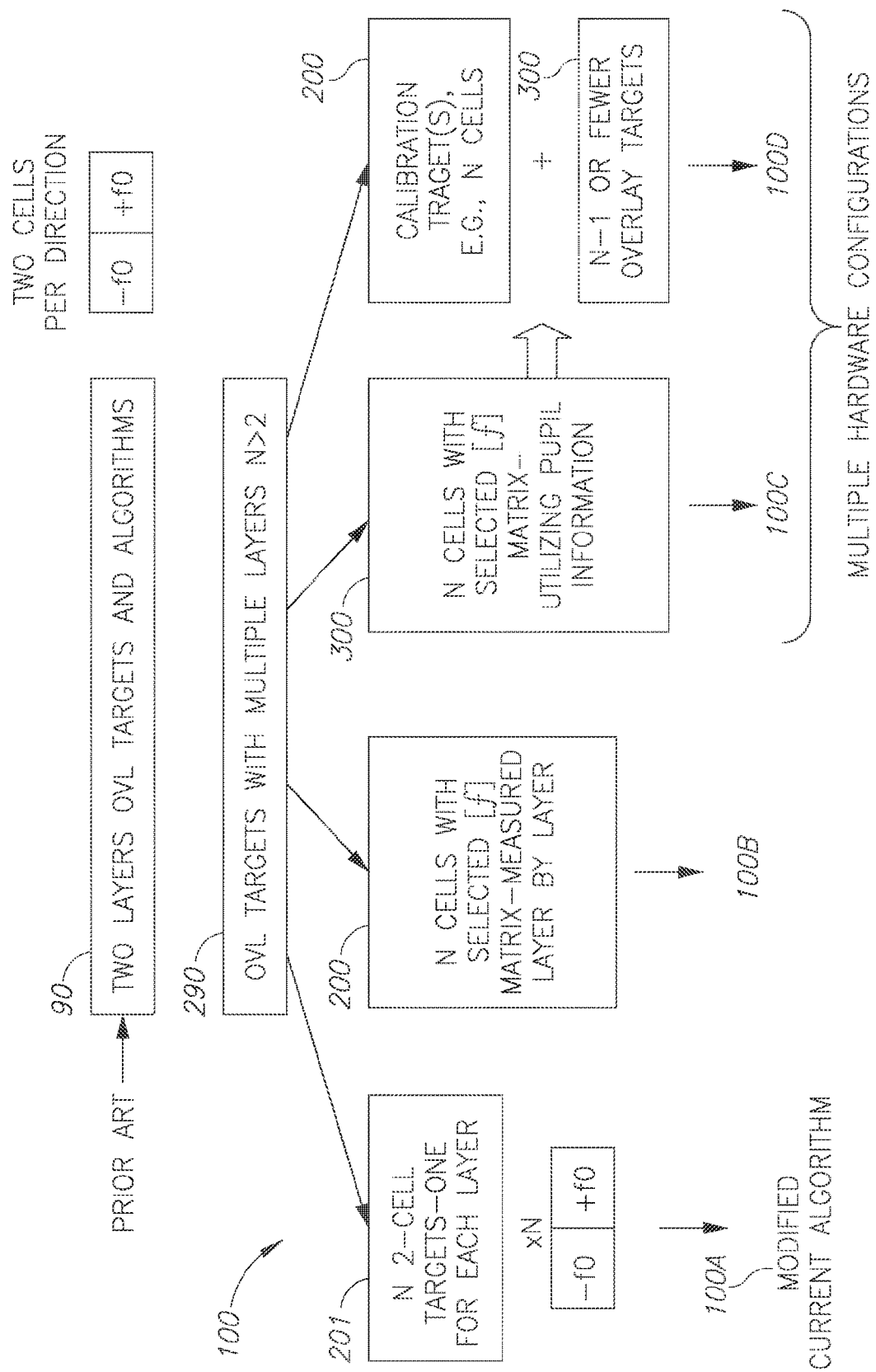
FIG. 1A is a high level schematic overview illustration of multilayer targets and measurement methods thereof, according to some embodiments of the invention.

Prior to the detailed description being set forth, it may be helpful to set forth definitions of certain terms that will be used hereinafter.

The terms "metrology target" or "target" as used herein in this application, are defined as any structure designed or produced on a wafer which is used for metrological purposes. Specifically, overlay targets are designed to enable measurements of the overlay between two or more layers in a film stack that is produced on a wafer. Exemplary overlay targets are scatterometry targets, which are measured by scatterometry at the pupil plane and/or at the field plane, and imaging targets.

Exemplary scatterometry targets may comprise two or more either periodic or aperiodic structures (referred to in a non-limiting manner as gratings) which are located at different layers and may be designed and produced one above the other (termed "grating-over-grating") or one adjacent to another from a perpendicular point of view, termed "side-by-side"). Target designs include one or more cells, the term "cell" as used herein in this application, is defined as a part of a target that is used to derive a measurement signal. Common scatterometry targets are referred to as SCOL (scatterometry overlay) targets, DBO (diffraction based overlay) targets and so forth. Common imaging targets are referred to as Box-in-Box (BiB) targets, AIM (advance imaging metrology) targets, AIMid targets, Blossom targets and so forth. It is noted that in the present invention, SCOL is related to as being model-free in the sense that the details of measured stack must not be known prior to the measurements and that no modelling of the target is necessarily required in order to extract the parameters. It is further noted that the invention is not limited to any of these specific types, but may be carried out with respect to any target design.

Target elements comprise periodic structures, having elements repeating at one or more pitches, such as gratings. Certain metrology targets exhibit an "induced offset", also termed "intended offset", "designed offset" or "designed misalignment", which is, as used herein in this application, an intentional shift or overlay between the periodic structures of the target. The term "overlay" as used herein in this application, is defined as the overall offset, i.e., the intended offset plus an unintentional offset, between two layers of a target or a device. The unintentional offset may thus be derived by subtracting the intended shift from the measured overlay. Overlay targets are typically designed to have pairs of cells, the cells of each pair having equal and opposite intended offsets, denoted $\pm f_0$.

The term "periodic" as used herein in this application with respect to a target or a target structure, is defined as them having a recurring pattern. The term "strictly periodic" as used herein in this application refers to a target or a target structure which have a recurring unit cell which is identical at all recurrences. The term "quasi-periodic" as used herein in this application refers to a target or a target structure which have a recurring pattern which does not have a recurring unit cell but rather exhibits a basic pattern such as a grid that underlies the respective element as well as multiple aberrations, for example, changes in the length, width or details of the recurring pattern, and/or changes in grid parameters and features. These aberrations may be judiciously selected (as explained) and/or may be random and/or may reflect design considerations. The effect of the aberrations on the signal, i.e., the difference between signals derived from quasi-periodic targets and equivalent strictly periodic target is referred to in this application as "noise", which may have random and systematic components. The noise may be considered as part of the inaccuracy defined below (with respect to the strictly periodic design) and/or may be treated independently thereof.

The terms "device" or "device design" as used herein in this application, are defined as any part of the wafer which provides an operating electronic circuit, such as e.g., memory devices or logic devices. The term "critical direction" as used herein in this application, is defined as a direction in the device design which is sensitive to small offsets between layers (e.g., in the order of magnitude of 1 nm), with the device possibly malfunctioning if such offsets occur. The term "non-critical direction" as used herein in this application, is defined as a direction in the device design which can tolerate small offsets (e.g., in the order of magnitude of 1 nm), without the device malfunctioning if such offsets occur.

The term "measurement direction" as used herein in this application, is defined as a direction along which the overlay is measured. When periodic targets are used there must be periodicity in the measurement direction. The pitch is in the order of hundreds up to a few thousands of nanometers. In addition to this coarse pitch there may be a typically much smaller segmentation pitch of the features and\or a coarse pitch in the orthogonal direction.

With respect to metrology measurements, the term "differential signal" as used herein in this application, is defined as the intensity difference between two signals, such as the +1 and −1 diffraction order signals, measured from a target. The term "sensitivity" as used herein in this application, is defined as a ratio, or relation, between the differential signal and the overall offset, or overlay, between periodic structures along a respective measurement direction. The term "inaccuracy" as used herein in this application, is defined as a difference between a result of a measurement and the true value of the measured quantity (measurand). It is underlined that while the presented models are mostly linear, for clarity reasons, linearity is non-limiting in the sense that the algorithms may be adapted to utilize non-linear model, which are therefore part of the present disclosure as well.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and targets for measuring metrology parameters, in particular overlays and particularly using model-free far field optical metrology, using device designs directly. Specifically, the following disclosure overcomes the three major barriers that prohibit prior art direct device measurements, namely the multi-layer character of device designs, the non-periodic nature of device designs and the inherent constraint of having to avoid introduction of intended offset into actual device designs (in order not to damage their electrical properties and performance).

Metrology methods and targets are provided, that expand metrological procedures beyond current technologies into multi-layered targets, quasi-periodic targets and device-like targets, without having to introduce offsets along the critical direction of the device design. Several models are disclosed for deriving metrology data such as overlays from multi-layered target and corresponding configurations of targets are provided to enable such measurements. Quasi-periodic targets which are based on device patterns are shown to improve the similarity between target and device designs, and the filling of the surroundings of targets and target elements with patterns which are based on device patterns improve process compatibility. Offsets are introduced only in non-critical direction and/or sensitivity is calibrated to enable, together with the solutions for multi-layer measurements and quasi-periodic target measurements, direct device metrology measurements.

The methods and targets are exemplified for optical scatterometry overlay (SCOL) measurements of device structures, which is a fast non-destructive overlay (OVL) technique. Its main limitation is the need for special targets due to its limited resolution. These metrology targets may have bad correlation with the actual device structures because of the big deviations between their designs and locations. It is therefore desired to measure directly the device in order to better reflect its OVL and other possible parameters of interest. The section labeled "multi-layer targets" provides methodologies which enable SCOL measurements of overlapping multiple parallel patterning. The section labeled "quasiperiodic targets" discloses how to handle device designs that lack a unit cell and are not strictly periodic as well as how to handle the signal to noise ratio in SCOL. The section labeled "filling targets gaps with device patterns" discloses how to enhance target process compatibility. Finally, the section labeled "avoiding offsets in device targets" presents innovative methods for sensitivity calculation without damaging the electrical properties. The disclosed methods, algorithms and target designs are combined synergistically into a complete solution for on-device optical OVL measurements.

Multi-Layer Targets

First, multi-layer targets are disclosed together with corresponding measurement and signal derivation algorithms which enable their measurement with no or small throughput/real-estate penalty. The targets are discussed in a non-limiting manner in a one dimensional context and for scatterometry overlay (SCOL) targets. Such targets and methods are expected to improve upon current technologies at least on the following aspects: (i) The design and measurements of optical overlay (OVL) of in-die targets (which better reflect the device overlay) may be enabled; (ii) More flexibility in design of target dummification is provided, e.g., by allowing the features to be parallel to the measurement direction, and (iii) The real estate and\or throughput specifications may be improved.

The present invention overcomes the limitation of the standard scatterometry overlay algorithm, which requires that the overlay between two gratings is the only source of symmetry breaking. When additional gratings are present, their relative offsets may vary the signal in a way that cannot be treated using the standard overlay algorithm. This contaminates the original two-layer overlay signal and results in an inaccurate measurement.

FIG. 1A is a high level schematic overview illustration of multilayer targets and measurement methods thereof, according to some embodiments of the invention. Prior art overlay targets and algorithms 90 relate to two-layered targets and respective overlay algorithms, which use at least two measurement cells having opposite predefined offsets $\pm f_0$ along each measurement direction. It is emphasized that applying prior art algorithms to targets with more than two layers results in an excessive number of variables due to the interaction between the illumination and the target layers. For example, prior art algorithms provide two equations (corresponding to the two target cells with opposite offsets) to derive two variables (the relative shifts between the layers, i.e., the overlay, and the coefficient A that related the overlay to the differential signal). In case of N>2 target layers, the two equations provided by prior art overlay algorithms are not sufficient to derive the overlays between the N layers.

The present disclosure proposes methods 100 and overlay targets 290 with three or more layers that enable extraction of various metrology parameters, represented herein by overlays, from multi-layered targets.

Certain embodiments propose using modified overlay algorithms, as a method 100A, to measure targets 201 having a plurality, N, of 2-cell targets, one cell pair for each of the N layers, all cells being identical but for a corresponding pair of cells for each layer, which have intended offsets $\pm f_0$ along the measurement direction. For example, each target may comprise two periodic layers configured to measure overlays between respective layers. The overlays may be derived from measurements of targets 201 by modified versions of prior art algorithms 90 which take into account the intermediate layers. However, this innovative solution suffers from the following drawbacks: (i) the targets are very different from the device (increasing the device-to-metrology bias) and (ii) the targets are less printable, even on the scribe-line, due to their being farther away from the desired process window. While it is possible to measure all overlays by modified SCOL algorithm 100A using targets 201, the following methods (100B-D) prove to be significantly more efficient in conserving real-estate and reducing MAM-time.

Certain embodiments use a half of the number of cells, namely N cells (or more) for measuring N-layered targets by selecting the offsets judiciously (denotes as a matrix [f], and defined below) and measuring the targets layer by layer, as explained and exemplified in Equations 1-6, method 100B and targets 200 below.

Certain embodiments use even fewer cells, namely N−1 cells (or more) and possibly even fewer cells than N−1, for measuring N-layered targets by selecting the offsets judiciously and utilizing pupil information (information in signals measured at the pupil plane with respect to the target of the metrology tool's optical system), as explained and exemplified in Equations 7-18, method 100C and targets 300 below. It is noted that using fewer than N cells per target is advantageous with respect to conservation of wafer real-estate and reduction of MAM (move-acquire-measure) time.

Certain embodiments use even fewer cells, namely as few as two cells (or more) 300 set near devices for measuring N-layered targets by selecting the offsets judiciously and utilizing pupil information, as well as by using additional calibration targets 200 which may be positioned at regions farther away from the devices, e.g., on scribe lines, as explained and exemplified in Equation 16C (based in the derivation in Equations 7-18), method 100D, targets 200, 300 and FIG. 1B below. It is noted that method 100D uses and further develops methods 100B, 100C and targets 200, 300.

Targets 290, 201, 200, 300 may be measured under different and possibly multiple hardware and illumination configurations, e.g., using different wavelengths and/or illumination modes, using different polarizations, using different apodizers or varying other elements in the optical system, to enhance calibrations and measurements, especially under applications of methods 100C and 100D.

FIG. 1B is a high level schematic illustration of two types of multilayer targets 200, 300 and measurement methods 100 thereof, according to some embodiments of the invention. Two methods are presented a first method 100B that uses an analysis of the differential signals from the multi-grating targets, and a second method 100C that uses an approximated decomposition of the overlay reported by the standard algorithm. Both methods rely on using the full pupil information in order to extract the additional needed information. For each method, non-limiting examples for three-layer targets are shown, with the calculations needed in order to infer the overlay values. It is noted that the three-layer targets are used per measurement direction, i.e., with N=3 and two direction measurements X, Y, six cells are used to measure the overlays among the three layers in both directions. Clearly, targets may be similarly designed to provide measurement along a single (critical direction) only.

Figure 2:
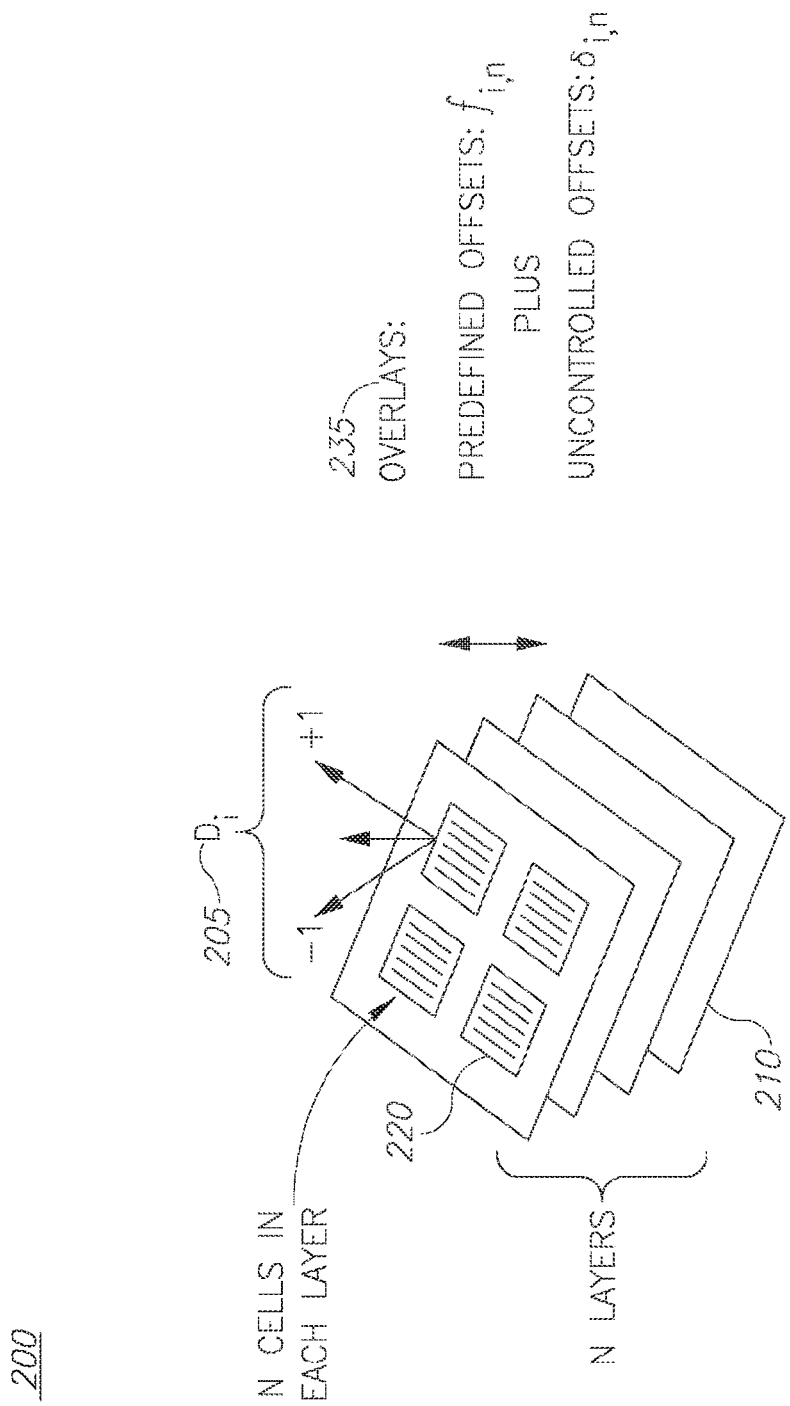
FIG. 2 is a high level schematic illustration of multilayer targets, according to some embodiments of the invention.

The following describes methods 100B, 100C as two non-exhaustive and non-limiting examples of method 100 of measuring overlay parameters in multiplayer SCOL metrology targets, i.e., targets which employ a plurality of periodic structures (related to in the following, in a non-limiting manner as gratings), that are designed to be printed on wafers 60. Possible combinations of methods 100B and 100C are suggested after the principles of each method are explained. FIG. 2 is a high level schematic illustration of multilayer targets 200, according to some embodiments of the invention. FIGS. 3A and 3B are high level schematic illustrations of multilayer targets 300, according to some embodiments of the invention.

FIG. 2 schematically illustrates target 200 comprising N cells 220 in N layers 210, each cell 220 having at least one periodic structure 230. It is noted that the choice of an identical number (N) of cells and layers is made merely to simplify the explanation below, and does not limit the scope of the invention. The number of cells may be larger or smaller than the number of layers as well (for the latter possibility see additional derivations below). Periodic structures 230 are overlapping (one above the other) characterized by predefined (intended) offsets ($f_{i,n}$, relating to cell i and layer n) between cell layers 210, as well as by uncontrolled (unintended) offsets ($\delta_{i,n}$, relating to cell i and layer n) that are the aim of metrology method 100. Both offsets are derived from signals 205 by estimation of the respective overlays, which are influenced by both types of offsets. The measured signal in first-order scatterometry overlay is the differential signal D 205, which is the intensity difference between the +1 and −1 diffraction orders when a target cell 220 is illuminated. Differential signal D 205 is used as a non-limiting example, as the disclosed methods may be used to measure differences between other diffraction orders as well as derived metrological measurements.

The signal from the $i^{th}$ cell 220 of N-cell target can be approximated as in Equations 1, and the terms $B_k$ may be respectively defined, with $f_{i,n}$ and $\delta_{i,n}$ being the predetermined and uncontrolled different grating offsets for layer n of the ith cell, respectively, and the parameters $\varepsilon_{i,n} = f_{i,n} + \delta_{i,n}$ are defined as the total offset.

$$D_i(\varepsilon_{i,1}, \varepsilon_{i,2}, \ldots \varepsilon_{i,N}) = \quad \text{Equations 1}$$

$$\sum_{n=1}^{N} \sum_{m=1}^{n-1} A_n \cdot A_m \cdot (\delta_{i,m} - \delta_{i,n} + f_{i,m} - f_{i,n})$$

$$D_i = \sum_{k=1}^{N-1} B_k \cdot (OVL_k + f_{i,N} - f_{i,k})$$

$$B_k = \sum_{n_1 \ldots n_{N-1}, m_1 \ldots m_{N-1}} (n_k - m_k) \cdot a_{n_1 \ldots n_{N-1}} \cdot$$

$$a_{m_1 \ldots m_{N-1}} \cdot \sin(\varphi_{n_1 \ldots n_{N-1}} - \varphi_{m_1 \ldots m_{N-1}})$$

The product $A_n \cdot A_m$ describes the optical signal coupling between layers it and m, which is unknown but assumed to be independent of the offsets. To find the relative offsets $\varepsilon_{1,1}$ may be assumed, in a non-limiting manner, to be zero, and the coefficients $A_n$ may be normalized (e.g., to define $\tilde{A}_n = A_n / A_1$) to reduce the number of unknown parameters to 2(N−1).

Standard overlay targets have two layers and therefore two unknown parameters, and the two cells are used to provide the required two measured signals. Method 100 comprises the development of a new formalism that is required to handle more than two overlapping gratings, in order to distinguish between the effects of the offsets of the different layers on the signal. The inventors note that such a challenge has not yet been handled due to the high level of complexity involved in the design of the targets, in the theoretical analysis and in the practical measurement procedures, all of which are disclosed in the present invention. In the next sections two innovative formalisms (corresponding to procedures 100B and 100C) are described and demonstrated by simplified, non-limiting models. The inventors note that a person skilled in the art can easily expand these models to include additional contributions, e.g., higher diffraction orders, which are thus considered likewise a part of the present disclosure.

Method 100B uses the inspection of differential signals 205 from targets 200 to obtain overlays 235 (notated—OVL). Two variants of method 100B are presented—one assuming that the values of the previous OVLs are known, and a more advance variant that uses the pupil information in order to obtain all OVL values in the design, without a priori knowledge of the OVLs.

Method 100B begins with designing target 200 with N cells 220, each with N layers 210 featuring predetermined offsets $f_{i,k}$, denoting the offsets at cell i and layer k and presented as matrix f in Equations 2. As explained above, the choice of the same number of cells and layers is non-limiting. The N×(N−1) differential-offset matrix F, and the (N−1)×(N−1) differential differential-offset matrix G are defined in Equations 2, and the differential differential-signal vector Δ is defined and related to matrix G in Equations 3, based on Equations 1. The inventors have found out, that selecting the offset values of f in a way that yields an invertible (non-singular) matrix G enables the derivation of the overlay values from the target measurements, as shown explicitly below. The specific values of $f_{i,k}$ may be selected judiciously depending on device specifications, and are generally below $\frac{1}{30}$ of the target pitch.

$$f = \begin{pmatrix} f_{1,1} & f_{1,2} & \cdots & f_{1,N} \\ f_{2,1} & f_{2,2} & \cdots & f_{2,N} \\ \vdots & \vdots & \ddots & \vdots \\ f_{N,1} & f_{N,2} & \cdots & f_{N,N} \end{pmatrix} \quad \text{Equations 2}$$

$$F = \begin{pmatrix} F_{1,1} & F_{1,2} & \cdots & F_{1,N-1} \\ F_{2,1} & F_{2,2} & \cdots & F_{2,N-1} \\ \vdots & \vdots & \ddots & \vdots \\ F_{N,1} & F_{N,2} & \cdots & F_{N,N-1} \end{pmatrix} =$$

$$\begin{pmatrix} f_{1,1}-f_{1,N} & f_{12}-f_{1N} & \cdots & f_{1,N-1}-f_{1N} \\ f_{2,1}-f_{2,N} & f_{22}-f_{2N} & \cdots & f_{2,N-1}-f_{2N} \\ \vdots & \vdots & \ddots & \vdots \\ f_{N,1}-f_{N,N} & f_{N2}-f_{NN} & \cdots & f_{N,N-1}-F_{NN} \end{pmatrix}$$

$$G = \begin{pmatrix} G_{1,1} & G_{1,2} & \cdots & G_{1,N-1} \\ G_{2,1} & G_{2,2} & \cdots & G_{2,N-1} \\ \vdots & \vdots & \ddots & \vdots \\ G_{N-1,1} & G_{N-1,2} & \cdots & G_{N-1,N-1} \end{pmatrix} =$$

$$\begin{pmatrix} F_{1,1}-F_{N,1} & F_{1,2}-F_{N,2} & \cdots & F_{1,N-1}-F_{N,N-1} \\ F_{2,1}-F_{N,1} & F_{2,2}-F_{N,2} & \cdots & F_{2,N-1}-F_{N,N-1} \\ \vdots & \vdots & \ddots & \vdots \\ F_{N-1,1}-F_{N1} & F_{N-1,2}-F_{N2} & \cdots & F_{N-1,N-1}-F_{N,N-1} \end{pmatrix}$$

$$\Delta = \begin{pmatrix} \Delta_1 \\ \Delta_2 \\ \vdots \\ \Delta_{N-1} \end{pmatrix}, B = \begin{pmatrix} B_1 \\ B_2 \\ \vdots \\ B_{N-1} \end{pmatrix}, \quad \text{Equations 3}$$

$$\Delta_i = \Sigma_{k=1}^{N-1} G_{ik} B_k = (GB)_i, \; B = G^{-1}\Delta$$

$$\Delta_i = D_N - D_i = \sum_{k=1}^{N-1} B_k \cdot [(f_{i,k}-f_{i,N}) - (f_{N,k}-f_{N,N})],$$

As seen in Equation 3, the definitions of matrix G and vector $\Delta$ provide their use in obtaining the coefficients $B_k$ defined in Equations 1, which are in turn used to provide the overlay values from the measurements (given the predetermined offset matrices and the measured differential signals). Accordingly, Equations 4 relate the overlay values OVL to the differentials signal D, the B vector and the predefined offsets (in terms of elements on matrix F), for the $N^{th}$ cell, and further provide the respective relations of the overlay values for cells N−1 down to 2. This is the first variant of method 100B related to above.

$$D_N = \sum_{k=1}^{N-1} B_k \cdot (OVL_k - F_{N,k}) = \quad \text{Equations 4}$$

$$\sum_{k=1}^{N-2} B_k \cdot (OVL_k - F_{N,k}) + B_{N-1} \cdot (OVL_{N-1} - F_{N,N-1})$$

$$OVL_{N-1} = \frac{D_N - \Sigma_{k=1}^{N-2} B_k \cdot (OVL_k - F_{N,k})}{B_{N-1}} + F_{N,N-1}$$

Thus, given (i) the measured differential signals, (ii) the predetermined offset matrices, and (iii) the OVL values for all previous layers (N−2 overlay values), the OVL of the current layer may be calculated. Equation 5 demonstrates this for the simple, non-limiting case of target 200 having three layers.

$$OVL_2 = \frac{D_3 - B_1 \cdot (OVL_1 - F_{3,1})}{B_2} + F_{3,2} \quad \text{Equation 5}$$

The non-limiting example of three layered target 200 is presented explicitly in Equations 6A-6C. The offset matrix f provides the F, G, and inverse G matrices (with $G_{i,j}^{-1}$ being the i, j matrix element of the inverse of matrix G) as expressed in Equations 6A and the B vector as expressed in Equations 6B.

$$f = f_0 \begin{pmatrix} 1 & 0 & 0 \\ 0 & 1 & 0 \\ 0 & 0 & 1 \end{pmatrix} \Rightarrow F = f_0 \begin{pmatrix} 1 & 0 \\ 0 & 1 \\ -1 & -1 \end{pmatrix}, \quad \text{Equations 6A}$$

$$G = f_0 \begin{pmatrix} 2 & 1 \\ 1 & 2 \end{pmatrix}, G^{-1} = \frac{1}{3f_0} \begin{pmatrix} 2 & -1 \\ -1 & 2 \end{pmatrix}$$

$$B = \begin{pmatrix} B_1 \\ B_2 \end{pmatrix} = G^{-1}\Delta = \begin{pmatrix} G_{11}^{-1} & G_{12}^{-1} \\ G_{21}^{-1} & G_{22}^{-1} \end{pmatrix} \begin{pmatrix} D_3 - D_1 \\ D_3 - D_2 \end{pmatrix} = \quad \text{Equations 6B}$$

$$\begin{pmatrix} G_{11}^{-1}(D_3-D_1) + G_{12}^{-1}(D_3-D_2) \\ G_{21}^{-1}(D_3-D_1) + G_{22}^{-1}(D_3-D_2) \end{pmatrix} =$$

$$\frac{1}{3f_0} \begin{pmatrix} -D_1 + D_2 + D_3 \\ D_1 - 2D_2 + D_3 \end{pmatrix}$$

Assuming a known value for $OVL_1$, Equation 6C provides $OVL_2$, which is hence readily calculable from measured differential signals from the three cells of target 200.

$$OVL_2 = \frac{D_3 - B_1 \cdot (OVL_1 - F_{3,1})}{B_2} + F_{3,2} = \quad \text{Equations 6C}$$

$$\frac{D_3 - B_1 \cdot (OVL_1 + f_0)}{B_2} - f_0 =$$

$$\frac{3f_0 D_3 - (-2D_1 + D_2 + D_3) \cdot (OVL_1 + f_0)}{(D_1 - 2D_2 + D_3)} - f_0$$

The second, more advanced variant of method 100, related to herein as method 100C, overcomes the need for all previous OVL values by combining the information from all the pixels within the pupil and using the fact that the previous OVL values do not depend on the pixel position. The latter observation is used to define a cost function $\Omega$ which has a zero differential with respect to any OVL value (the example is with respect to $OVL_1$, in a non-limiting manner) as expressed and developed by Equations 7. The summation parameter q denotes the individual pixels in the pupil plane signal. In certain embodiments, q may be summed over a part of the pupil, e.g., according to simulation-based optimizations.

$$\Omega = \sum_{m=1}^{N} \sum_{q \in pupil} \left[ D_m(q) - \sum_{k=1}^{N-1} B_k(q) \cdot (OVL_k - F_{mk}) \right]^2 \quad \text{Equations 7}$$

$$\frac{\partial \Omega}{\partial OVL_1} =$$

-continued $$\sum_{m=1}^{N} \sum_{q \in pupil} B_l(q) \left[ D_m(q) - \sum_{k=1}^{N-1} B_k(q) \cdot (OVL_k - F_{mk}) \right] = 0$$

$$\sum_{k=1}^{N-1} \left[ \sum_{m=1}^{N} \sum_{q \in pupil} B_l(q) B_k(q) \right] \cdot OVL_k =$$

$$\sum_{m=1}^{N} \sum_{q \in pupil} B_l(q) \left[ D_m(q) + \sum_{k=1}^{N-1} B_k(q) \cdot F_{mk} \right]$$

$$\sum_{k=1}^{N-1} \sum_{q \in pupil} B_l(q) B_k(q) \cdot OVL_k =$$

$$\frac{1}{N} \sum_{q \in pupil} B_l(q) \sum_{m=1}^{N} \left[ D_m(q) + \sum_{k=1}^{N-1} B_k(q) \cdot F_{mk} \right]$$

$$\sum_{k=1}^{N} \sum_{q \in pupil} B_l(q) B_k(q) \cdot OVL_k =$$

$$\sum_{q \in pupil} B_l(q) \left[ D_N(q) + \sum_{k=1}^{N-1} B_k(q) \cdot F_{Nk} \right]$$

Equations 7 provide the relation between the overlays and the signals measured at the pupil plane with respect to the metrology target, in the metrology tool. The overlays can be derived as $OVL = W^{-1}V$ using the $(N-1) \times (N-1)$ matrix $W$ and an $(N-1) \times 1$ vector $V$ defined by Equations 8, as Equations 7 imply $W \cdot OVL = V$.

$$W_{lk} = \sum_{q \in pupil} B_l(q) B_k(q);$$

Equations 8

$$V_l = \sum_{q \in pupil} B_l(q) \left[ D_N(q) + \sum_{k=1}^{N-1} B_k(q) \cdot F_{Nk} \right]$$

Continuing with the simple non-limiting example of three-layered target 200 (see Equations 6A-6C) and using the advanced variant discussed above (Equations 7 and 8), the pupil information enables calculation of the W and V according to Equations 9A, and the derivation of the overlay values from the matrices as $OVL = W^{-1}V$ according to Equation 9B.

$$W_{lk} = \sum_{q \in pupil} B_l(q) B_k(q);$$

Equations 9A $$V_l = \sum_{q \in pupil} B_l(D_3 + B_1 F_{3,1} + B_2 F_{3,2})$$

$$W = \begin{pmatrix} \sum_q B_1 B_1 & \sum_q B_1 B_2 \\ \sum_q B_2 B_1 & \sum_q B_2 B_2 \end{pmatrix},$$

$$V = \begin{pmatrix} \sum_q B_1(D_3 + B_1 F_{3,1} + B_2 F_{3,2}) \\ \sum_q B_2(D_3 + B_1 F_{3,1} + B_2 F_{3,2}) \end{pmatrix}$$

$$OVL = W^{-1}V$$

Equation 9B $$\begin{pmatrix} OVL_1 \\ OVL_2 \end{pmatrix} = \begin{pmatrix} \sum_q B_1 B_1 & \sum_q B_1 B_2 \\ \sum_q B_2 B_1 & \sum_q B_2 B_2 \end{pmatrix}^{-1}$$

$$\begin{pmatrix} \sum_q B_1(D_3 + B_1 F_{3,1} + B_2 F_{3,2}) \\ \sum_q B_2(D_3 + B_1 F_{3,1} + B_2 F_{3,2}) \end{pmatrix}$$

FIGS. 3A and 3B are high level schematic illustrations of multilayer targets 300, according to some embodiments of the invention. FIGS. 3A and 3B illustrate in a non-limiting manner three-layered target 300, the disclosed principles may be implemented to multi-layered targets by a person skilled in the art, hence the latter are considered likewise part of the disclosed invention.

Multilayer targets are not used in the prior art since the additional layers (beyond two) are an additional symmetry breaking source which contaminates the overlay signal from the two layers and results in inaccurate measurement. In the following, the one or more additional layer(s) are treated as an inaccuracy source and their effect on the signal is characterized. The characterization is used (i) to eliminate the inaccuracy contribution of the additional layer(s) to the overlay of an original two-layered target (which may be selected arbitrarily in target 300); and (ii) to calculate the offset of the additional layer(s) with respect to the original layers. These are part of method 100D (see FIG. 1A), which may replace and/or augment methods 100B and 100C of measuring multilayered targets 200, which was described above. Particularly, the distinction between targets 200 and 300 is made merely to clarify the explanations and not to limit the scope of the invention, as clearly multi-layered targets may be design to combine the features of targets 200 and 300.

FIG. 3A schematically illustrates a non-limiting case, in which top and intermediate layers 310, 320, respectively, are regarded as the original layers for which an overlay is to be calculated, while bottom layer 330 (which may be replaced by multiple layers) is regarded as the inaccuracy source. The effect of the bottom layer offset with respect to the intermediate layer is similar to a symmetry breaking due to side wall angle asymmetry. FIG. 3B schematically illustrates three layered target 300 with designation of the refracted electric fields as defined below, upon illumination I. It is assumed for the sake of simplicity, in a non-limiting manner, that the periodic structures in layers 310, 320 330 are parallel gratings with identical pitches. It is further assumed, in a non-limiting manner, that the leading orders of the refracted electric field are $E_1^r$—the first order signal refracted off top grating 310, $E_{010}$—the field transmitted through top grating 210, refracted to the first order off middle grating 320, and transmitted through top grating 310, and $E_{00100}$—the field transmitted through top and middle gratings 210, 220 respectively, refracted to the first order off bottom grating 330, and transmitted through middle and top gratings 320, 310, respectively, as illustrated in FIG. 3B. The corresponding intensity of each of these fields as $I_1^r = |E_1^r|^2$, $I_{010} = |E_{010}|^2$, and $I_{00100} = |E_{00100}|^2$. Under the assumptions stated above, the overall intensity at a given collection pupil point is expressed by Equation 10, with $$\Delta_n = \frac{2\pi}{P}\varepsilon_n$$

($\varepsilon_n$ as defined above) and $\theta_1^r$, $\theta_{010}$ and $\theta_{00100}$ being the respective topographic phases; and the differential signal is expressed by Equation 11, with coefficients $A_{ij}$ not depending on the layer offsets.

$$|E(k)|^2 = I_1^r + I_{010} + I_{00100} +$$
$$E_1^t E_{010}(e^{-i\Delta_3} e^{i(\theta_{010}+\Delta_2)} + e^{i\Delta_3} e^{-i(\theta_{010}+\Delta_2)}) +$$
$$E_1^t E_{00100}(e^{-i\Delta_3} e^{i(\theta_{00100}+\Delta_1)} + e^{i\Delta_3} e^{-i(\theta_{00100}+\Delta_1)}) + E_{00100}$$
$$E_{010}(e^{-i(\theta_{00100}+\Delta_1)} e^{i(\theta_{010}+\Delta_2)} + e^{i(\theta_{00100}+\Delta_1)} e^{-i(\theta_{010}+\Delta_2)})$$

Equation 10

$$D(k) \equiv |E(k)|^2 - |E(-k)|^2 = A_{23}(k)\sin(\Delta_2 - \Delta_3) +$$
$$A_{13}(k)\sin(\Delta_3 - \Delta_1) + A_{12}(k)\sin(\Delta_1 - \Delta_2),$$
$$A_{23}(k) \equiv -4E_1^t E_{010}\sin(\theta_{010})$$
$$A_{13}(k) \equiv -4E_1^t E_{00100}\sin(\theta_{010})$$
$$A_{12}(k) \equiv -4E_{00100} E_{010}\sin(\theta_{00100})$$

Equation 11

The differential signal of Equation 11 may be approximated as expressed in Equation 12, assuming $$\Delta_1^2 = \left(\frac{2\pi}{P}\varepsilon_1\right)^2 \ll 1.$$

$$D(k) \approx A_{23}(k)\sin(\Delta_2-\Delta_3)+[A_{12}(k)-A_{13}(k)]\sin(\Delta_1)+A_{13}(k)\sin(\Delta_3)-A_{12}(k)\sin(\Delta_2)$$

Equation 12

In a non-limiting manner, the offset of middle grating 320 may be selected as zero, and Equation 12 may be expressed as Equations 13, with the definitions of f(k) and $\tilde{A}_1(k)$.

$$D(k) \approx -A_{23}(k)\sin\left(\frac{2\pi}{P}\varepsilon_3\right) + [A_{12}(k) - A_{13}(k)]\sin\left(\frac{2\pi}{P}\varepsilon_1\right) +$$
$$A_{13}(k)\sin\left(\frac{2\pi}{P}\varepsilon_3\right) = [A_{13}(k) - A_{23}(k)]$$
$$\sin\left(\frac{2\pi}{P}\varepsilon_3\right) + [A_{12}(k) - A_{13}(k)]\sin\left(\frac{2\pi}{P}\varepsilon_1\right)$$
$$f(k) \equiv A_{13}(k) - A_{12}(k), \tilde{A}_3(k) \equiv A_{13}(k) - A_{23}(k)$$
$$D(k) \approx \tilde{A}_3(k)\sin\left(\frac{2\pi}{P}\varepsilon_3\right) - f(k)\sin\left(\frac{2\pi}{P}\varepsilon_1\right)$$

Equations 13

As a result of Equations 13, the overlay (OVL) between top and bottom layers 310, 330, using a standard OVL algorithm (Equation 14, with $$\varepsilon_3^\pm = \delta_3 \pm f_0,$$

and with $D(\pm f_0)$ as the corresponding differential signals), is as expressed in Equation 15. The notation in Equations 14-18 uses $\delta$ as the overlay OVL, while rOVL denotes the overlay reported by the SCOL algorithm. rOVL and $\delta$ (the actual OVL) may differ due to inaccuracy).

$$rOVL_{23}(k) = f_0\frac{D(f_0) + D(-f_0)}{D(f_0) - D(-f_0)} \approx$$

Equation 14

$$f_0\frac{\tilde{A}_3(k)\sin\left(\frac{2\pi}{P}\varepsilon_3^+\right) - f(k)\sin\left(\frac{2\pi}{P}\varepsilon_1\right) +}{\tilde{A}_3(k)\sin\left(\frac{2\pi}{P}\varepsilon_3^-\right) - f(k)\sin\left(\frac{2\pi}{P}\varepsilon_1\right)} \approx$$
$$\tilde{A}_3(k)\sin\left(\frac{2\pi}{P}\varepsilon_3^+\right) - f(k)\sin\left(\frac{2\pi}{P}\varepsilon_1\right) -$$
$$\tilde{A}_3(k)\sin\left(\frac{2\pi}{P}\varepsilon_3^-\right) + f(k)\sin\left(\frac{2\pi}{P}\varepsilon_1\right)$$

$$f_0\frac{\tilde{A}_3(k)\frac{2\pi}{P}(\delta_3 + f_0) - f(k)\frac{2\pi}{P}\varepsilon_1 +}{\tilde{A}_3(k)\frac{2\pi}{P}(\delta_3 - f_0) - f(k)\frac{2\pi}{P}\varepsilon_1} \approx \delta_3 - \frac{f(k)}{\tilde{A}_3(k)}\varepsilon_1$$
$$\tilde{A}_3(k)\frac{2\pi}{P}(\delta_3 + f_0) - f(k)\sin\left(\frac{2\pi}{P}\varepsilon_1\right) -$$
$$\tilde{A}_3(k)\frac{2\pi}{P}(\delta_3 - f_0) + f(k)\frac{2\pi}{P}\varepsilon_1$$

$$rOVL(k,n) \approx \delta_3(n) - \tilde{f}(k)\varepsilon_1(n)$$

Equation 15

$$\tilde{f}(k) = \frac{A_{13}(k) - A_{12}(k)}{A_{13}(k) - A_{23}(k)} = \frac{1 - \frac{E_{010}}{E_1^t}\frac{\sin(\theta_{00100}-\theta_{010})}{\sin(\theta_{00100})}}{1 - \frac{E_{010}}{E_{00100}}\frac{\sin(\theta_{010})}{\sin(\theta_{00100})}}$$

Equation 15 shows that the measured rOVL per pixel can be separated into the OVL between the top layers and a term that depends on the bottom layer offset. In the latter term there is a separation of variables: Momentum dependency and bottom-layer offset. It is assumed that the first term does not depend on site while the second term does not depend on momentum.

A more general calculation can be used for improved accuracy (i.e., —more diffraction modes, non-linear contributions). Mathematical methods for solving such systems are presented in WIPO Publication No. PCT/US14/52670, which is incorporated herein by reference in its entirety.

In another version, continuing from Equations 13 using Equations 13A, the overlay between layers 1 and 2 may be derived using the standard overlay algorithm, as expressed in Equations 14A.

$$f(k) \equiv -\frac{2\pi}{P_1}[A_{13}(k) + A_{12}(k)],$$

Equations 13A $$\tilde{A}_1(k) \equiv -[A_{13}(k) - A_{23}(k)]$$
$$D(k) \approx \tilde{A}_3(k)\sin\left(\frac{2\pi}{P}\varepsilon_3\right) - f(k)\sin\left(\frac{2\pi}{P}\varepsilon_1\right)$$

$$rOVL(k) = \frac{P}{2\pi}\tan^{-1}\left(\frac{2\pi}{P}\left(\delta_3 - \tilde{f}(k)\sin\left(\frac{2\pi}{P}\varepsilon_1\right)\right)\right)$$

Equations 14A $$\tilde{f}(k) \equiv \frac{A_{13}(k) + A_{12}(k)}{A_{23}(k)}$$

If the signal from the bottom layer is smaller than the signal from the top layer, or is in the order of magnitude thereof, a respective additional approximation may be used and the overlay may be expressed as in Equation 15A, with in as the site index.

$$\left|\tilde{f}(k)\right| = \left|\frac{A_{13}(k) + A_{12}(k)}{A_{23}(k)}\right| << 1 \qquad \text{Equation 15A}$$

$$rOCL(k, n) \approx \varepsilon_3(n) + \tilde{f}(k)\varepsilon_1(n)$$

Equation 15A shows that the measured rOVL per pixel can be separated into the OVL between the top layers and a term that depends on the bottom layer offset. In the latter term the variables may be separated into a momentum dependency and a bottom layer offset. It is assumed that the first term does not depend on the site while the second term does not depend on momentum. Systems expressed in Equation 15A may be solved using WIPO Publication No. PCT/US14/52670, discussed above.

The following examples illustrate disclosed method 100D in simple non-limiting cases of four cells with three layers and of a target design with three cells.

In the non-limiting example of four cells (1 . . . 4) with three layers (1 . . . 3) it is assumed that the periodic structures in layer 2 have zero offsets in all cells; the periodic structures in layer 1: cells 1 and 2 have offsets +$f_1$ while cells 3 and 4 have offsets −$f_1$ and all cells have an uncontrolled shift of $\delta_2$; and the periodic structures in layer 3: cells 1 and 3 have offsets +$f_3$ while cells 2 and 4 have offsets −$f_3$ and all cells have an uncontrolled shift of $\delta_3$—as summarized in Table 1.

TABLE 1

Assumptions for the example.

| Cell | Offset 1 | Offset 2 | Offset 3 |
|---|---|---|---|
| 1 | $\delta_2 + f_1$ | 0 | $\delta_3 + f_3$ |
| 2 | $\delta_2 + f_1$ | 0 | $\delta_3 - f_3$ |
| 3 | $\delta_2 - f_1$ | 0 | $\delta_3 - f_3$ |
| 4 | $\delta_2 - f_1$ | 0 | $\delta_3 - f_3$ |

The standard OVL algorithm applied on differential signals from cells 1 and 2, and from cells 3 and 4, gives the expressions of Equations 16A, followed by the derivation of $\tilde{f}$:

$$rOVL_{12}(k) \approx \delta_3 - \tilde{f}(k)(\delta_2 + f_1) \qquad \text{Equations 16A}$$

$$rOVL_{34}(k) \approx \delta_3 - \tilde{f}(k)(\delta_2 - f_1)$$

$$\tilde{f}(k) = \frac{rOVL_{12}(k) - rOVL_{34}(k)}{-2f_1}$$

Equation 17A presents the case that the vector $OVL_n$ is projected on $\tilde{f}$, which is exactly the first layer shift (with a negative sign).

$$\left\langle \sum_k \frac{rOVL_n(k) - \langle rOVL_n(k)\rangle}{\tilde{f}(k) - \langle \tilde{f}(k)\rangle} \right\rangle = \qquad \text{Equation 17A}$$

$$-\left\langle \sum_k \frac{\varepsilon_3(n) - \tilde{f}(k)\varepsilon_1(n) - \langle \varepsilon_3(n) - \tilde{f}(k)\varepsilon_1(n)\rangle}{\tilde{f}(k) - \langle \tilde{f}(k)\rangle} \right\rangle =$$

$$\left\langle \sum_k \frac{\varepsilon_3(n) - \langle \varepsilon_3(n)\rangle}{\tilde{f}(k) - \langle \tilde{f}(k)\rangle} - \sum_k \frac{\tilde{f}(k)\varepsilon_1(n) - \langle \tilde{f}(k)\varepsilon_1(n)\rangle}{\tilde{f}(k) - \langle \tilde{f}(k)\rangle} \right\rangle =$$

$$-\varepsilon_1(n)$$

In the non-limiting example of three cells, e.g., looking at cells 1, 2 and 3 of the previous example (Table 1), the standard OVL algorithm applied on the differential signals from cells 1, 2 and from cells 1, 3 (reversing the roles of the layers in the algorithm, which results in an inversion of $\tilde{f}$, see Equation 15 for details) gives the expressions of Equations 16B, followed by the derivation of $\tilde{f}$:

$$rOVL_{12}(k) \approx \delta_3 - \tilde{f}(k)(\delta_2 + f_1) \qquad \text{Equations 16B}$$

$$rOVL_{34}(k) \approx \delta_2 \frac{1}{\tilde{f}(k)}(\delta_3 + f_3)$$

$$\tilde{f}(k) = -\frac{rOVL_{12}(k) + f_3}{rOCL_{13}(k) + f_1}$$

Equation 17B presents the projection of the vector $OVL_n$ on $\tilde{f}$. As the offsets $f_1$ and $f_3$ are known (predetermined), both OVLs can be extracted.

$$\left\langle \tilde{f} \mid rOVL_{12}\right\rangle = \delta_2 + f_1, \left\langle \frac{1}{\tilde{f}} \mid rOVL_{13}\right\rangle = \delta_3 + f_3. \qquad \text{Equations 17B}$$

Table 1 and Equations 16A, 16B, 17A, 17B may be extended to any number of layers N>3.

$\tilde{f}(k)$ may be obtained from actual measurements by any of the following options. (i) $\tilde{f}(k)$ may be extracted from simulations or by measurements at different conditions and assuming consistency, as described in WIPO Publication No. PCT/US14/52670, discussed above. (ii) Subsampling may be measured across the wafers at dedicated (multilayer) targets positioned next to standard targets and the matching between the targets may be optimized as illustrated in the examples above (Equations 16A-B and 17A-B). The calibration may be applied to the full sampling or to the next wafers. Alternatively or complementarily, the differential signal analysis (methods 100B, 100C) may be applied to the calibration targets. (iii) Subsampling may be measured across the wafers at dedicated targets positioned next to external reference targets and the matching between the targets may be optimized. The calibration may be applied to the full sampling or to the next wafers. (iv) A principal-component analysis (PCA) may be performed on the subsamples to give the relative measure of $\tilde{f}(k)$, and the absolute value can be calculated since the OVL is obtained from the multi-cell targets, as described above.

Returning to FIG. 1B, certain embodiments of method 100D may combine the use of methods 100B and 100C. For example, two-cell targets 300 may be printed on the wafer, together with a smaller number of (dedicated, calibration) multi-cell targets 200 (i.e., targets having three cells or more). Multi-cell targets 200 may be sampled in order to obtain the $\tilde{f}(k)$ function, either by the overlay decomposition method, or by inspecting the resulting differential signals and obtaining $\tilde{f}(k)$ from differential signal analysis method 100B. Once $\tilde{f}(k)$ is obtained, the OVL values may be calculated from the reported OVL of two-cell target(s) 300 using Equation 16C, similar to Equations 16A and 16B.

$$\delta_2 = \left\langle \tilde{f}(k) \mid rOVL(n,k)\right\rangle_k - f_1(n)$$

$$\delta_3 = \left\langle rOVL(n,k)\right\rangle_k - f_1(n) - \delta_2(n) - f_3(n) \qquad \text{Equation 16C}$$

It is noted that the assumption of three periodic structures (gratings) is a non-limiting one, presented here for simplification purposes only. In case of two (or more) measurement directions, respective periodic structures may be added. In order to conserve wafer real-estate, calibration of multi-cell targets 200 may be relatively few while measurements of two-cell targets 300 may be carried out using the calibration derived therefrom.

More specifically, by studying the OVL distribution across the pupil in a linearity array of the bottom grating, $\hat{f}(k)$ may be extracted (for example—using principal component analysis). For all other sites on the wafer the "OVL" can be separated into $OVL_{23}$ ("common to all pixels") and $OVL_{12}$ ("per pixel inaccuracy"), as shown in Equations 18, generalizing on the examples above.

$$\begin{cases} \varepsilon_1(n) = \langle \hat{f}(k) | rOVL(n,k) \rangle_k \\ \varepsilon_2(n) = 0 \\ \varepsilon_3(n) = \langle rOVL(n,k) \rangle_k - \varepsilon_1(n) \end{cases} \quad \text{Equation 18}$$

This enables dedicated multi-layered target measurements using two cells (of three layers).

Respective metrology measurements of any of targets 290, 201, 200, 300 are also considered part of the present disclosure.

Figure 4:
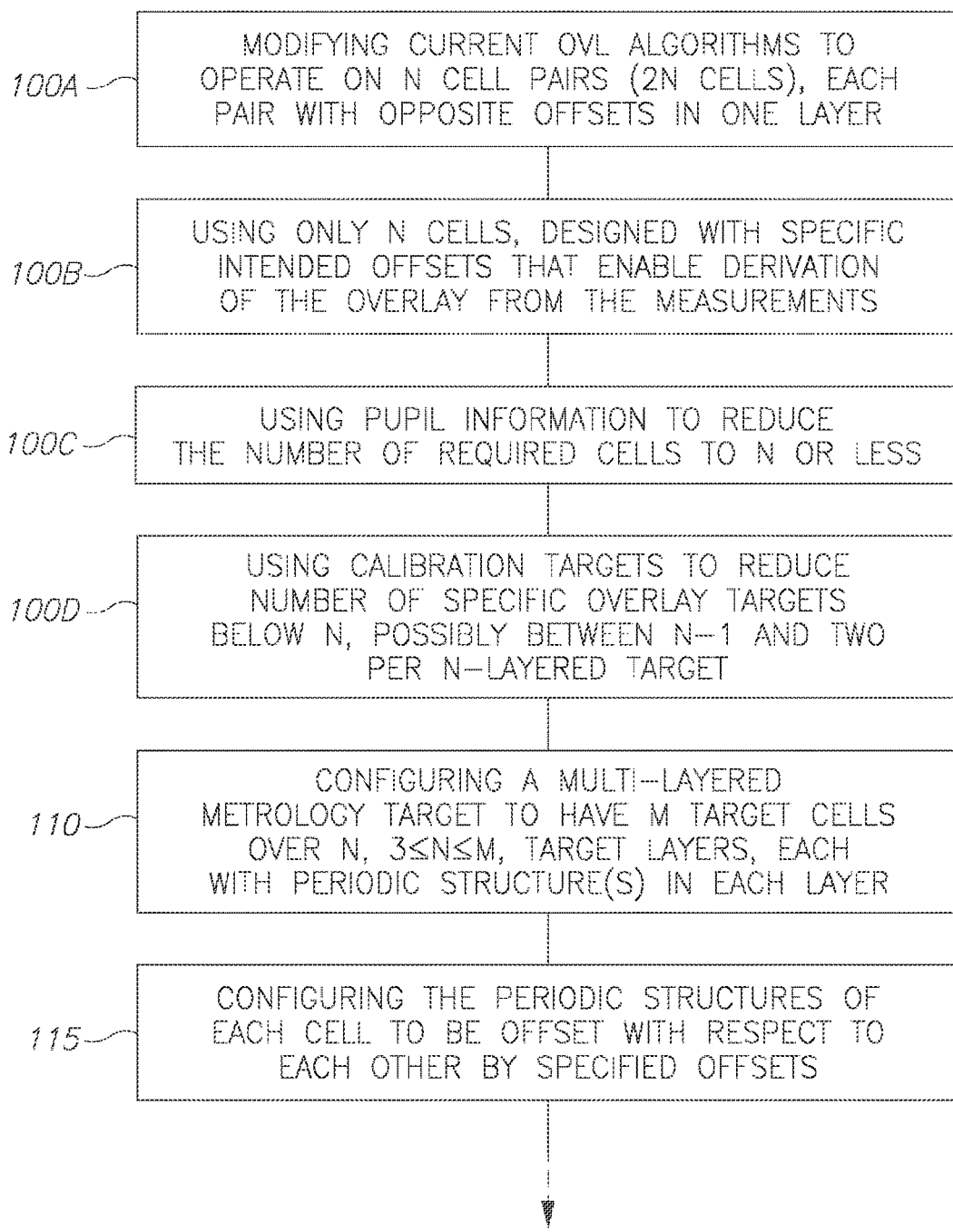
FIG. 4 is a high level flowchart illustrating method, according to some embodiments of the invention.

FIG. 4 is a high level flowchart illustrating method 100, according to some embodiments of the invention. Method 100 may be carried out at least partially by at least one computer processor. Computer program products and corresponding metrology modules are provided, which comprise a computer readable storage medium having computer readable program embodied therewith and configured to carry out method 100 at least partially. Target design files as well as metrology measurements of the targets are also provided.

Method 100 may comprise any of the following, separate or combined: modifying current OVL algorithms to operate on N cell pairs (2N cells), each pair with opposite offsets in one layer (method 100A) (e.g., each target with two periodic layers configured to measure overlays between respective layers); using only N cells, designed with specific intended offsets that enable derivation of the overlay of the measurements (method 100B); using pupil information to reduce the number of required cells to N−1 (method 100C), and using calibration targets to reduce the number of specific overlay targets below N−1, possibly down to 2 per N-layered target (method 100D).

Method 100 may comprise configuring a multi-layered metrology target to have a plurality, M, of target cells over at least three, N≤M, target layers, each cell having at least one periodic structure in each layer (stage 110) and configuring the periodic structures of each cell to be offset with respect to each other by specified offsets (stage 115). Method 100 may comprise measuring, scatterometrically, at least M differential signals from the multi-layered metrology target (stage 120), and calculating SCOL metrology parameters from the M measurements of the multi-layered metrology target by solving a set of M equations that relate the SCOL metrology parameters to the differential signals and to the specified offsets (stage 130). The SCOL metrology parameters may be overlays between the N layers. Calculating 130 of the SCOL metrology parameters may be carried out sequentially for consecutive layers (stage 132), e.g., as in first variant 100B of method 100 described above. For example, the SCOL metrology parameters may be overlays between the N layers, and calculating 130 may be carried out according to Equations 2-4. Alternatively or complementarily, calculating 130 of the SCOL metrology parameters may be carried out simultaneously for the layers (stage 135), e.g., as in second variant 100C of method 100 described above, by carrying out the measuring at a pupil plane with respect to the target (stage 137) and using measurements of a plurality of pixel positions at the pupil plane (stage 138). For example, the SCOL metrology parameters may be overlays between the N layers, and calculating 130 may be carried out according to Equations 7-9B. In a non-limiting example, N=3, the SCOL metrology parameters are overlays between the three layers, and calculating 130 may be carried out according to Equation 15.

Certain embodiments comprise multi-layered metrology targets having a plurality of target cells over at least three target layers, each cell having at least one periodic structure in each layer, with the periodic structures of each cell being offset with respect to each other by specified offsets. The targets may provide SCOL measurements which are likewise part of the present disclosure.

Method 100 provides multiple novel aspects, such as: The measurement of SCOL targets with more than two overlapping parallel gratings with minimal inaccuracy penalty; Combination of two-cell and multiple-cell targets sampling for accurate measurements of multiple overlapping grating targets; Targets and measurement methods which follow all in-die device layout restrictions including lateral and vertical constrains with no inaccuracy penalty; Multi-cell multi-grating targets and measurement methods for improved throughput and\or real estate; Target design optimization based on simulations taking into account all process and lithography steps and resultant patterns, rather than only the two specific desired layers; Optimization of all layer patterns based on an analytic model—the model predicts the optimal optical properties minimizing undesired contributions to the signal; Use of information across the pupil such as reflectivity, differential signals and\or overlay in order to get the accurate overlay per layer; and the combination of the aforementioned per-pixel response with multi-cell overlay calculation in order to obtain a calibration for the standard algorithm such that the desired overlay can be obtained from a two-cell target.

Quasiperiodic Targets

In the following, examples of quasiperiodic SCOL targets are presented, which are more similar to device patterns and are periodic at predefined scales, but are not lattices. This means that the full structure cannot be divided into smaller identical structures (unit cells). It is noted below, that actual device patterns may also, under certain circumstances which are described below, considered quasiperiodic SCOL targets, and as shown below, do not have to include the intended shifts. Hence the following disclosure enables measuring overlay of certain device designs directly, in spite of their non-periodicity.

FIGS. 5A-5D and 6A-6F are high level schematic illustrations of quasiperiodic SCOL targets 400, according to some embodiments of the invention. Targets 400 exemplify targets which fulfill the requirements of various OVL/alignment techniques (e.g., SCOL, AIM, scanner alignment marks) for periodic targets, yet are not periodic in the sense that targets 400 do not have a unit cell. While targets 400 have no repeating unit cell, the Fourier transform of targets 400 does reveal periodicity at some defined length scales corresponding to an effective target pitch at an additional length scale, which may be much bigger than the actual fine scale pitch. In the analysis of the measurements of targets 400, the random parts which break the translation symmetry may be treated as "noise" and may be averaged out using measurements of large areas or using multiple measurements of different target areas. Alternatively or additionally, measurement conditions may be chosen to minimize the contribution of translation-variant features, or their contribution may be eliminated using sophisticated signal analysis, target design and\or hardware, as exemplified below. Respective metrology measurements of targets 400 are also considered part of the present disclosure.

In FIG. 5A, target 400 is illustrated schematically using a basic pattern of horizontal and vertical lines to indicate the quasi-periodic nature of target 400 (X and Y axes illustrate two measurement axes, the periodicity along the Y axis may correspond to the pitch in standard SCOL targets). It is noted that in the details, elements 410-410F etc. of which target 400 is composed, each includes gaps and cuts which modify the elements and target 400 as a whole from being a regular grid, making target 400 grid-based but incorporating multiple irregularities that are derived from device patterns as illustrated in FIGS. 5B and 5C in an exemplary manner. FIGS. 6A-6F further elaborate on this aspect by denoting target 400 as being made of blocks 410A-410F etc. (FIG. 6A) which are designed as schematic representations or abstractions of device patterns (FIGS. 6B-6E) and may be combined to form quasi-periodic targets 400 (FIG. 6F). It is emphasized that all block designs are based on a similar periodicity that is represented by the respective grids, yet include multiple irregularities or aberrations from the grid symmetry, which overall yield quasi-periodic target 400.

FIG. 5B is a high level schematic illustration of a simplified device layout 420 (e.g., a NAND gate layout) as a basis for pattern 410A exemplified in FIG. 5C. Pattern 410A comprises specified features, e.g., features that may be derived from device layout 420 by further simplification, such as maintaining rows 411 from device layout 420 and using various types of cuts 412 (analogous to metal lines connecting the rows in the actual device layout) to yield pattern 410A as well as alternative patterns such as pattern 410E illustrated in FIG. 5D. FIG. 5A schematically illustrates a combination of a plurality of patterns denoted by 410A, 410B, 410C, 410D, 410E, 410F etc. which may likewise be variations on the dimensions of pattern 410A and/or on the configuration of cuts 412 in it. Target 400 may thus be described as superposition of repeating unit cell and varying cuts, and/or may be designed to lack a defined repeating unit cell altogether. Different cuts in patterns 410A-F may be selected to represent different logic gates. The illustrated design may be provided for one or more layers of target 400. It is noted that the illustrated lines and cuts may be the result of multiple lithography steps (e.g., possibly creating the lines with pitch multiplication processes) and then possibly multiple applications of cuts. The patterns may however also be carried out in a single lithography step. The illustrated lines and cuts serve to provide a non-limiting example for specified features of the patterns, and may be replaced with other features with respect to device design.

Figure 6A:
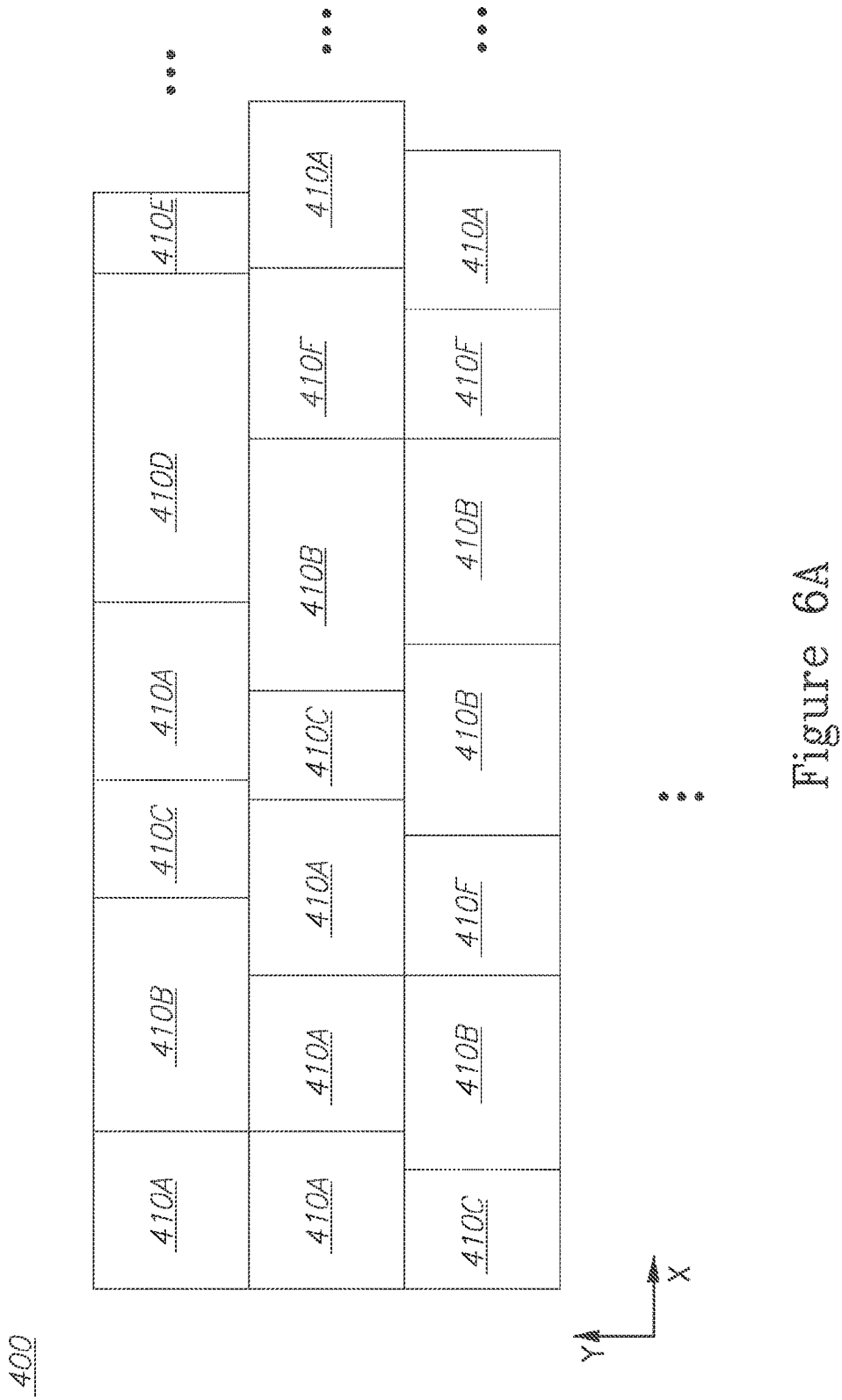

FIG. 6A schematically illustrates targets 400 as quasi-periodic in the sense that they exhibit periodicity along the Y axis that results from the general organization of the wafer (Y direction periodicity, possibly in the order of magnitude of the pitches of prior art targets) and a regularity along the X axis which results from the design principles of the wafer yet is not strictly periodic as designs 410A-410F etc. may not be periodic, and designs 410A-410F etc. may be alternated non-periodically. An evaluation of the degree of irregularity in the design of target 400 is presented below, and shown to still enable derivation of metrology signals and metrology parameters while taking into account the deviations introduced by the irregularities.

An important and surprising insight the inventors gain from the disclosed analysis is that devices and device sections may also be considered as quasi-periodic targets 400 and hence directly measured using metrology techniques and algorithms presented herein, under consideration of the effects introduced by their "irregularities" as considered with respect to strict periodicity.

Figure 6C:
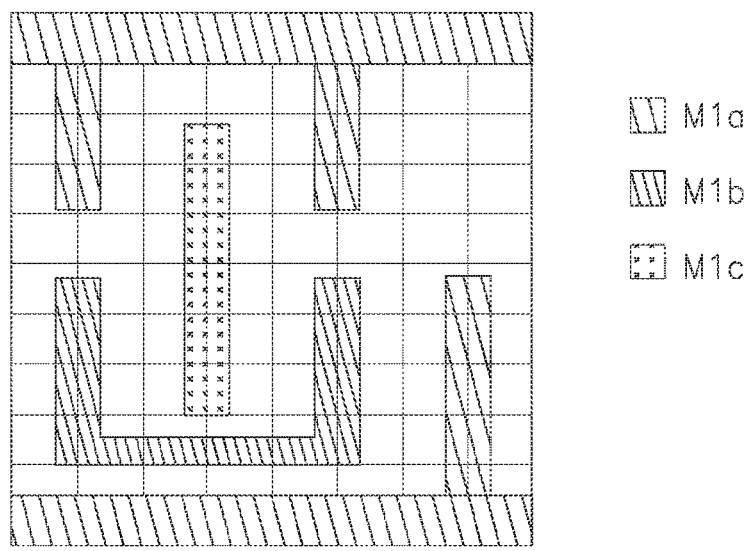
Figure 6H:
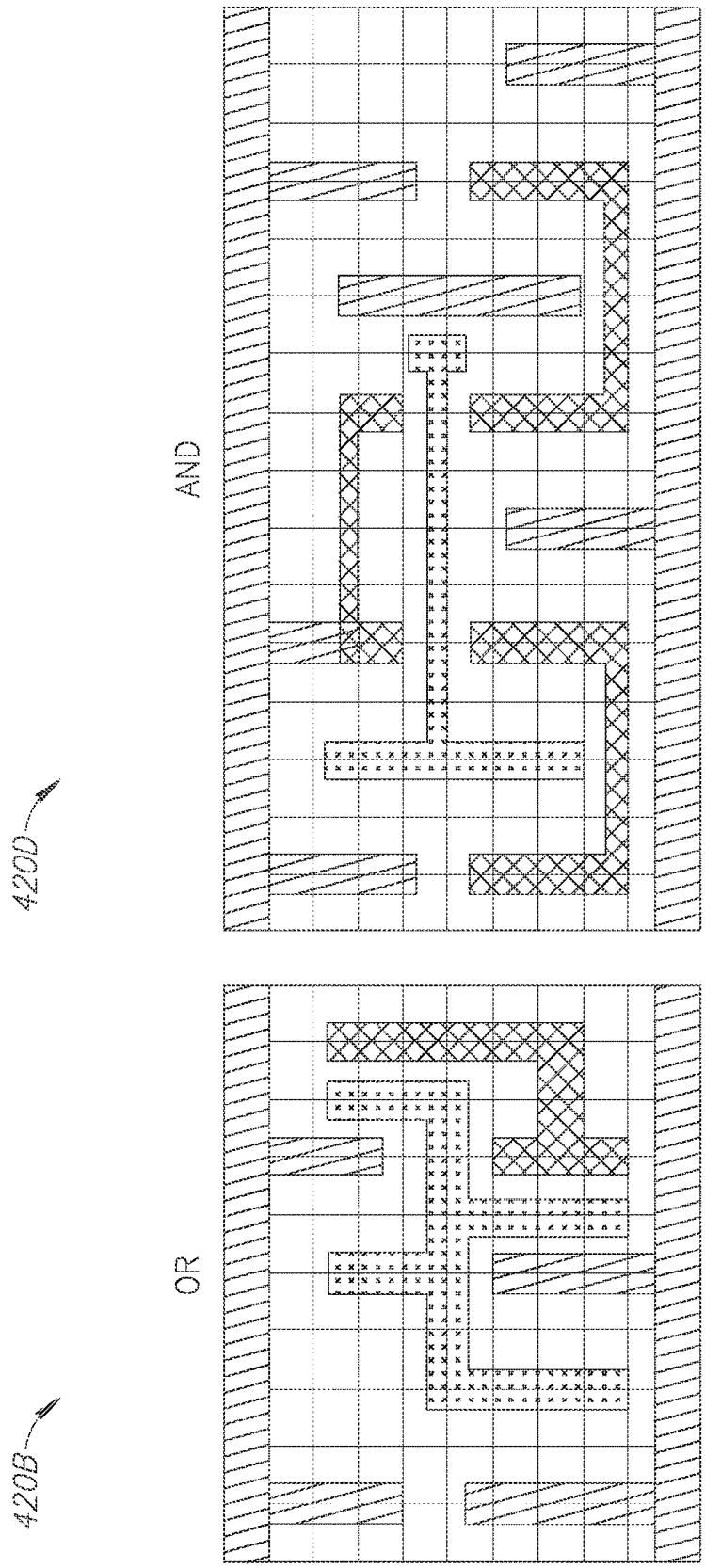
Figure 6F:
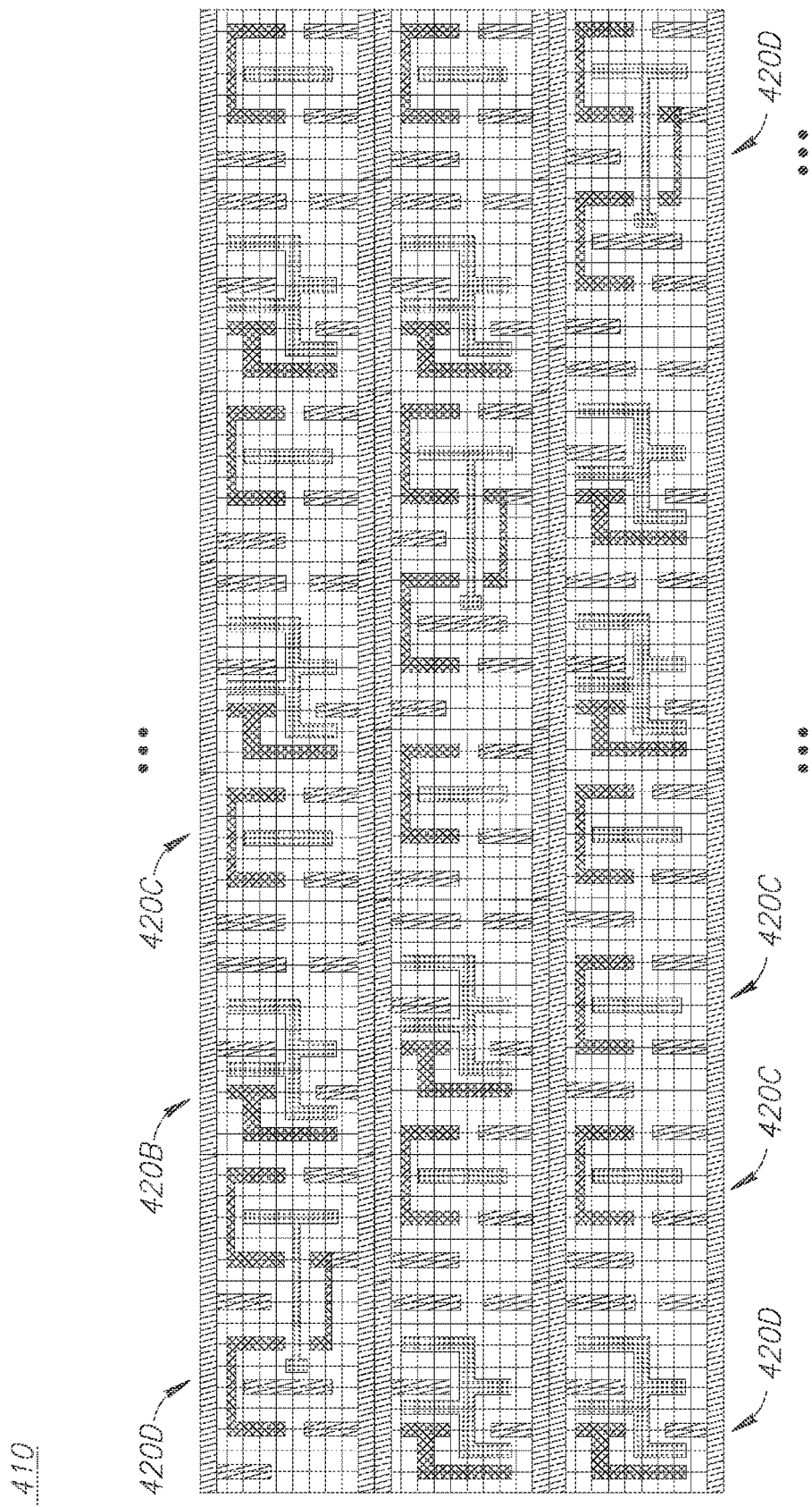

FIG. 6B schematically illustrates schemes 420B, 420C that represent schematic layouts of NAND and NOT gates respectively (the background grid serves merely to illustrate the periodicity of the pattern and is not an actual part of the pattern). In this exemplary process the M1 pattern is produced using three lithography steps (denoted LELELE with L standing for a lithography step and E standing for an etch step, the three steps applied to the same physical layer) to give the corresponding M1a, M1b and M1c. FIG. 6C schematically illustrates only the M1 pattern which is common to 420B and 420C. Pattern 410C that may be used to represent designs 420B, 420C in target 400. FIG. 6D schematically illustrates schemes 420D, 420E that represent schematic layouts of OR and AND gates respectively and FIG. 6E schematically illustrates corresponding M1 patterns 410B, 410D that may be used to represent designs 420D, 420E in target 400. Clearly, additional patterns may be used and integrated into target 400 according to various performance requirements and optimizations. It is noted that all illustrated designs 410A-410E illustrate the quasi-periodic nature of targets 400 which maintain a large degree of periodicity while introducing irregularities in the patterns that correspond to specific device designs. FIG. 6F schematically illustrates a combination of patterns 420B, 420C, 420D that yields quasi-periodic target 400 (the background grid serves merely to illustrate the periodicity of the target and is not an actual part of the target). It is noted that schemes 420A-E are used as a schematic adaptation of circuits such as those presented by U.S. Pat. No. 8,863,063 and they serve as non-limiting examples for possible schemes which may be used to derive corresponding patterns 410A-F and other patterns.

Figure 7A:
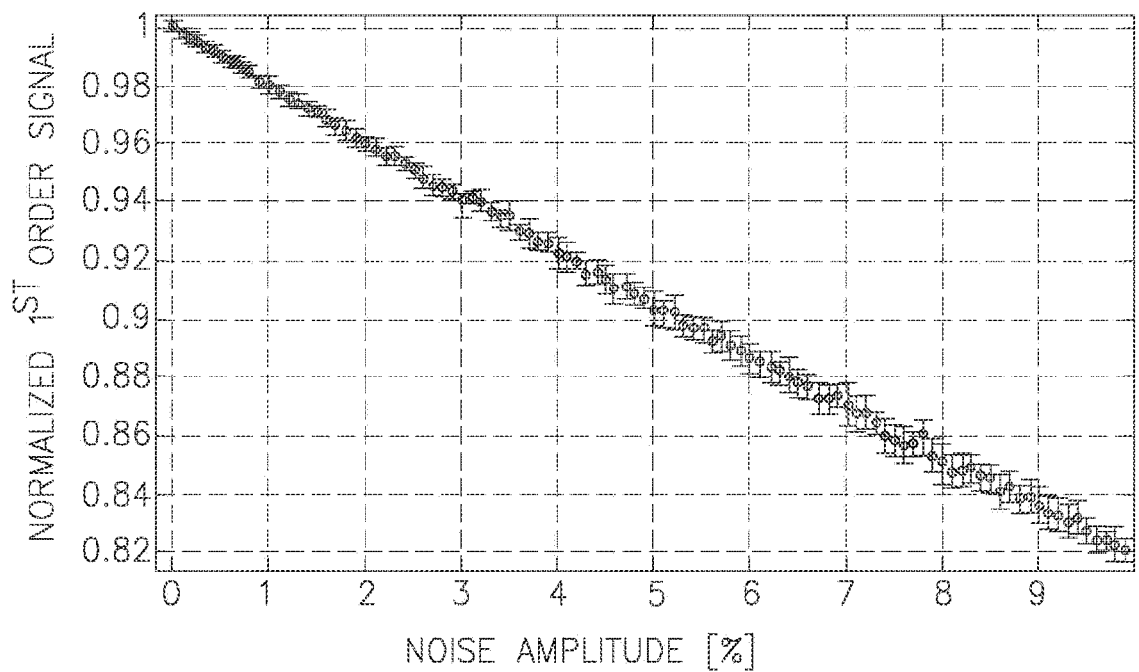
FIGS. 7A and 7B present simulation results of the effect of the noise introduced by the non-periodic target design on the first order amplitude, according to some embodiments of the invention.
Figure 7B:
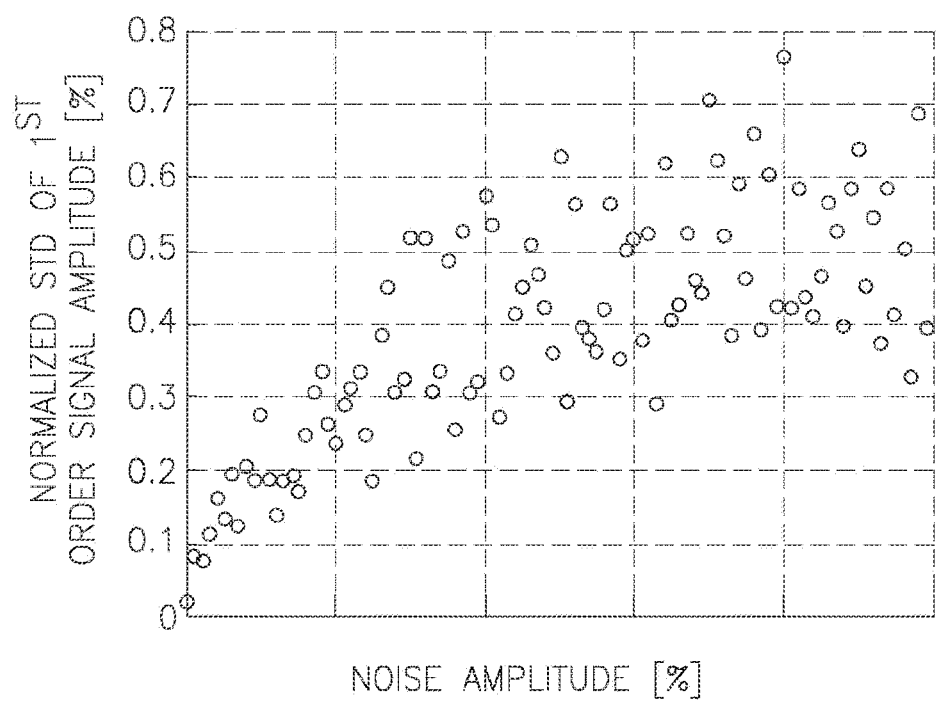

FIGS. 7A and 7B present simulation results of the effect of the noise introduced by the non-periodic target design on the first order amplitude, according to some embodiments of the invention. The noise represents irregularities in an essentially periodic structure, which was termed quasi-periodicity above. The following diagrams may be used to estimate to what extent the deviations from periodicity, which were exemplified in FIGS. 5A-5D and 6A-6F, degrade the metrology signals derived from target 400. The pupil plane signal (amplitude) of a grating with irregularities was calculated using Fraunhofer approximation. In OVL measurement, modification dS in the first order noise roughly changes the OVL by dS/A (A being the measurement sensitivity). Random noise was added to the grating in the form of locations in which the amplitude was modified to zero. The random noise may be understood to represent irregularities due to differences that arise from specific patterns 410A-410F. The calculation was repeated for several different illumination beam locations. The effect of the noise magnitude was calculated for the first diffraction order amplitude distribution as a function of beam location. In FIG. 7A the error bars indicate the standard deviation of ten different beam locations. All values are normalized with respect to the unperturbed intensity. FIG. 7B shows explicitly the variability between the first order intensity when different locations were sampled (corresponding to the error bars of FIG. 7A).

Different spatial distributions of the noisy points create an uncertainty of ca. 0.3% in the amplitude for a noise magnitude of 2%. FIGS. 7A and 7B illustrate that the deviation from strict periodicity result in a controllable noise that represents the irregularities in the target design, and may be taken into account as an inaccuracy factor when deriving metrology results from targets 400. Moreover, FIGS. 7A and 7B provide tools for handling noise due to irregularities in target structures, or in device designs which are used as targets, as suggested below.

This inaccuracy may be treated either algorithmically (for example using known symmetry properties of the signal) or by selecting measurement points which cancel out the symmetry breaking. The latter can be done for example by automatic analysis of the reticle.

Certain embodiments comprise metrology targets 400 having irregularly repeating units 410A-F along at least one direction of target 400 (possibly two perpendicular directions), wherein the units comprise device-like patterns having one or more (different) sets of lines and cuts, which are derived from respective device designs. For example, unit lengths, characteristics of lines in the unit and/or characteristics of cuts in the unit may be varied along the at least one direction of target 400. Target 400 may comprise two or more layers and may provide SCOL measurements which are likewise part of the present disclosure.

Filling Targets Gaps with Device Patterns

Complementary to using quasi-periodic targets, the following presents examples of SCOL targets with improved correlation to device patterns. Such targets overcome prior art different reaction of different pattern properties in the presence of the same process conditions and the effects of the patterns themselves on the process (for example—microloading effect in dry etching). Clearly the presented SCOL targets with improved correlation to device patterns may be used independently of the quasi-periodic targets disclosed above.

In standard OVL targets, the designers focus on the features to be measured and apply segmentation, OPC (optical proximity correction) and SRAF (sub-resolution assist features) to mimic the device behavior. However, a big portion of the target area, namely the area surrounding the target features, the area between the features and the area in additional layers which are not part of the OVL layers—is often not taken into account during the design of the target. Sometimes parts of these areas are segmented or filled with dummy patterns, which often, however, have poor correlation to the device pattern and therefore may not help or even damage the measurements.

The proposed targets improve the correlation of overlay measurement to the actual device overlay error and reduce the differences between measurements on the target and the device properties. A source of the difference in overlay between target and the device is related to the surrounding in the vicinity of the target which is different than the surrounding in the vicinity of the actual performing device structures. In order to improve the correlation, it is herein proposed that similar device-like surrounding would surround each of the elements of the target. Concepts that enable such target design and surrounding are presented below.

For example, all gaps within and around the targets and the target elements may be filled with device patterns, which are selected considering, e.g., (i) the pattern density (to provide sufficient metrology sensitivity while maintaining the average density similar to the device's pattern density), (ii) the similarity to the respective device(s) (particularly when specific device patterns are identified as being critical for monitoring/control) and (iii) the pattern average aspect ratio (as an important process parameter). Metrology and process simulations may be used to select the proper device pattern. Since the device patterns may be unresolved using optical metrology, the selected patterns must not be strictly symmetrical, as standard metrology target features are selected to be. For example, device patterns may comprise actual or simplified device layouts, such as those demonstrated schematically in FIGS. 5B-5D and 6B-6F.

Figure 8A:
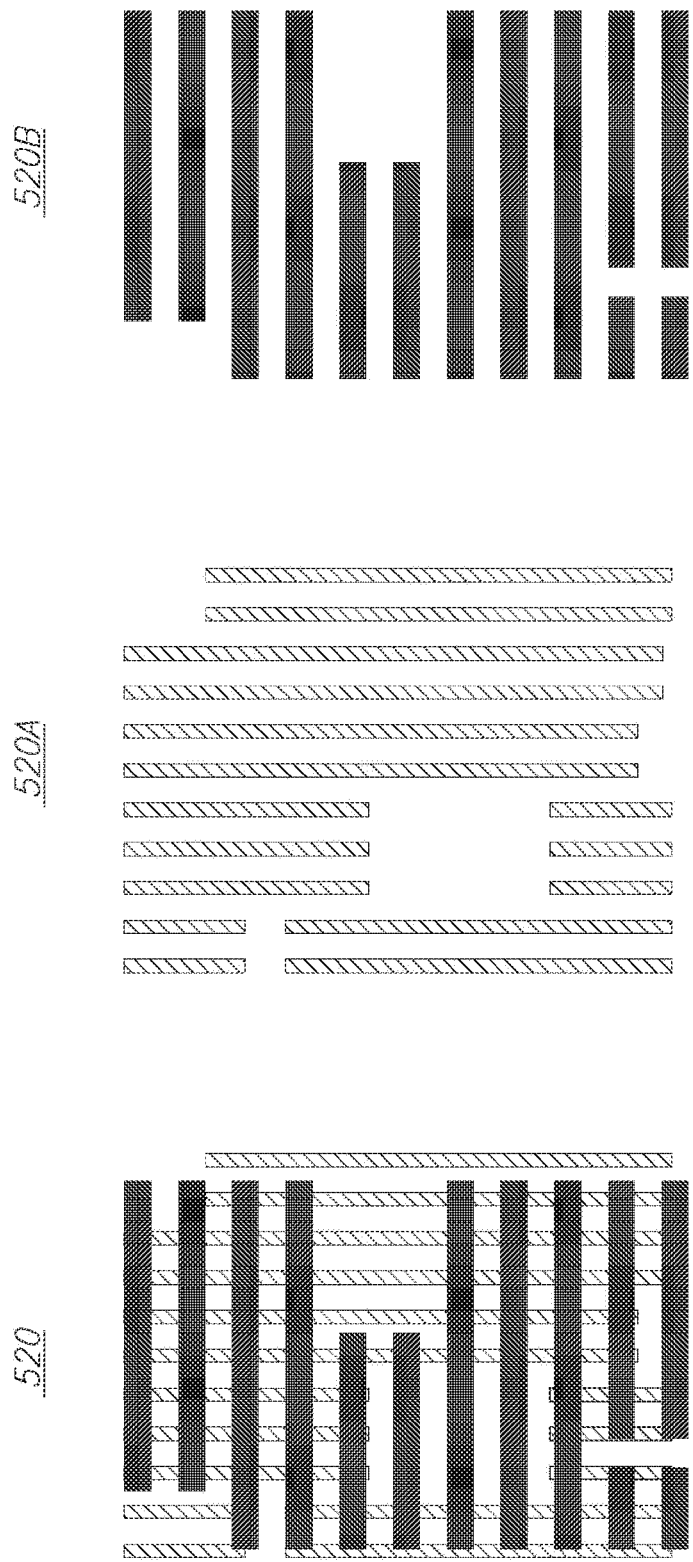
FIGS. 8A-8E are high level schematic illustrations of SCOL targets with improved correlation to device patterns, according to some embodiments of the invention.
Figure 8B:
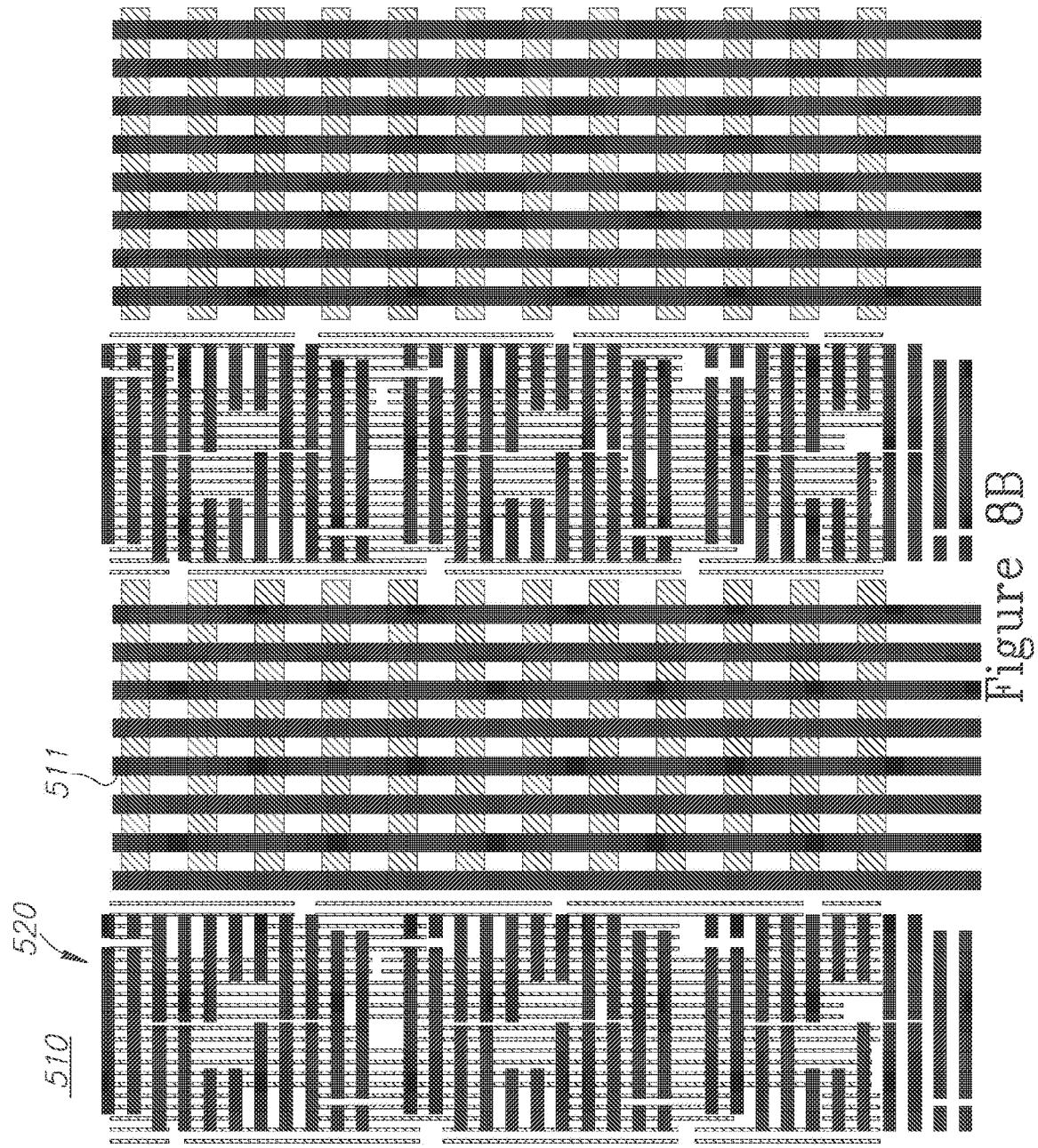
Figure 8C:
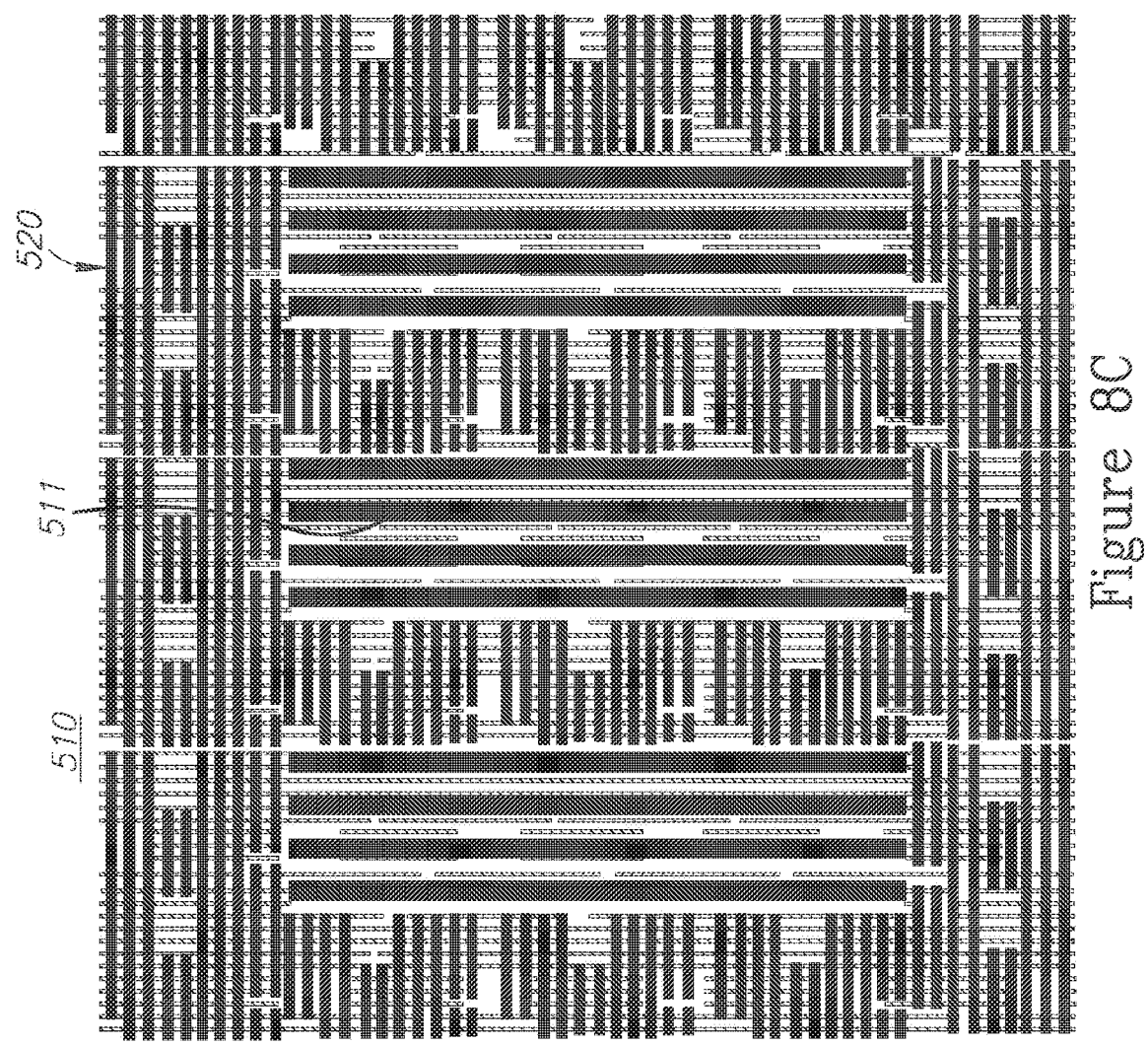
Figure 8D:
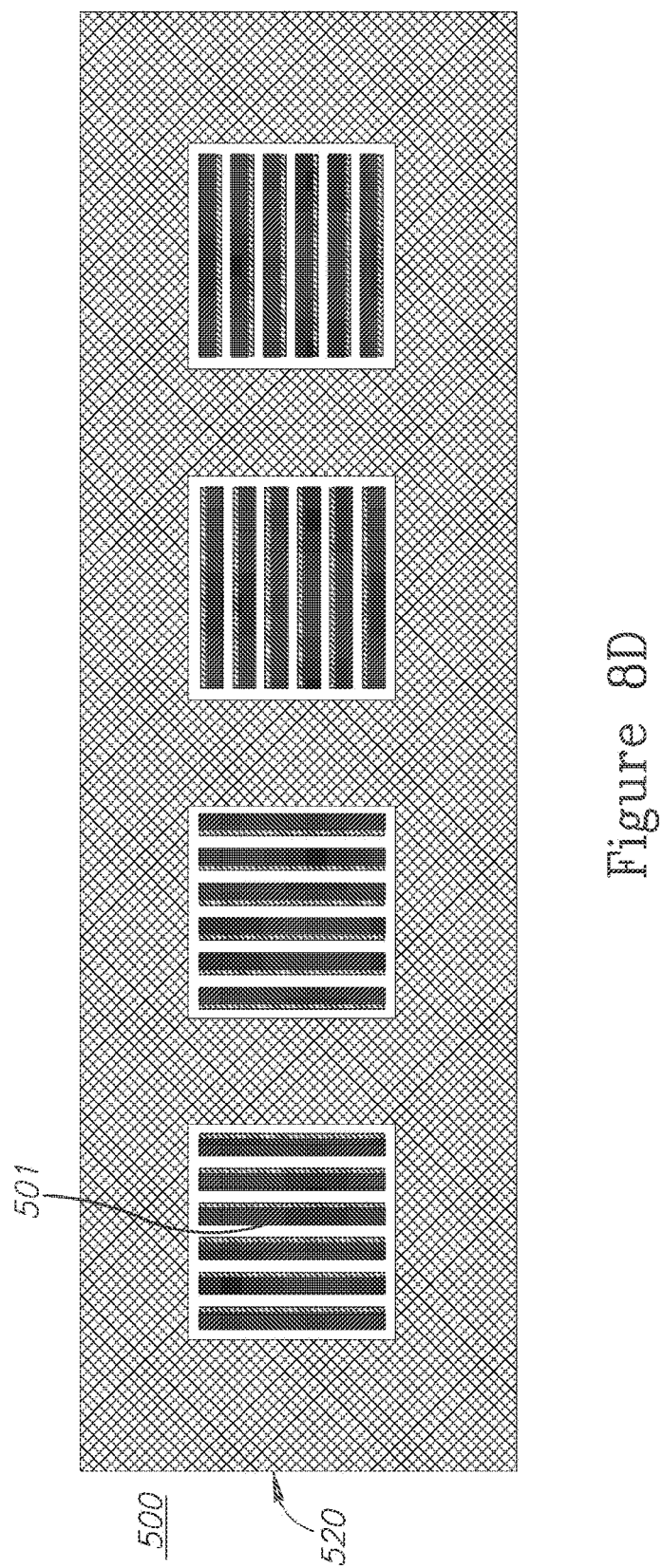
Figure 8E:
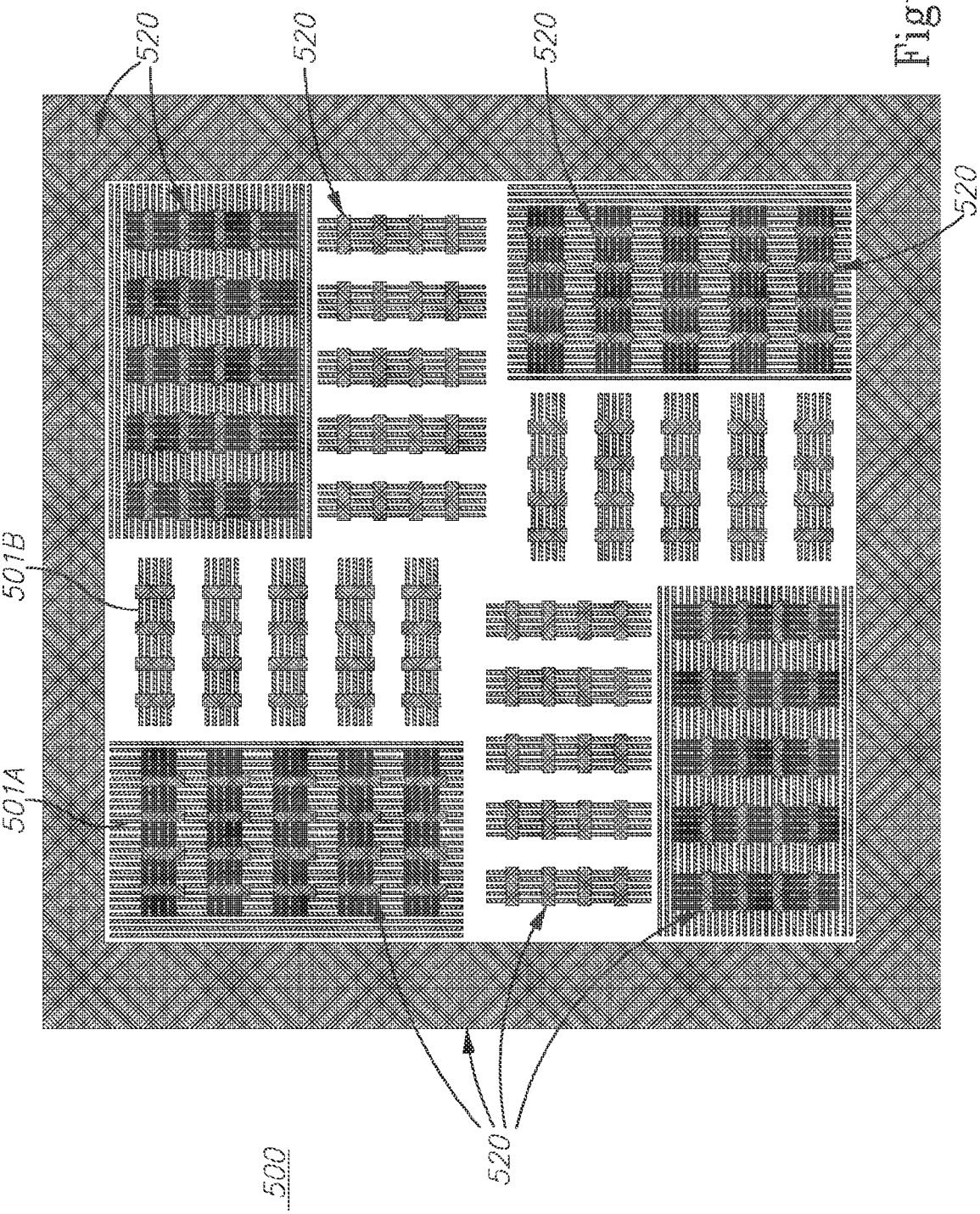

FIGS. 8A-8E are high level schematic illustrations of SCOL targets 500 with improved correlation to device patterns, according to some embodiments of the invention. FIG. 8A schematically illustrates an extraction of a filling pattern 520, composed in the illustrated non-limiting example from patterns 520A, 520B at a previous layer and at a current layer, respectively. Pattern 520 may be derived from a device pattern, e.g., similarly to the derivation described above (FIG. 5B), or in any other way that expresses device pattern features. Multiple different patterns 520 may be used in the following, in a regular or in an irregular manner. FIGS. 8B and 8C schematically illustrate sections 510 of SCOL target 500 and of imaging target 500 (respectively) having target elements 510 such as periodic structures, and pattern(s) 520 filling regions between target elements 510. FIGS. 8D and 8E schematically illustrate overviews of SCOL target 500 and of imaging target 500 (respectively) that illustrate the use of filling pattern 520 around target elements 501 as well as in sub-regions of target 500 within elements 501A, 501B of target 500, at the previous and/or at the current layers. Filling pattern 520 may be used at any region or sub-region of targets 500, including sub-regions which are left free in FIGS. 8D and 8E (for clarity reasons). Embedded device-like structures within the target and between the cells of targets 500 may be selected to mimic device surrounding and may be measured using either scatterometry or imaging techniques. Embedded device-like structures and patterns may even, in certain cases, be introduced between elements of periodic structures of the targets, to the extent that the resulting deterioration of the measured signal is kept within predefined bounds.

Certain embodiments comprise metrology targets 500 having a plurality of periodic structures 511 and regions between the periodic structures which are at least partially filled by at least one device-like pattern 520 derived from a respective at least one device design. Sub-regions between elements of the periodic structures may be at least partially filled by at least one device-like pattern 520. Targets 500 may comprise two or more layers and may provide SCOL measurements which are likewise part of the present disclosure.

Symmetry properties of the patterns that are used in the targets may be utilized in order to estimate and improve the signals received therefrom. For example, patterns may be selected to enhance overlays due to breaking of pattern symmetry by them, or signal symmetry properties may be utilized to indicate specific inaccuracies.

Figure 9:
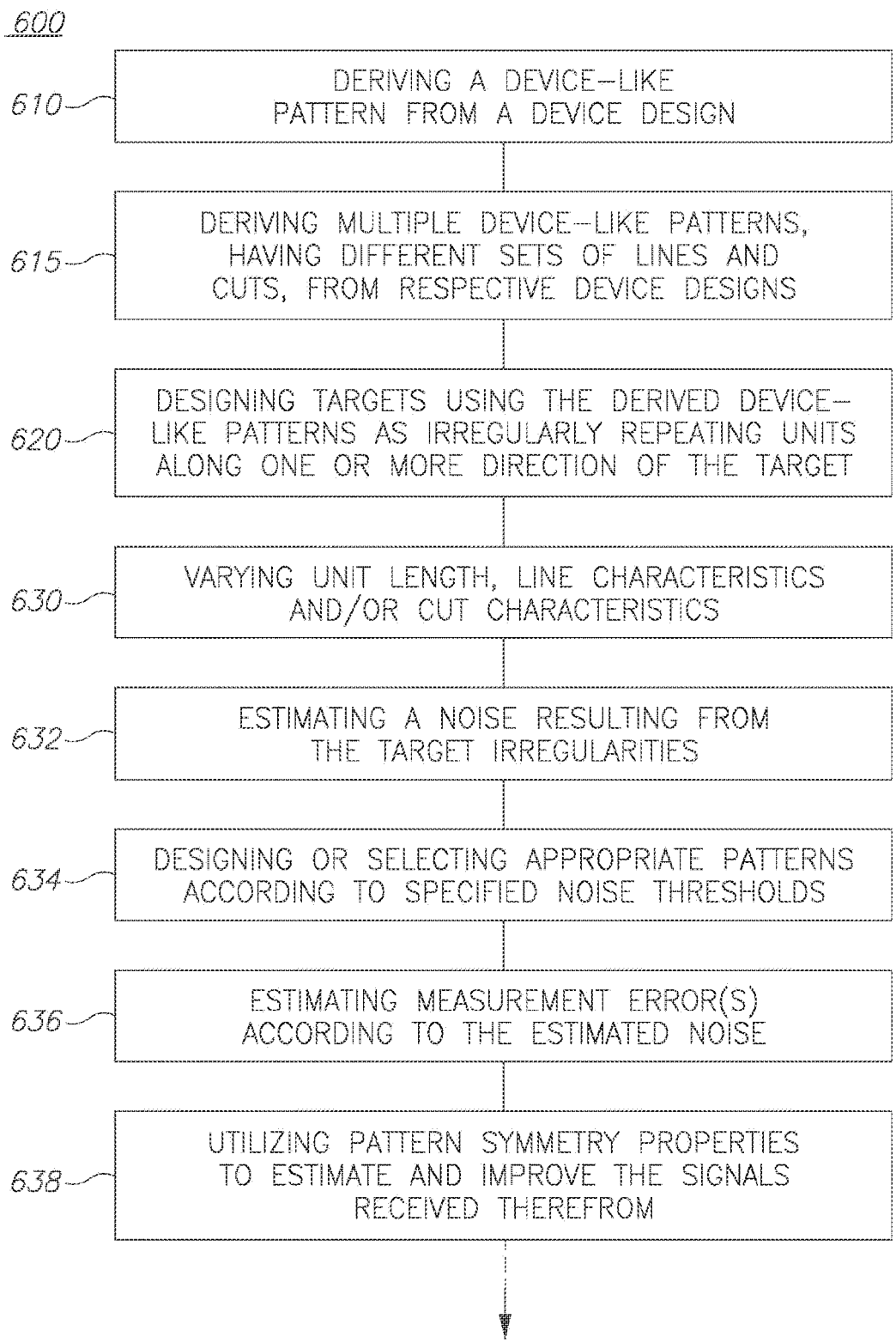
FIG. 9 is a high level flowchart illustrating method, according to some embodiments of the invention.

FIG. 9 is a high level flowchart illustrating method 600, according to some embodiments of the invention. Method 600 may be carried out at least partially by at least one computer processor. Computer program products and corresponding metrology modules are provided, which comprise a computer readable storage medium having computer readable program embodied therewith and configured to carry out method 600 at least partially. Target design files as well as metrology measurements of the targets are also provided.

Method 600 may comprise deriving a plurality of device-like patterns from a respective plurality of device designs, wherein device-like patterns comprise different sets of lines and cuts as exemplary specified pattern features (stage 615), and designing a metrology target using the derived device-like patterns as irregularly repeating units along at least one direction of the target (stage 620).

Method 600 may comprise varying along the at least one direction of the target at least one of: a unit length, characteristics of lines in the unit and characteristics of cuts in the unit (stage 630). The at least one direction may comprise two perpendicular directions of the target. The target may comprise at least two layers. Method 600 may comprise estimating a noise resulting from the target irregularities (stage 632), being the deviations from strict periodicity, and designing or selecting appropriate patterns according to specified noise thresholds (stage 634). Method 600 may comprise estimating a measurement error according to the estimated noise (stage 636). Method 600 may comprise utilizing pattern symmetry properties to estimate and improve the signals received therefrom (stage 638), as explained above (e.g., by treating the estimated noise algorithmically, using known symmetry properties of the signal and/or by selecting measurement points which cancel out the symmetry breaking, e.g., by automatic analysis of the reticle).

Method 600 may comprise producing the designed metrology target (stage 650) and deriving a metrology signal from the produced metrology target (stage 660), with respect to the targets designed in stages 620 and/or 630.

Method 600 may comprise deriving 610 at least one device-like pattern from a respective at least one device design (stage 610), and designing a metrology target, comprising a plurality of periodic structures, to have regions between the periodic structures at least partially filled by the at least one device-like pattern (stage 640). Method 600 may comprise designing the metrology target to have sub-regions between elements of the periodic structures at least partially filled by the at least one device-like pattern (stage 645). The targets may comprise two or more layers. Method 600 may comprise producing the designed metrology target (stage 650) and deriving a metrology signal from the produced metrology target (stage 660), with respect to the targets designed in stages 640 and/or 645.

Avoiding Offsets in Device Targets

Returning to the basic SCOL assumption, it is assumed that the measured differential signal (intensity difference between the first and respective minus first order) can be written as in Equation 19, with is being an index for the target cell (or target site) and ε being the lateral offset between the two target periodic structures (e.g., gratings) in the measurement direction.

$$D(n)=A(n)\varepsilon(n) \qquad \text{Equation 19}$$

Since both the sensitivity A and the relative offset (or OVL) may change between targets, both parameters should be calculated per target, and thus two measurements with the same sensitivity and OVL are required. If the sensitivity does not change, the OVL can be calculated using Equation 20, but in reality this does not hold and using Equation 20 for OVL calculation results in big inaccuracy values.

$$OVL(n) = \frac{D(n)}{A} \qquad \text{Equation 20}$$

In order to create two informative measurements, predetermined offsets are applied by design. These offsets may damage the electrical properties of the device and therefore cannot be applied on real devices. Since for many OVL alignments there is only one critical direction, as illustrated schematically in FIGS. 10 and 11 below, offsets in the orthogonal direction may be applied without damaging the device and without affecting the final (after etch) pattern. In conventional SCOL algorithms, offsets in the orthogonal direction do not help recover the sensitivity because the device pattern is not symmetric for rotation of 90° and, as a consequence, the measurement of the sensitivity in this direction does not necessarily correlate with the desired sensitivity. In the following derivations, linear approximation for the differential signal is used for simplicity, in a non-limiting manner. It is explicitly stated, that all methods disclosed below are valid also using higher order approximations for the differential signal and such applications are considered part of the present disclosure. The following methods use orthogonal offsets information to derive metrology parameters such as overlay, using orthogonal diffraction orders of the same target which do not require any offsets and using orthogonal target(s) with a different design, having offsets in a non-critical direction, both options enabling potential use of actual devices as targets.

FIGS. 10 and 11 are high level schematic illustrations of device alignments 97, according to some embodiments of the invention. For example, FIGS. 10 and 11 may represent an alignment of contacts 711 to gates 712. FIGS. 10 and 11 schematically illustrate that the alignment along one direction (critical direction, denoted X) imposes much stricter overlay requirements (smaller OVL values) than the alignment along the perpendicular direction (non-critical direction, denoted Y). FIG. 11 also illustrates schematically the first diffraction order signals 98 in the pupil plane (pupil image, for an exemplary central illumination) of device 97, with +1 and −1 diffraction signals along the Y direction (the direction perpendicular to the critical direction) being similar to each other (and having rotational symmetry) while the +1 and −1 diffraction signals along the X direction (the critical direction) differ from each other, e.g., in intensity due to overlay symmetry breaking by elements 711.

In the following, the rotational symmetry along the non-critical measurement axis is utilized to enable measurement along the critical measurement axis without the present necessity to introduce designed offsets along the critical measurement axis.

FIG. 12 is a high level schematic illustration of leading diffraction orders along the non-critical and critical measurement directions, 715, 716 respectively, according to some embodiments of the invention. FIG. 12 illustrates a simplified model for a grating over grating at the two directions (represented as grating over grating model 725 and single grating model 726, as along the non-critical measurement directions the top grating is non-periodic, see FIG. 11). It is noted that the simplified model is presented for explanatory reasons, and does not limit the invention. Gratings 701, 703 are to represent any periodic structure, and equivalent models may be used for multi-layered periodic structures. Moreover, the measured structures may be metrology targets and/or actual devices. For example, model 725 may be seen as representing effectively two-dimensional periodic structures while models 726 may be seen as representing effectively one-dimensional periodic structures.

In model 725, the electric field on the collection pupil in the X direction is the interference between the two diffraction modes illustrated in FIG. 12 and represented in Equation 21. The notations are: F and $\theta_F$ representing the amplitude and the phase factors, respectively, which are related to the shape of the gratings 701, 703; T and R represent the amplitudes that are related to the intermediate layers (702) while $\theta_{m_1^t}$, $\theta_{m_1^r}$ are the respective phases. The grating pitch is P, while $\varepsilon_1$, $\varepsilon_2$ are the locations of the gratings. Responsive of incident illumination 71, the electric signal E is represented as the sum of component 75 reflected off upper grating 701 and component 76 reflected off lower grating 703, after passing through intermediate layer 702 and upper grating 701.

$$E\left(k = \frac{2\pi}{P}\right) \approx$$
$$Fe^{i\theta_{m_2^F}} e^{i\frac{2\pi}{P}\varepsilon_2} + F_2^t e^{i\theta_{F_2^t}} T_1 e^{i\theta_{m_1^t}} F_1 e^{i\theta_{m_1^F}} e^{i\frac{2\pi}{P}\varepsilon_1} R_1 e^{i\theta_{m_1^r}} F_2^r e^{i\theta_{F_2^r}}$$

Equation 21

In model 725, the differential signal $D_{ori}$ (intensity difference between respective plus and minus first diffraction orders) and the overlay (OVL) sensitivity A (see Equations 19, 20) are expressed in Equations 22.

$$D_{ori} = 4FF_2^t T_1 F_1 R_1 F_2^r$$
$$\sin\left(\theta_{F_2^t} + \theta_{m_1^t} + \theta_{m_1^F} + \theta_{m_1^r} + \theta_{F_2^r} - \theta_{m_2^F}\right) \sin\left(\frac{2\pi}{P}(\varepsilon_2 - \varepsilon_1)\right)$$
$$A = 4FF_2^t T_1 F_1 R_1 F_2^r \sin\left(\theta_{F_2^t} + \theta_{m_1^t} + \theta_{m_1^F} + \theta_{m_1^r} + \theta_{F_2^r} - \theta_{m_2^F}\right)$$

Equations 22

The sensitivity variation in a target (denoted n) with respect to some reference calibration target (denoted I), e.g., a reference target printed on the scribe lines and/or adjacent to actual design area, is expressed in Equation 23:

$$\frac{A(n)}{A(1)} = \frac{4F(n)F_2^t(n)T_1(n)F_1(n)R_1(n)F_2^r(n)\sin(\theta_{F_2^t}(n) + \theta_{m_1^t}(n) + \theta_{m_1^F}(n) + \theta_{m_1^r}(n) + \theta_{F_2^r}(n) - \theta_{m_2^F}(n))}{4F(1)F_2^t(1)T_1(1)F_1(1)R_1(1)F_2^r(1)\sin(\theta_{F_2^t}(1) + \theta_{m_1^t}(1) + \theta_{m_1^F}(1) + \theta_{m_1^r}(1) + \theta_{F_2^r}(1) - \theta_{m_2^F}(1))}$$

Equation 23

When the OVL sensitivity is optimized, using proper selection of target design and measurement conditions, the sine is maximized (having value of 1 or −1), and hence its derivative is close to zero. It is therefore assumed that small process variations (that may occur when different targets are compared) have a small effect on the sine term value. In addition it is assumed that the grating shape has negligible variations. Both assumptions are expressed in Equations 24.

$$\begin{cases} \frac{\partial \sin(\theta_{F_2^t} + \theta_{m_1^t} + \theta_{m_1^F} + \theta_{m_1^r} + \theta_{F_2^r} - \theta_{m_2^F})}{\partial n} \approx 0 \\ \frac{\partial F}{\partial n} \approx 0 \\ \frac{\partial F_2^t}{\partial n} \approx 0 \\ \frac{\partial F_1}{\partial n} \approx 0 \\ \frac{\partial F_2^r}{\partial n} \approx 0 \end{cases}$$

Equations 24

These assumptions enable the simplification of the sensitivity variability Equation 23 into the approximated expression of Equation 25.

$$\frac{A(n)}{A(1)} \approx \frac{T_1(n)R_1(n)}{T_1(1)R_1(1)}$$

Equation 25

In model 726, the electric field E and the resulting measured intensity $I_P$ are expressed in Equations 26 as component 77 reflected off lower grating 703, after passing through intermediate layer 702 and upper layer 701, the latter including the upper grating along the non-critical (non-measured) direction, and hence lacking periodicity. Notations are as in Equation 21.

$$E_P\left(\frac{2\pi}{P}\right) \approx F_2^t e^{i\theta_{F_2^t}} T_1 e^{i\theta_{m_1^t}} F_1 e^{i\theta_{m_1^F}} e^{i\frac{2\pi}{P}\varepsilon_1} R_1 e^{i\theta_{m_1^r}} F_2^r e^{i\theta_{F_2^r}}$$

$$I_P\left(\frac{2\pi}{P}\right) \approx |F_{2v}^t T_1 F_{1v} R_1 F_{2v}^r|^2$$

Equations 26

Using a reference calibration target as described above (Equation 23), the relative intensity measured in model 726 may be expressed as in Equation 27.

$$\frac{I_p(n)}{I_p(1)} = \left(\frac{F_{2v}^t(n)T_1(n)F_{1v}(n)R_1(n)F_{2v}^r(n)}{F_{2v}^t(1)T_1(1)F_{1v}(1)R_1(1)F_{2v}^r(1)}\right)^2$$

Equation 27

Equations 28 present the assumption of minor variation in the grating shape, and the resulting approximated expression for the relative measured intensity.

$$\begin{cases} \frac{\partial F_{2v}^t}{\partial n} \approx 0 \\ \frac{\partial F_{1v}}{\partial n} \approx 0 \\ \frac{\partial F_{2v}^r}{\partial n} \approx 0 \end{cases}$$

$$\frac{I_p(n)}{I_p(1)} \approx \left(\frac{T_1(n)R_1(n)}{T_1(1)R_1(1)}\right)^2$$

Equations 28

Combining the approximations expressed in Equations 25 and 28, and adding in the angular information k across the pupil, Equation 29 uses Equations 28 to express the overlay sensitivity in the critical direction in terms of measurements along the non-critical direction and of measurements of the reference targets (p is constant).

$$\frac{A(n, k)}{A(1, k)} = P\sqrt{\frac{I_p(n, k)}{I_p(1, k)}}$$

Equation 29

The overlay (OVL) per pixel can thus be calculated based on a single cell and the calibrated sensitivity, as expressed in Equation 30.

$$OVL(n, k) = \frac{D(n, k)}{A(1, k)P\sqrt{\frac{I_p(n, k)}{I_p(1, k)}}} \qquad \text{Equation 30}$$

As stated above, more complex models and calibration functions may be implemented using the same methodology and are considered part of the present disclosure. It is noted that the orthogonal diffraction order may also be used for calculation of geometrical properties of the target (for example: Critical Dimensions), with or without optical modeling.

The method expressed above in Equations 21-30 (see also method 800 below) may be implemented in various ways to derive metrology measurements (of which the overlay was presented as a non-limiting example) from various device and target designs. As a non-limiting example, FIG. 13 schematically illustrates one exemplary configuration for the application of the method.

Figure 13:
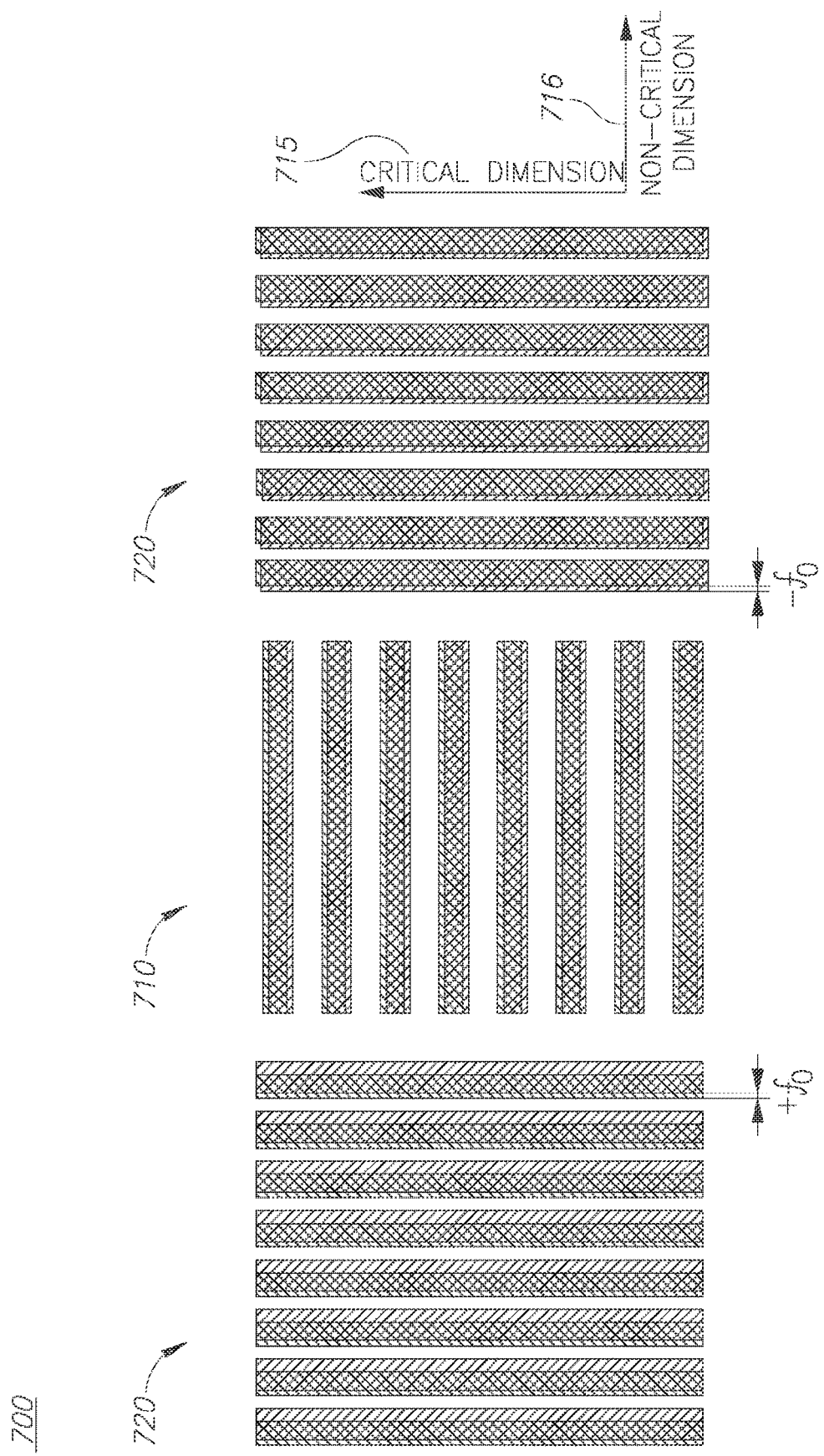
FIG. 13 is a high level schematic illustration of a target incorporating an offset-less device portion, according to some embodiments of the invention.

FIG. 13 is a high level schematic illustration of a target 700, incorporating an offset-less device portion, according to some embodiments of the invention. Target 700 may be designed to provide a sensitivity calculation without introduction of offsets along critical OVL dimension 715 (in cell 710), by using additional cell(s) 720 with pattern and offsets in different direction(s) 716 (e.g., perpendicular to the critical direction of cell 710). FIG. 13 illustrates, in a non-limiting manner, a three-cell design in two layers, yet may be extended to a multi-layered design as explained above in the present disclosure, as well to quasi-periodic targets and devices as explained above. Target 700 enables overlay calculation along critical direction 715 without the need to introduce intended offsets in this direction. It is explicitly noted that cell 710 may be understood as representing at least a portion of an actual device design, the disclosed method thus enabling measuring devices directly, without introducing offsets at least along the critical direction of the device, possibly without introducing any offsets into the device design.

Measurement of central cell 710 is used for the Y differential signal calculation (in Equation 32 below), while other (e.g., two) cells 720 have intended offsets $\pm f_0$ and are designed to best fit the relation in Equation 31. These equations express the sensitivity A of one target as being approximated by a function of a second nearby target. In Equation 31, n denotes the target\wafer position index, $A_v$ denotes the sensitivity of the second target (the one used to approximate sensitivity A, represented in FIG. 13 as cells 720) and $a_0$, $a_1$, $a_2$ are coefficients that may be derived using regression techniques, based on either simulations or measurements.

$$A(n) = a_0 + a_1 A_v(n) + a_2 A_v(n)^2 \qquad \text{Equation 31}$$

Second target 720 may have gratings along a different direction 716 from first cell 710 (with periodic structures along critical direction 715). Moreover, the gratings geometry may be different and offsets $\pm f_0$ may be introduced between the gratings. Metrology simulations may be used to optimize the behavior described in 0, possibly in combination with lithography and\or process simulations. The reported OVL in critical direction 715 becomes the one expressed in Equation 32.

$$OVL(n) = \frac{D(n)}{A(n)} = \frac{D(n)}{a_0 + a_1 A_v(n) + A_2 A_v(n)^2} \qquad \text{Equation 32}$$

This method allows using different patterns in order to measure devices without degrading its electrical properties (by introducing intended offsets). Note that this method allows using different measurement conditions (e.g., wavelength, polarization, etc.) for the calibration measurement. The disclosed method may be implemented in different ways and be improved by various sources of information. For example, Equations 31 and 32 may be replaced by Equations 33 and 34 which use pupil information, treating each pixel k independently and calculating the overlay as an (possible weighted) average of the pupil pixels. A weight function may be used, which takes into account different signal properties per pixel, such as the quality of the relation expressed in Equations 29 and 33. Signal properties may be estimated in simulations and/or be directly measured.

$$A(n, k) = a_0(k) + a_1(k)A_v(n, k) + a_2(k)A_v(n, k)^2 \qquad \text{Equation 33}$$

$$OVL(n) = \left\langle \frac{D(n, k)}{A(n, k)} \right\rangle_k = \left\langle \frac{D(n, k)}{a_0(k) + a_1(k)A_v(n, k) + a_2(k)A_v(n, k)^2} \right\rangle_k \qquad \text{Equation 34}$$

FIG. 14 presents a table with exemplary simulation results of the resulting sensitivity values for different combinations of first and second cells designs 710 and 720 respectively, according to some embodiments of the invention. The table presents the sensitivity as inaccuracy values (in nm, based on simulations), high sensitivities being above ca. 1 nm and low sensitivities below ca. 1 nm, and demonstrates the effectivity of the disclosed method. Method 800 (see below and Equations 21-30 above) was tested on fifteen different target designs and ninety process variations. For each cell, the OVL across process variations was calculated using Equation 34. The target design of the row was calibrated using the target of the column; the average absolute inaccuracy is reported in Table 1. The inaccuracy when Equation 20 is used is specified in the right column for reference as an indication of the achieved improvement. For example: The number in row 10, column 6 (or 300-200 vs. 100-400) is 0.6 nm. The number in row 10, rightmost column is 24.0 nm. This means that target 300-200 has inaccuracy level of 24.0 when constant sensitivity is assumed (Equation 20), but when its sensitivity is calibrated using target 100-400 (Equation 34) the inaccuracy is reduced down to 0.6 nm. It can be seen that the above methodology of Equation 34 is applicable and provides acceptable results. Pairs of target designs, which may be actually very different from each other, can be selected to successfully improve the sensitivity to acceptable levels. This result is surprising in view of the differences between the targets.

Certain embodiments may use Equation 32 with directly mixing different pupil locations (for example due to different pitches and wavelengths) while certain embodiments may use Equation 33, a more sophisticated correlation algorithm.

Certain embodiments comprise targets having a design that is optimized to improve the approximations (model assumptions) suggested by Equations 24 and/or 28.

The number of cells in SCOL targets may be reduced using the methods described above. For example, relative offsets of N features in the same layer may be measured using N+1 cells instead of 2N cells—the first feature sensitivity and OVL are calculated using two cells, and all other designs may have a single cell for which the calibration sensitivity function may be used with respect to the first design.

Metrology procedures may also be improved, as after calculating the calibration function (e.g., according to Equations 29 or 31) based on simulations and\or measurements, the run sequence may comprise on-the-fly measurements of single cells and use of the orthogonal direction signal to calibrate the sensitivity, using the calculated calibration function. It is noted that in case of unstable processes, several different calibration targets may be used.

Figure 15:
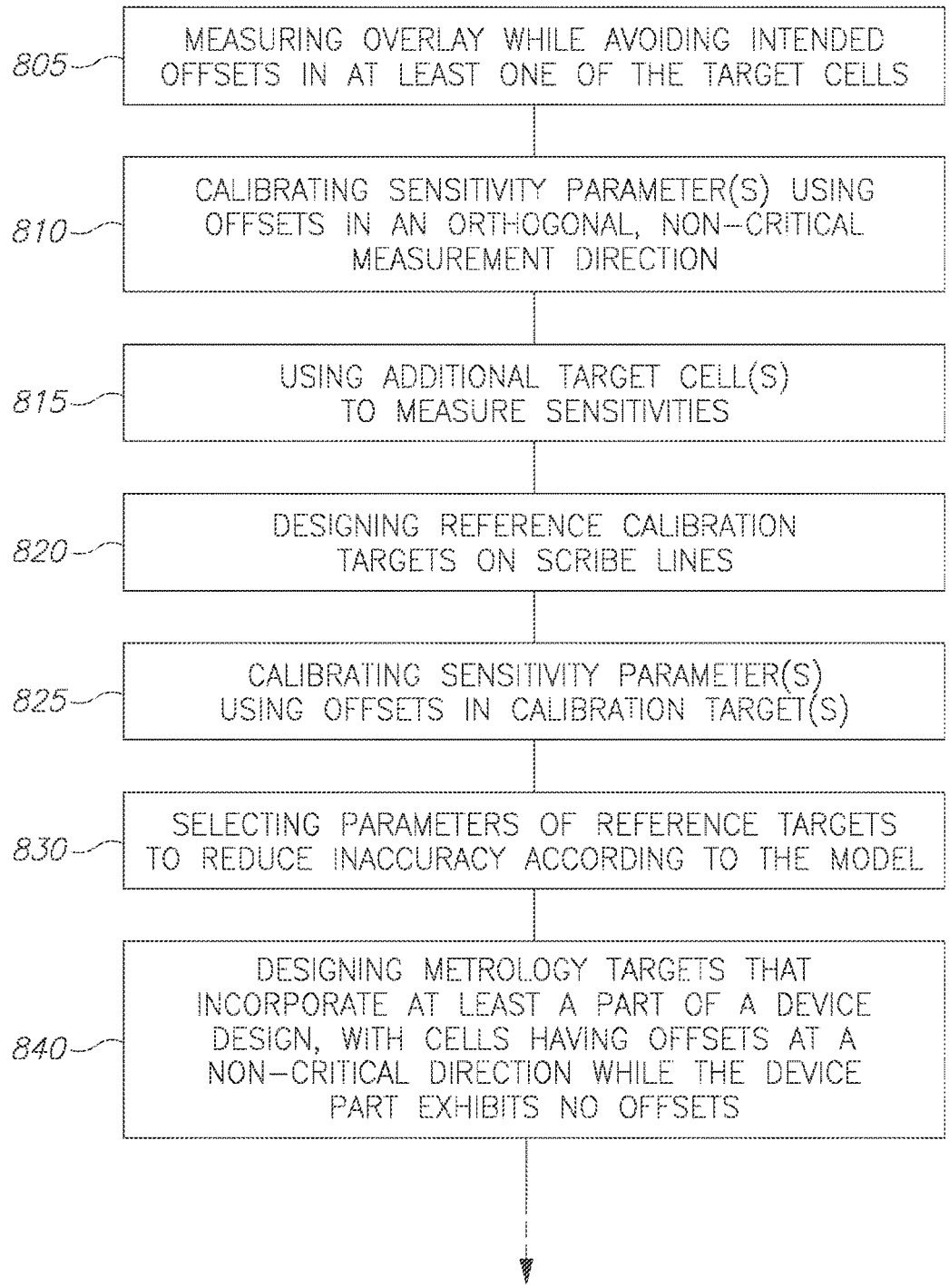
FIG. 15 is a high level flowchart illustrating a method of measuring overlays without introducing intended shift along the critical directions, according to some embodiments of the invention.

FIG. 15 is a high level flowchart illustrating a method 800 of measuring overlays without introducing intended shift along critical directions, according to some embodiments of the invention. Method 800 may be implemented using the algorithm, expressed in Equations 21-30 above. Method 800 may be at least partially implemented by at least one computer processor, e.g., in a metrology module. Certain embodiments comprise computer program products comprising a computer readable storage medium having computer readable program embodied therewith and configured to carry out of the relevant stages of method 800. Certain embodiments comprise target design files of respective targets designed by embodiments of method 800.

Method 800 comprises measuring overlay(s) while avoiding prior art introduction of intended offset(s) along a critical measurement direction in at least one of the target cells (stage 805). The measuring may be carried out in a model-free manner. Method 800 may comprise calibrating sensitivity parameter(s) using offsets in an orthogonal, non-critical measurement direction (stage 810), using the intensity of diffraction orders orthogonal to the critical measurement direction. Alternatively or complementarily, method 800 may comprise designing reference calibration targets on scribe lines (stage 820) and calibrating sensitivity parameter(s) using offsets in calibration target(s) (stage 825). Method 800 may comprise selecting parameters of reference targets to reduce inaccuracy according to the model (stage 830). Method 800 may comprise using at least one additional target cell other than the at least one target cell to measure sensitivities (stage 815), e.g., by introduced offsets (along either or both critical and non-critical directions). The at least one additional target cell may be adjacent to the target cell(s) and/or be configured as separate calibration targets.

Method 800 may comprise designing metrology targets that incorporate at least a part of a device design, with cells having offsets at a non-critical direction while the device part exhibits no offsets (stage 840). In certain embodiments, multiple parts of an actual device may be used and combined into a single metrology measurement, method 800 further comprising selecting multiple device design portions to yield a derived pupil plane image from respective pupil images of the portions, which satisfies a specified criterion (e.g., with respect to periodicity and/or the estimated noise) (stage 845). For example, a pupil image used in the OVL calculation may be an average of a few pupil images measured at different, possibly disparate device areas 50A. The selection of the combination may be pre-defined or carried out automatically in order to effectively select the signal that provides certain characteristics, e.g., being most similar to a signal derived from a periodic target, exhibiting the lowest level of noise etc. Method 800 may comprise optimizing target design according to the approximation assumptions (stage 850), e.g., by reducing variation in shape factors of the periodic structures (stage 855). Offsets may be introduced along the orthogonal, non-critical measurement direction of the device design and/or in adjacent, non-device additional cells and/or in calibration cells, e.g., on scribe lines.

The following aspects are provided by method 800 and the disclosure above. OVL sensitivity calibration may be carried out based on on-the-fly information from additional diffraction orders, which may include orthogonal diffraction orders. OVL sensitivity calibration may be carried out based on on-the-fly information from a second target with a different design and/or from additional targets with different designs and\or diffraction orders reflectivity. These enable using OVL targets with no offsets in the critical measurement direction (enabling direct device measurements with no degradation in electrical functionality) according to the disclosed measurement methodology. Examples for targets which were presented above include any of: a one-cell SCOL target for one direction (x or y) in which the sensitivity is calculated based on orthogonal direction reflectivity; a three-cell SCOL target composed of two standard cells for the first direction and a third cell for the orthogonal direction; an SCOL target for N designs along a single direction containing N+1 cells (instead of 2N) cells—a first design has two cells and all others have a single cell per design; and an SCOL target for N designs along a critical direction containing N+2 cells (instead of 2N) cells—two cells in the orthogonal non-critical direction and all others single cell without offsets per design. It is important to note that all the cells must not be adjacent to each other, for example the target may be a combination of cells located within the device's active area and cells in its periphery.

The disclosure further provides OVL model-free measurements of targets with at least one of: No intended offsets; no defined unit cell; multiple (more than two) overlapping patterning (i.e., different lithography steps, possibly applied to the same physical layer); and measurement of device patterns using SCOL like algorithm (run time model-free approach). The methods enable optical measurements of device patterns after resist development as well as optical measurements of final and after etch device patterns. The disclosure further provides metrology-simulations-based target design optimization to match specific device patterns behavior as well as metrology simulations combined with lithography and\or process simulations for target design optimization to match specific device patterns behavior. Finally, model-free on-the-fly optical OVL measurements using a single cell and combined OVL and OCD (optical critical dimension) targets with model-free OVL algorithm are provided (possibly requiring measurements using multiple hardware configurations, as explained above.

Figure 16:
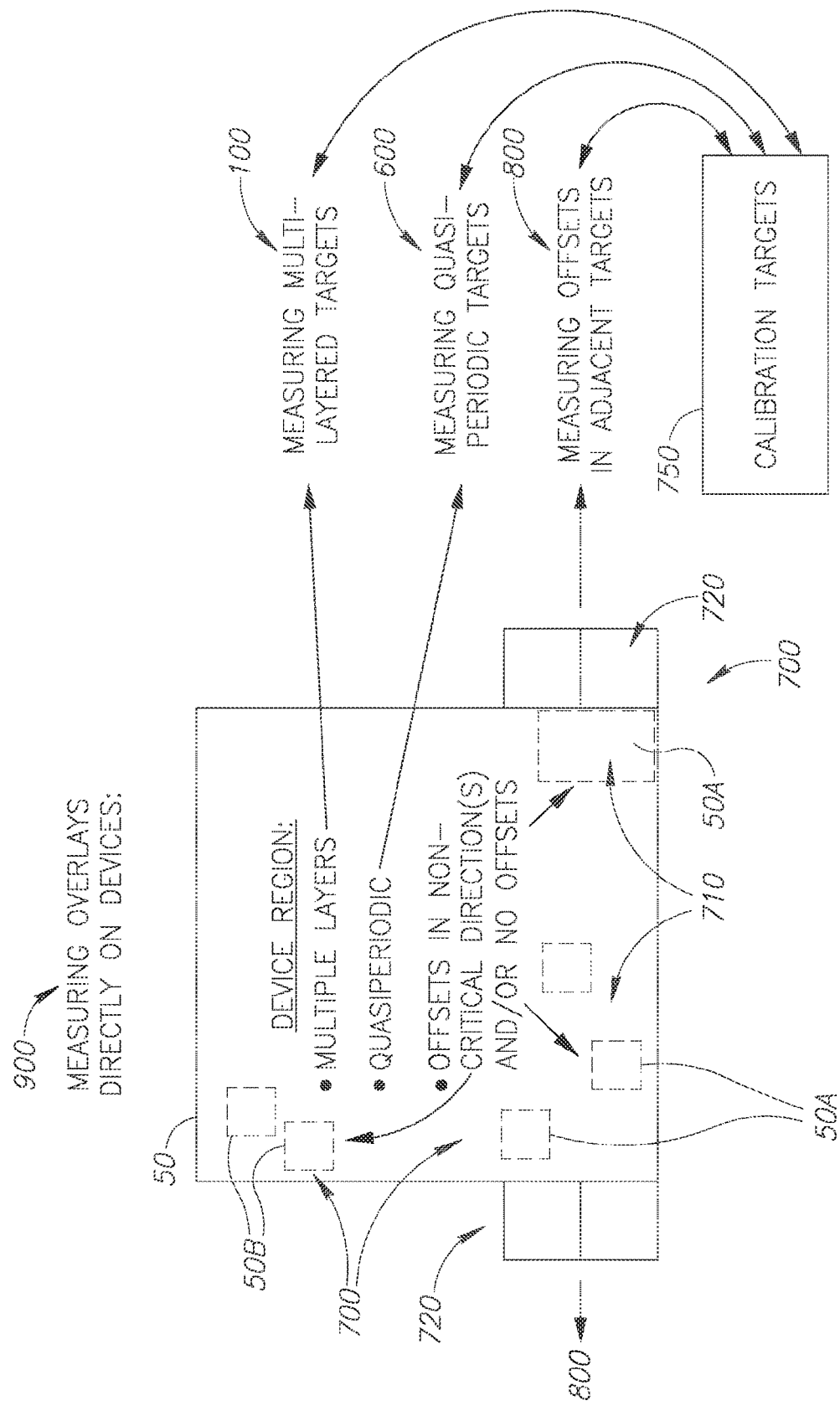
FIG. 16 is a high level schematic illustration of a composite device target, according to some embodiments of the invention.

FIG. 16 is a high level schematic illustration of a composite device target 700, according to some embodiments of the invention. FIG. 16 illustrates in a schematic manner, the combination of the concepts disclosed above to yield direct metrology measurements in a device area 50 (see below method 900). As illustrated in FIG. 16, a device region may be regarded as being multi-layered, quasi-periodic and as having no offsets and/or offsets in non-critical direction only. This understanding is surprising, as metrology target designs are usually very different from device designs. However, the inventors have found out, that from this perspective and/or by selecting specific device regions according to these criteria, actual device regions may be successfully treated and measured as metrology targets or parts thereof and provide useable metrology results, directly relating to device characteristics. By considering and/or selecting device regions as being multi-layered, quasi-periodic in the sense described above and as having no offsets and/or offsets only in non-critical direction only—the respective device regions may be used as target or target parts by applying methods 100, 600 and 800 respectively, as illustrated in FIG. 16.

For example, target 700 may comprise at least one region 50A of device 50 as part 710 of the measured target in which no offsets are introduced (at least along critical directions with respect to the device's functionality) and adjacent cells 720 which have intended offsets that may be used to derive device overlays according to pre-calculated sensitivity parameters and/or calibration function(s). FIG. 16 schematically illustrates an option of selecting one region 50A as target part 710 adjacent to cells 720, as well as an option of selecting multiple regions 50A as target part 710, possibly but not necessarily adjacent to cells 720. Regions 50A may be selected to yield a derived pupil plane image from respective pupil images of regions 50A, e.g., an average or a weighted average thereof, which satisfies a specified criterion such as a noise threshold, a periodicity threshold or any algorithmic threshold used to optimize the selection in view of the quality of the derived signals and related overlay derivations.

Alternatively or complementarily, target 700 may comprise at least one region 50B of device 50 as target 700 or as a part thereof, which has intended offsets introduced along non-critical direction(s) of the device design at specific region 50B. Such intended offsets may be selected to provide useful metrology information (e.g., sensitivity parameter A) without damaging the device performance (see explanation and derivation above, corresponding to FIGS. 10-12). Target 700 may further comprise adjacent cells 720 which have intended offsets that may be used to derive device overlays according to pre-calculated sensitivity parameters and/or calibration function(s).

Direct device measurements may further utilize calibration targets 750, set e.g., on scribe lines, which calibrate any of the effects of multi-layers, quasi-periodicity and sensitivity, as explained above. Moreover, methods 100, 600 and/or 800 may be implemented synergistically as a method 900 described below, to enable direct measurements of metrology parameters on devices which are multi-layered and non-periodic without introducing offsets along critical direction of the device designs.

FIG. 17 is a high level flowchart illustrating an integrative method 900 of measuring device overlays directly on the device, according to some embodiments of the invention. Method 900 may be at least partially implemented by at least one computer processor, e.g., in a metrology module. Certain embodiments comprise computer program products comprising a computer readable storage medium having computer readable program embodied therewith and configured to carry out of the relevant stages of method 900. Certain embodiments comprise target design files of respective targets designed by embodiments of method 900.

Method 900 may comprise using reference calibration targets and/or device-adjacent cells with intended offsets to enable direct measurement of device parts without introducing offsets into the device design (stage 910), e.g., implementing method 800. Method 900 may comprise calibrating sensitivity using at least one of: introducing offsets along non-critical direction, using adjacent target cells with introduced offsets, and using sensitivity calibration targets on scribe lines (stage 915), as explained above.

Method 900 may comprise extending the cell designs to multi-layered measurements (stage 920), e.g., implementing method 100 in any of its variations 100A-D. Method 900 may comprise configuring additional targets to provide layer-specific metrology parameters using multi-layered (N) target cells (having N>2 overlapping layers) comprising at least one of: N cell pairs, each pair with opposite offsets at a different layer; N cells with selected intended offsets; N−1 or fewer cells with selected intended offsets configured to utilize pupil information; and calibration targets alongside overlay targets with down to 2 cells (stage 925), as explained above.

Method 900 may comprise measuring quasi-periodic design patterns directly while managing and bounding resulting inaccuracies (stage 930), e.g., implementing method 600. Method 900 may comprise measuring metrology parameters from at least a portion of a device design that is selected to have a plurality of irregularly repeating units, having different sets of lines and cuts as exemplary specified features, along at least one direction of the portion (stage 935), as explained above.

Method 900 may comprise integrating the derivations for offset-less, multi-layer and quasi-periodic measurement algorithms (stage 940) to directly measuring metrology parameters on devices (stage 950).

Method 900 may further comprise selecting parameters of the adjacent target cells and/or the sensitivity calibration targets to reduce inaccuracy according to a model of the inaccuracy (stage 955), as illustrated above.

Corresponding metrology targets comprise at least a portion of a device design 710 that is selected to have a plurality of irregularly repeating units (e.g., as schematically exemplified in patterns 420A-E), having different sets of lines and cuts (e.g., as schematically exemplified in targets 400), along at least one direction of the portion, and a plurality of additional cells comprising multi-layer calibration cells (e.g., as schematically exemplified in targets 200 and 300) and sensitivity calibration cells (e.g., as schematically exemplified in targets 700 and 750). The multi-layer calibration cells may comprise any of (see FIG. 1A): N cell pairs, each pair with opposite offsets at a different layer; N cells with selected intended offsets; N cells with selected intended offsets (or possibly fewer cells depending on the measurement conditions and on algorithms used) configured to utilize pupil information; and N-cell calibration targets alongside overlay targets with N−1 cells and optionally down to 2 cells, depending on calibration conditions and algorithmic complexity. The sensitivity calibration cells may comprise at least two additional cells having intended offsets along the critical measurement direction of the at least one target cell, e.g., additional cells having an orthogonal critical measurement direction with respect to the at least one target cell. The at least two additional cells may be adjacent to the device portion as additional cells 720 are. Respective metrology measurements of the disclosed targets are also considered part of the present disclosure.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram portion or portions.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram portion or portions.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram portion or portions.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. An overlay metrology system comprising:
one or more processors coupled to an illumination source configured to direct illumination to a sample and a detector configured to capture diffracted orders of radiation from the sample in response to the illumination from the illumination source, the one or more processors configured to execute program instructions causing the one or more processors to:
generate overlay sensitivity calibration parameters based on differential measurements of diffracted orders from a calibration target including two overlay target cells on the sample, wherein first-layer target elements and second-layer target elements of the two overlay target cells are distributed with a common pitch along a measurement direction and are further misregistered with a selected offset value in opposite directions along the measurement direction;
determine overlay measurements based on measurements of diffracted orders on one or more additional overlay target cells with two selected wavelengths, wherein the first-layer target elements and second-layer target elements of the additional overlay target cells are distributed with the common pitch along the measurement direction and are further formed to overlap symmetrically along the measurement direction; and
adjust the overlay measurements with the overlay sensitivity calibration parameters based on the sensitivity of the calibration target.

2. The overlay metrology system of claim 1, wherein the overlay sensitivity calibration parameters represent a sensitivity of the additional overlay target cell as a function of the sensitivity of the calibration target.

3. The overlay metrology system of claim 2, wherein the sensitivity of the additional overlay target cell is characterized as $A(n)=a_0+a_1 A_v(n)+a_2 A_v(n)^2$, where $A(n)$ is the sensitivity of the additional overlay target cell, $A_v(n)$ is the sensitivity of the calibration overlay target, n represents a positional index of the additional overlay target cell, and $a_0$, $a_1$, and $a_2$ are coefficients derived using regression techniques.

4. The overlay metrology system of claim 2, wherein the sensitivity of the calibration target is generated for each pixel on the detector.

5. The overlay metrology system of claim 4, wherein the sensitivity of the additional overlay target cell is characterized as $A(n,k)=a_0(k)+a_1(k)A_v(n,k)+a_2(k)A_v(n,k)^2$, where $A(n)$ is the sensitivity of the additional overlay target cell, $A_v(n)$ is the sensitivity of the calibration overlay target, n represents a positional index of the additional overlay target cell, k represents a pixel index, and $a_0$, $a_1$, and $a_2$ are coefficients derived using regression techniques.

6. The overlay metrology system of claim 1, wherein the detector is located at a pupil plane.

7. The overlay metrology system of claim 1, wherein generating the overlay sensitivity calibration parameters based on differential measurements of diffracted orders from a calibration target including the two overlay target cells on the sample comprises:

generate overlay sensitivity calibration parameters based on differential measurements of diffracted orders received by the detector from a calibration target including two overlay target cells on the sample.

8. The overlay metrology system of claim 1, wherein generating the overlay sensitivity calibration parameters based on differential measurements of diffracted orders from a calibration target including two overlay target cells on the sample comprises:
generate overlay sensitivity calibration parameters based on differential measurements of diffracted orders received by a simulated detector from a calibration target including two overlay target cells on the sample.

9. The overlay metrology system of claim 1, wherein the differential measurements of diffracted orders received by the detector from the two overlay target cells on the sample comprise:
a +1 diffraction order and a −1 diffraction order.

10. The overlay metrology system of claim 1, wherein the differential measurements of diffracted orders received by the detector from the two overlay target cells on the sample comprise:
a $0^{th}$ diffraction order and one of a +1 diffraction order or a −1 diffraction order.

11. The overlay metrology system of claim 1, wherein the one or more processors are further configured to determine the overlay measurements based on measurements of diffracted orders on one or more additional overlay target cells with at least one additional selected wavelength.

12. An overlay metrology system comprising:
an illumination source configured to direct illumination to a sample;
a detector configured to capture diffracted orders of radiation from the sample in response to the illumination from the illumination source; and
one or more processors configured to execute program instructions causing the one or more processors to:
generate overlay sensitivity calibration parameters based on differential measurements of diffracted orders received by the detector from two overlay target cells on the sample, wherein first-layer target elements and second-layer target elements of the two overlay target cells are distributed with a common pitch along a measurement direction and are further misregistered with a selected offset value in opposite directions along the measurement direction;
determine an overlay measurement based on measurements of diffracted orders on an additional overlay target cell with two selected wavelengths, wherein the first-layer target elements and second-layer target elements of the additional overlay target cell are distributed with the common pitch along the measurement direction and are further formed to overlap symmetrically along the measurement direction; and
adjust the overlay measurement with the overlay sensitivity calibration parameters based on the sensitivity of a calibration target.

13. The overlay metrology system of claim 12, wherein the overlay sensitivity calibration parameters represent a sensitivity of the additional overlay target cell as a function of the sensitivity of the calibration target.

14. The overlay metrology system of claim 13, wherein the sensitivity of the additional overlay target cell is characterized as $A(n)=a_0+a_1 A_v(n)+a_2 A_v(n)^2$, where $A(n)$ is the sensitivity of the additional overlay target cell, $A_v(n)$ is the sensitivity of the calibration overlay target, n represents a positional index of the additional overlay target cell, and $a_0$, $a_1$, and $a_2$ are coefficients derived using regression techniques.

15. The overlay metrology system of claim 13, wherein the sensitivity of the calibration target is generated for each pixel on the detector.

16. The overlay metrology system of claim 15, wherein the sensitivity of the additional overlay target cell is characterized as $A(n,k)=a_0(k)+a_1(k)A_v(n,k)+a_2(k)A_v(n,k)^2$, where $A(n)$ is the sensitivity of the additional overlay target cell, $A_v(n)$ is the sensitivity of the calibration overlay target, n represents a positional index of the additional overlay target cell, k represents a pixel index, and $a_0$, $a_1$, and $a_2$ are coefficients derived using regression techniques.

17. The overlay metrology system of claim 12, wherein the detector is located at a pupil plane.

18. The overlay metrology system of claim 12, wherein generating the overlay sensitivity calibration parameters based on differential measurements of diffracted orders from a calibration target including two overlay target cells on the sample comprises:
generate overlay sensitivity calibration parameters based on differential measurements of diffracted orders received by the detector from a calibration target including two overlay target cells on the sample.

19. The overlay metrology system of claim 12, wherein generating the overlay sensitivity calibration parameters based on differential measurements of diffracted orders from a calibration target including two overlay target cells on the sample comprises:
generate overlay sensitivity calibration parameters based on differential measurements of diffracted orders received by a simulated detector from a calibration target including two overlay target cells on the sample.

20. The overlay metrology system of claim 12, wherein the differential measurements of diffracted orders received by the detector from the two overlay target cells on the sample comprise:
a +1 diffraction order and a −1 diffraction order.

21. The overlay metrology system of claim 12, wherein the differential measurements of diffracted orders received by the detector from the two overlay target cells on the sample comprise:
a $0^{th}$ diffraction order and one of a +1 diffraction order or a −1 diffraction order.

22. The overlay metrology system of claim 12, wherein the one or more processors are further configured to determine the overlay measurements based on measurements of diffracted orders on one or more additional overlay target cells with at least one additional selected wavelength.

23. An overlay metrology method comprising:
generating overlay sensitivity calibration parameters based on differential measurements of diffracted orders from a calibration target including two overlay target cells on a sample, wherein first-layer target elements and second-layer target elements of the two overlay target cells are distributed with a common pitch along a measurement direction and are further misregistered with a selected offset value in opposite directions along the measurement direction;
determining overlay measurements based on measurements of diffracted orders on one or more additional overlay target cells with two selected wavelengths, wherein the first-layer target elements and the second-layer target elements of the additional overlay target cell are distributed with the common pitch along the measurement direction and are further formed to overlap symmetrically along the measurement direction; and adjusting the overlay measurements with the overlay sensitivity calibration parameters based on the sensitivity of the calibration target.

* * * * *